(12) United States Patent
Masuoka et al.

(10) Patent No.: US 8,097,907 B2
(45) Date of Patent: Jan. 17, 2012

(54) SOLID-STATE IMAGING DEVICE

(75) Inventors: Fujio Masuoka, Chuo-ku (JP); Hiroki Nakamura, Chuo-ku (JP)

(73) Assignee: Unisantis Electronics Singapore Pte Ltd., Peninsula Plaza (SG)

( * ) Notice: Subject to any disclaimer, the term of this patent is extended or adjusted under 35 U.S.C. 154(b) by 233 days.

(21) Appl. No.: 12/700,315

(22) Filed: Feb. 4, 2010

(65) Prior Publication Data

US 2010/0219457 A1 Sep. 2, 2010

Related U.S. Application Data

(63) Continuation of application No. PCT/JP2009/058629, filed on May 7, 2009.

(60) Provisional application No. 61/207,552, filed on Feb. 13, 2009.

(30) Foreign Application Priority Data

May 2, 2008 (WO) .................. PCT/JP2008/058412

(51) Int. Cl.
*H01L 31/14* (2006.01)
(52) U.S. Cl. ................... 257/292; 257/E31.032; 438/74
(58) Field of Classification Search .......... 257/290–292, 257/E31.032, E31.097; 438/74
See application file for complete search history.

(56) References Cited

FOREIGN PATENT DOCUMENTS

| JP | 01-175775 A | 7/1989 |
|----|-------------|--------|
| JP | 02-089368 A | 3/1990 |
| JP | 2000-244818 A | 9/2000 |
| JP | 2001-339057 A | 12/2001 |
| JP | 2002-246580 A | 8/2002 |

OTHER PUBLICATIONS

Written Opinion of the International Searching Authority for International Application No. PCT/JP2008/058412, dated Jun. 10, 2008, 4 pages.
Written Opinion of the International Searching Authority for International Application No. PCT/JP2009/058629, dated Jun. 2, 2009, 4 pages.
Takahashi, Hidekazu, "A 3.9μm Pixel Pitch VGA Format 10b Digital Image Sensor with 1.5-Transistor/Pixel," IEEE International Solid-State Circuits Conference, Feb. 16, 2004, 10 pages.

(Continued)

*Primary Examiner* — Zandra Smith
*Assistant Examiner* — Paul Patton
(74) *Attorney, Agent, or Firm* — Brinks Hofer Gilson & Lione

(57) ABSTRACT

It is an object to provide an image sensor having a sufficiently-large ratio of a surface area of a light-receiving section to an overall surface area of one pixel. This object is achieved by a solid-state imaging device comprising: a signal line formed on a substrate; an island-shaped semiconductor arranged on the signal line; and a pixel selection line connected to a top of the island-shaped semiconductor, wherein the island-shaped semiconductor includes: a first semiconductor layer formed as a bottom portion of the island-shaped semiconductor and connected to the signal line; a second semiconductor layer formed above and adjacent to the first semiconductor layer; a gate connected to the second semiconductor layer through a dielectric film; a charge storage section comprised of a third semiconductor layer connected to the second semiconductor layer and adapted, in response to receiving light, to undergo a change in amount of electric charges therein; and a fourth semiconductor layer formed above and adjacent to the second and third semiconductor layers, and wherein the pixel selection line is comprised of a transparent conductive film, and a part of the gate is disposed inside a depression formed in a sidewall of the second semiconductor layer.

13 Claims, 56 Drawing Sheets

OTHER PUBLICATIONS

Kasano, Masahiro, "A 2.0μm Pixel Pitch MOS Image Sensor with an Amorphous Si Film Color Filter," IEEE International Solid-State Circuits Conference, Feb. 8, 2005, 3 pages.

International Search Report for International Application No. PCT/JP2008/058412, dated Jun. 10, 2008, 2 pages.

International Search Report for International Application No. PCT/JP2009/058629, dated Jun. 2, 2009, 2 pages.

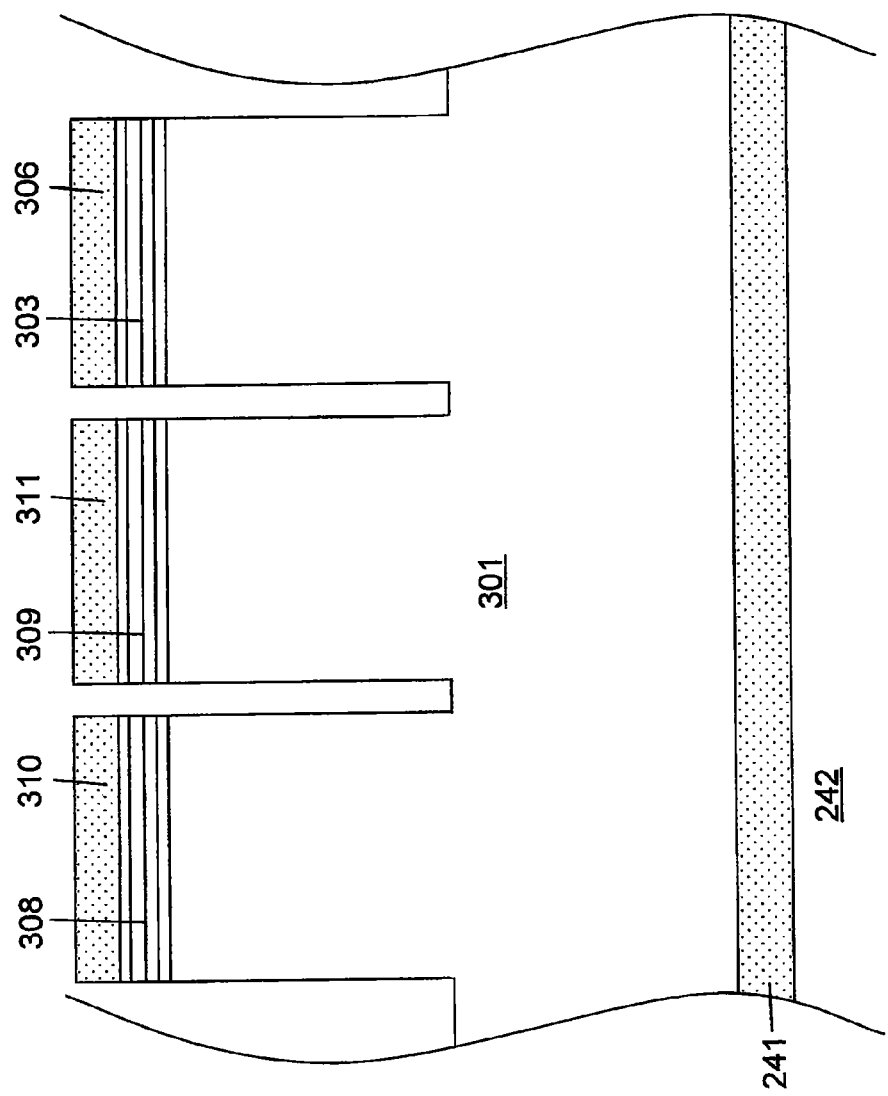

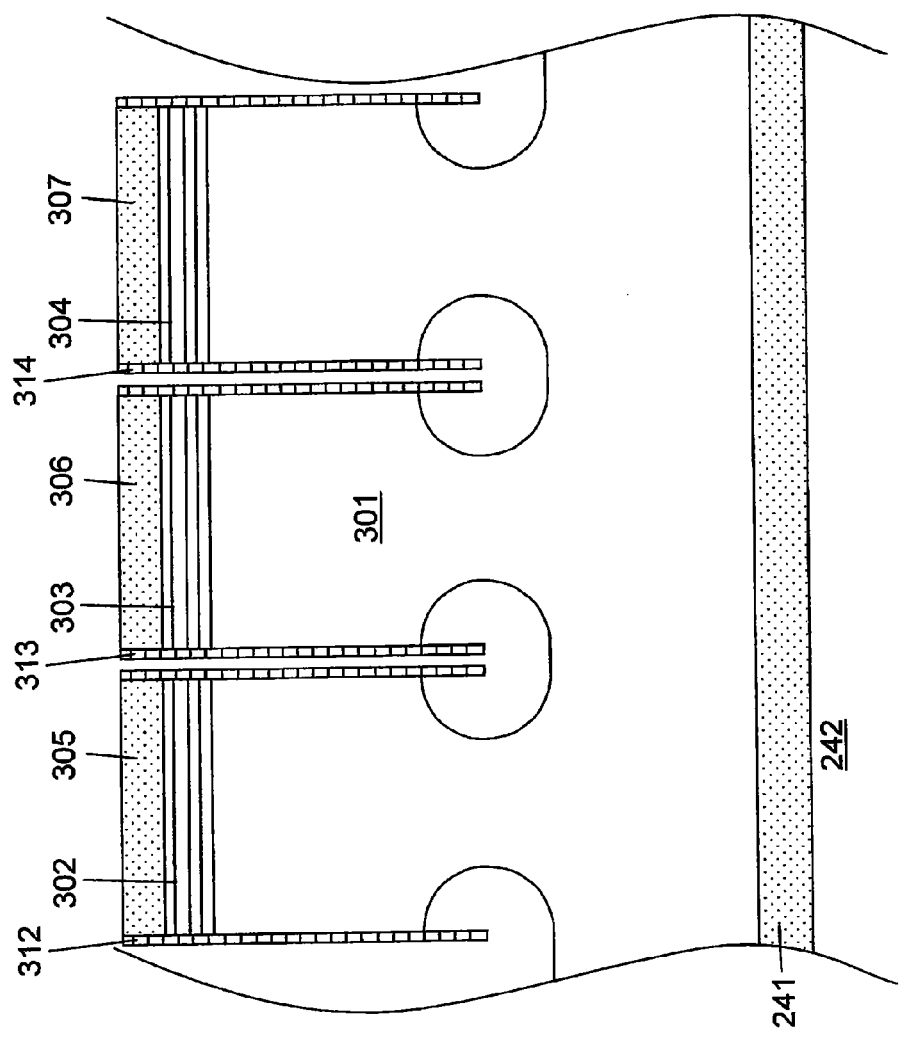

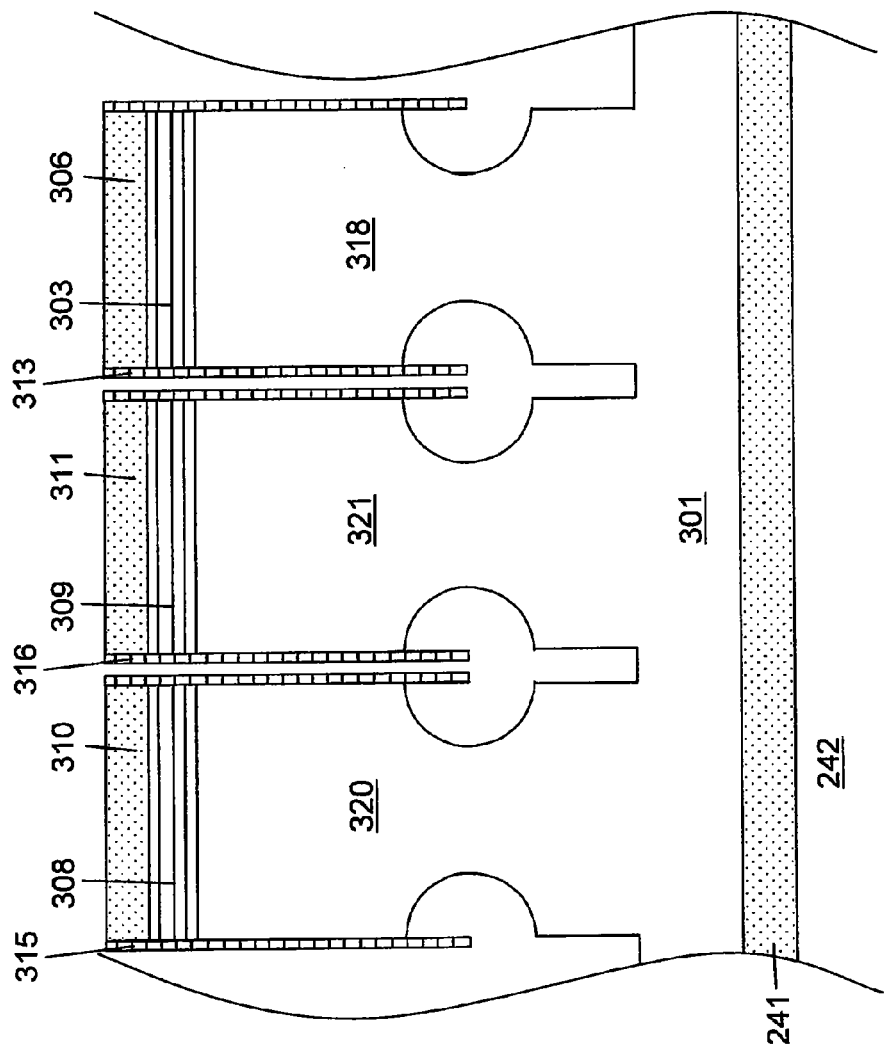

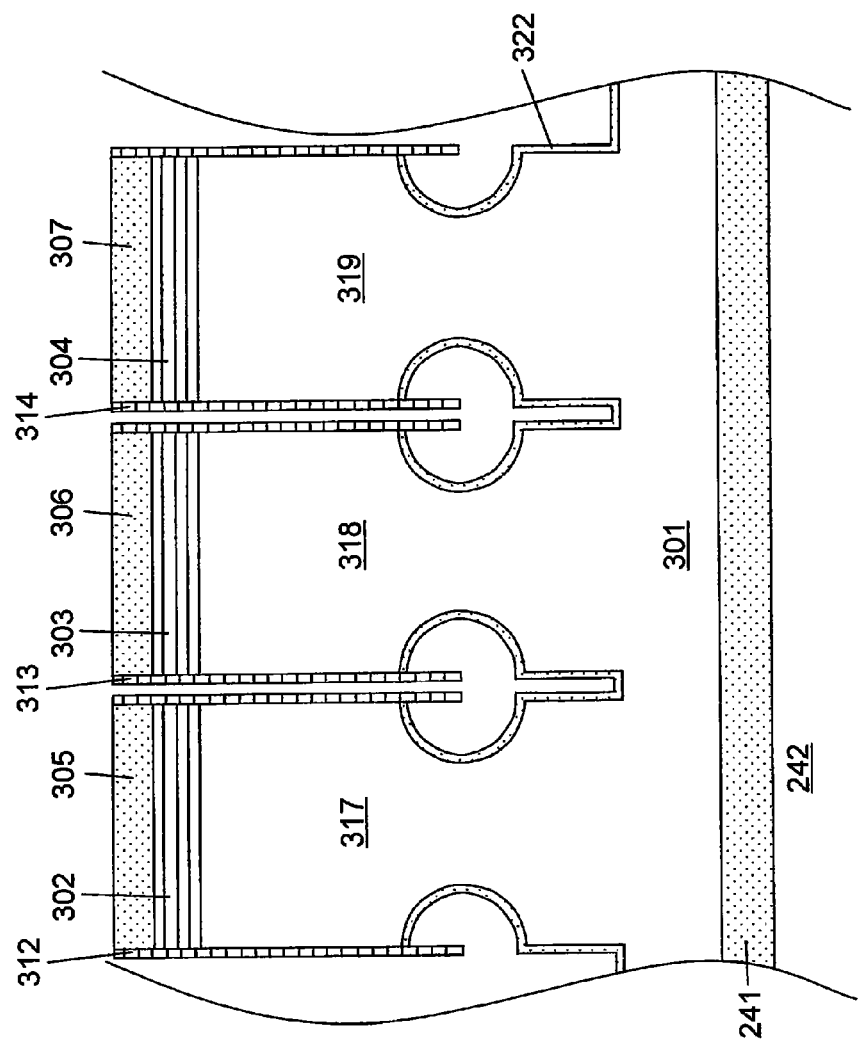

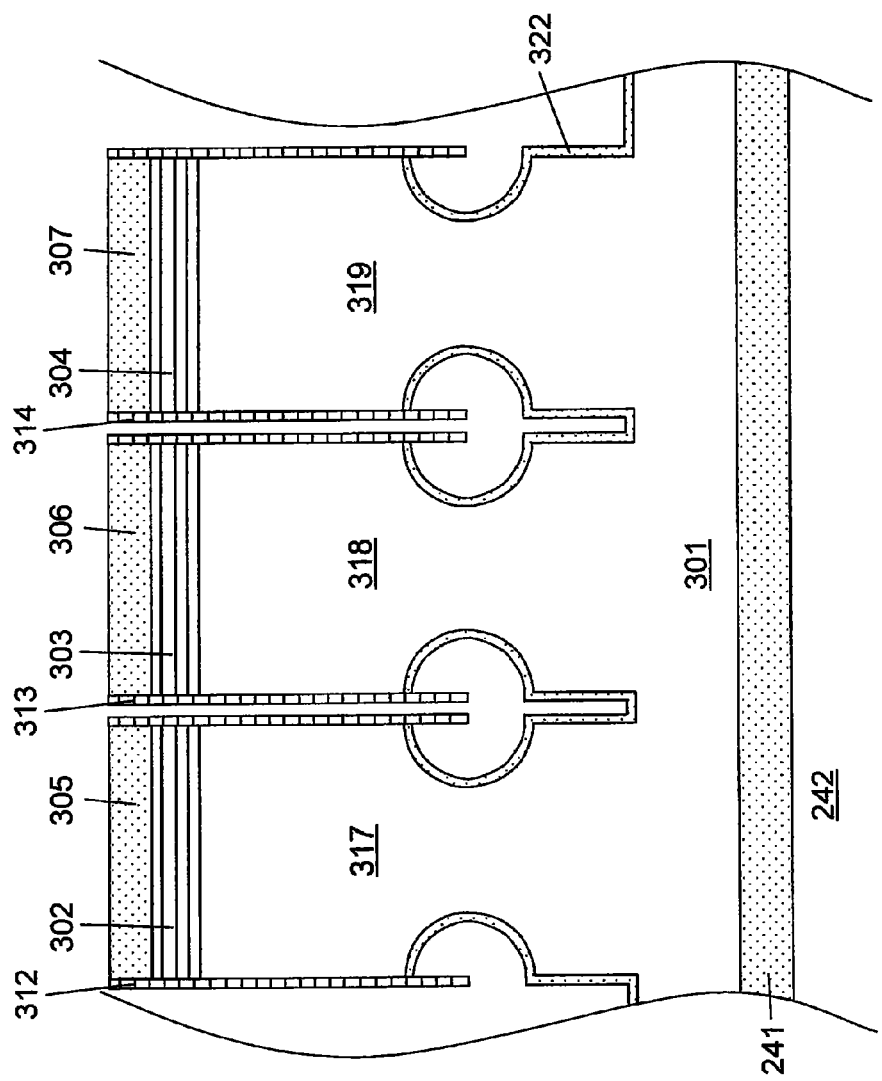

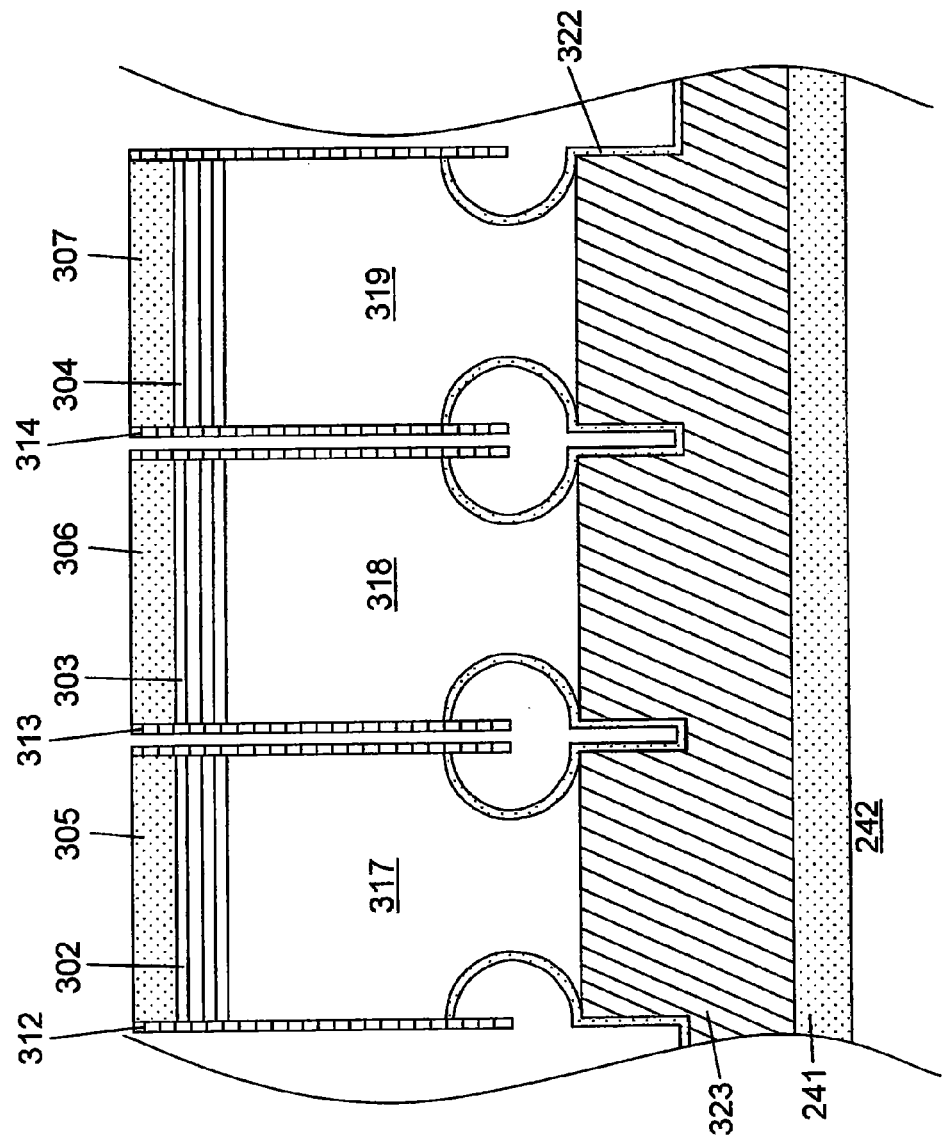

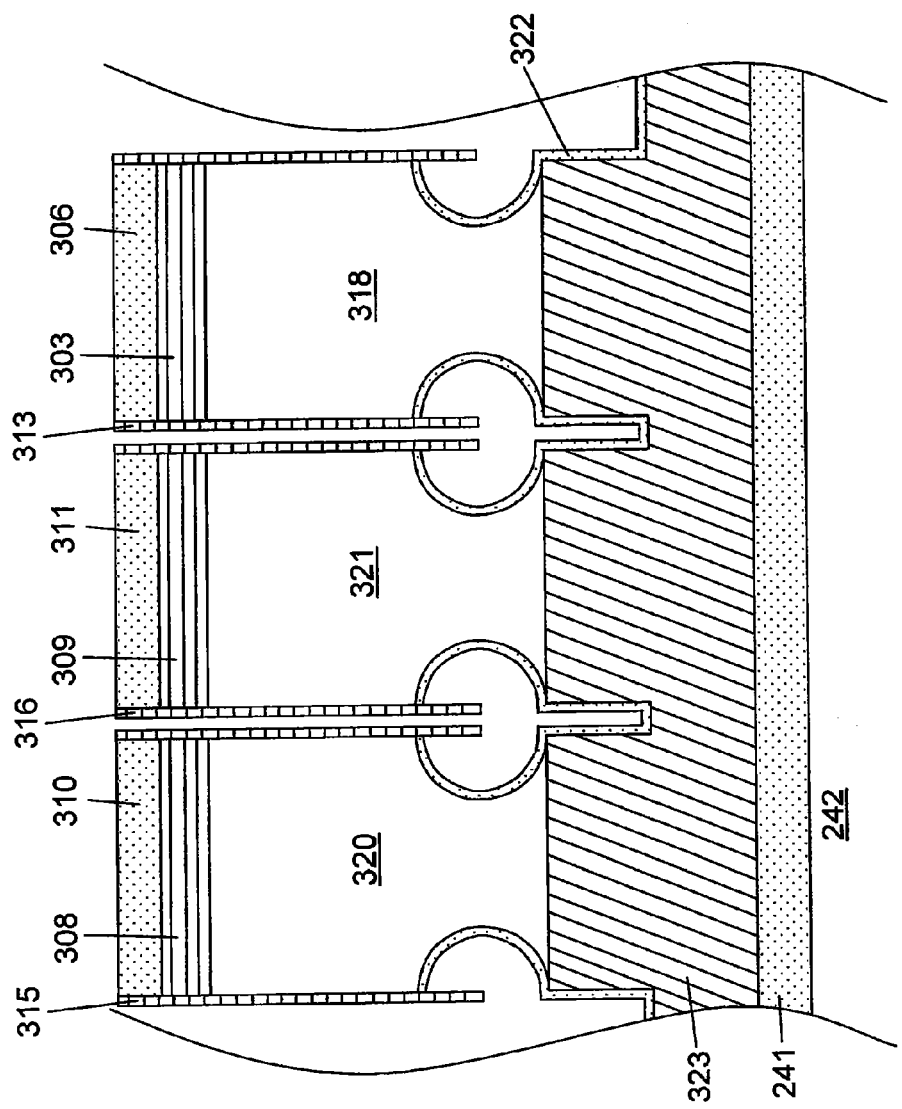

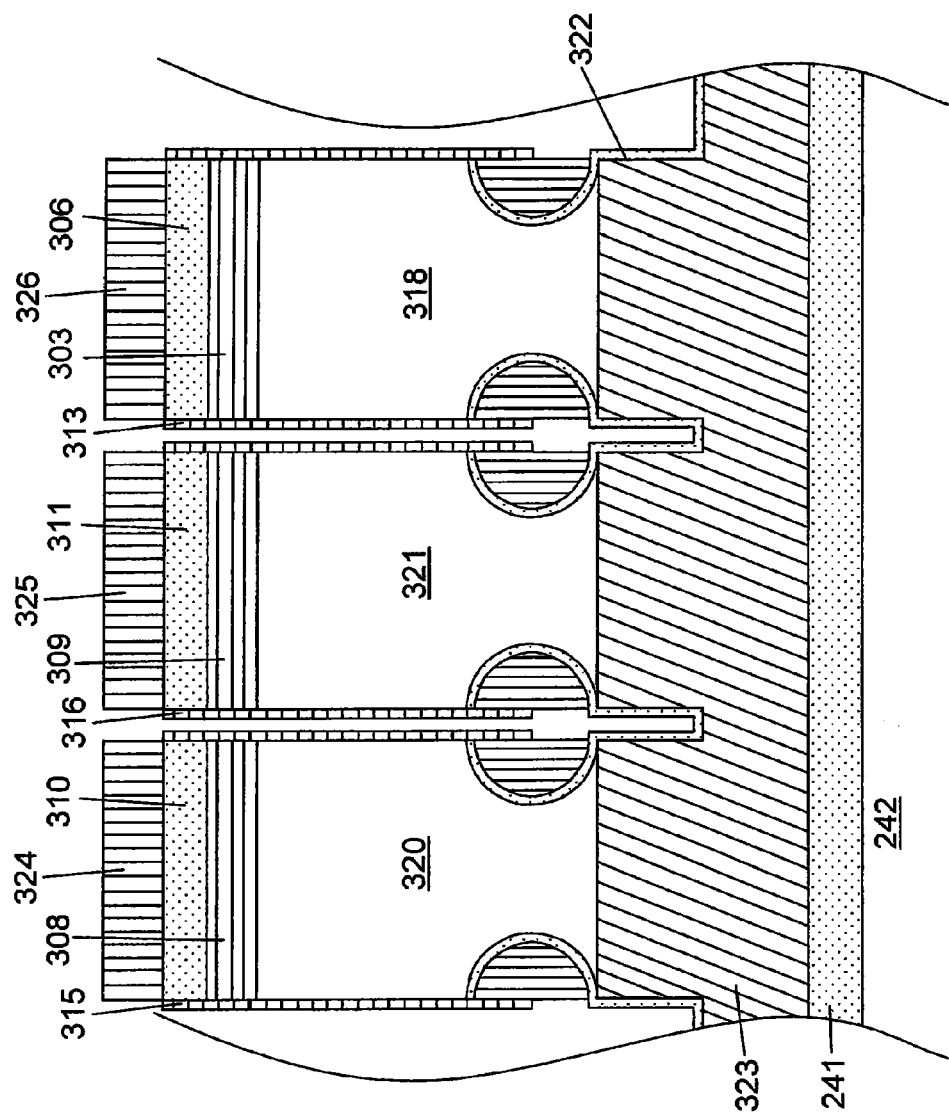

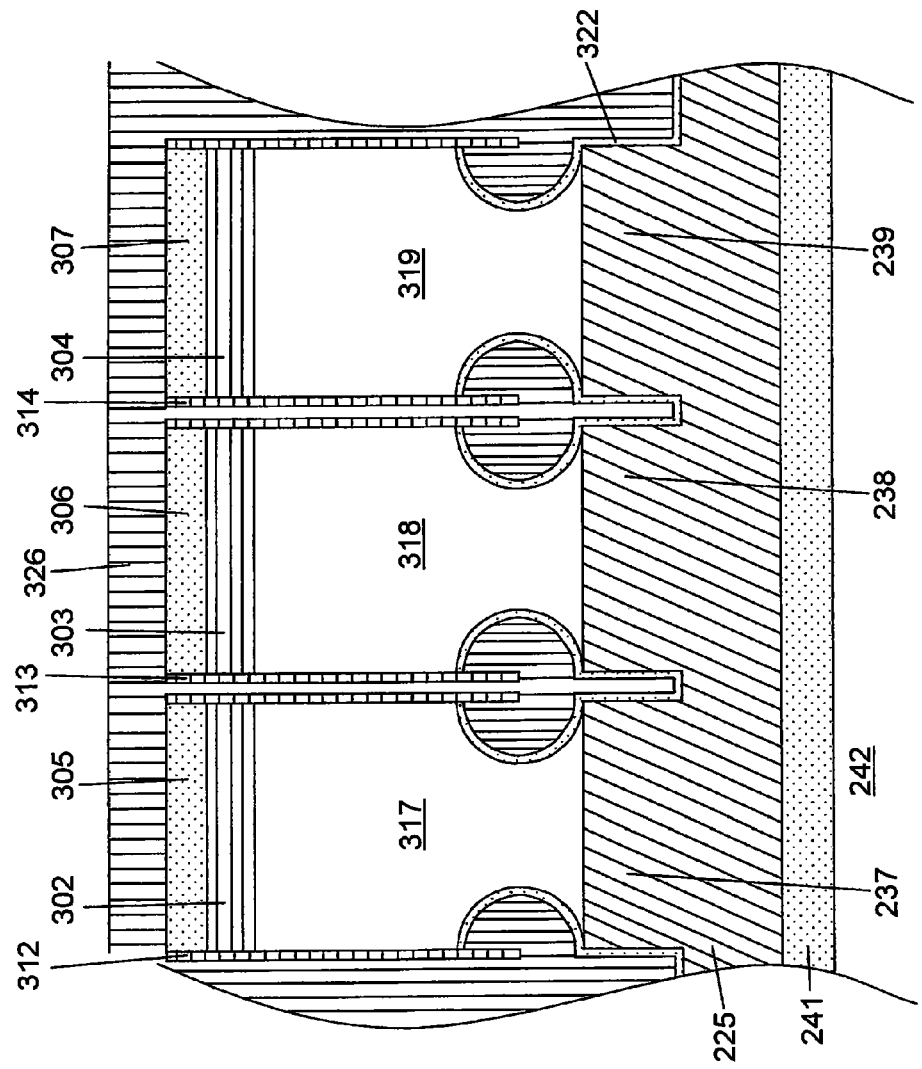

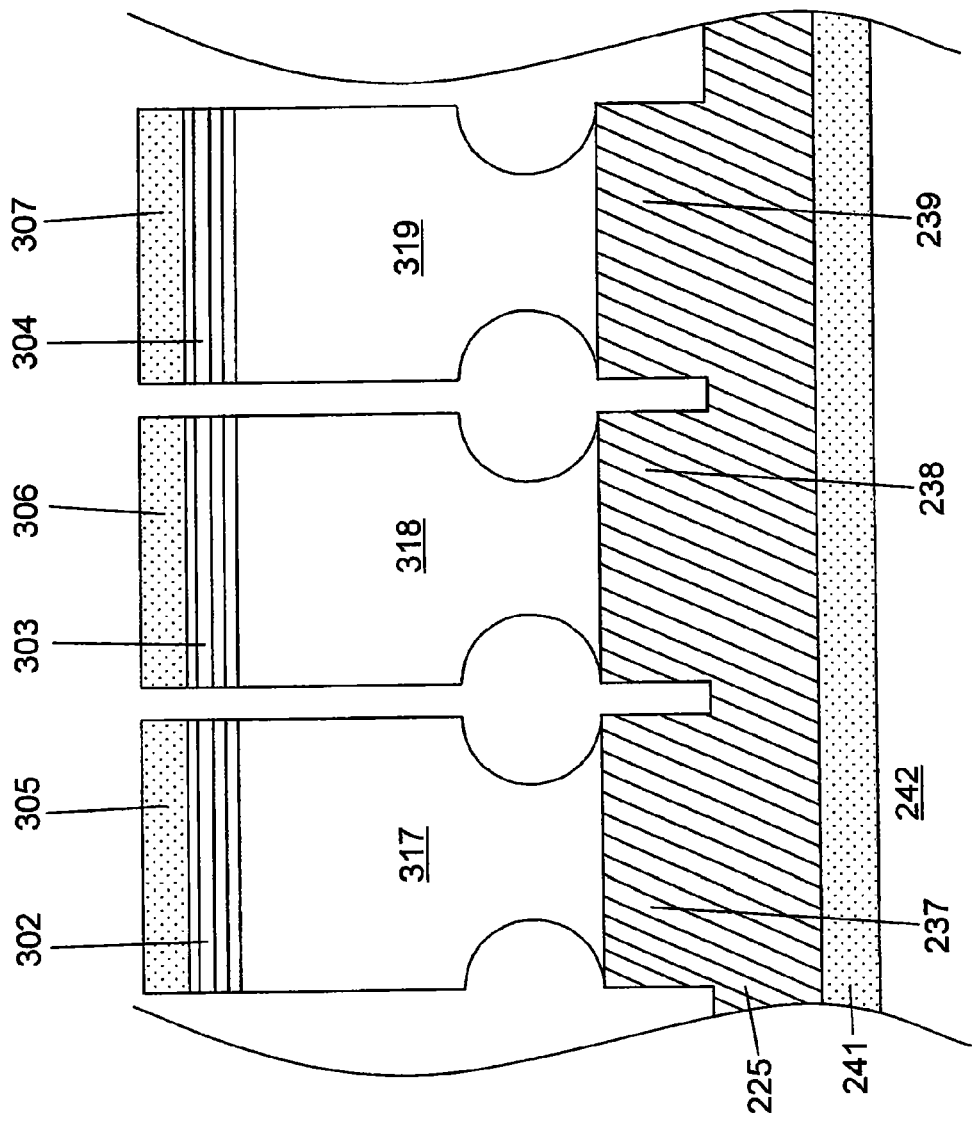

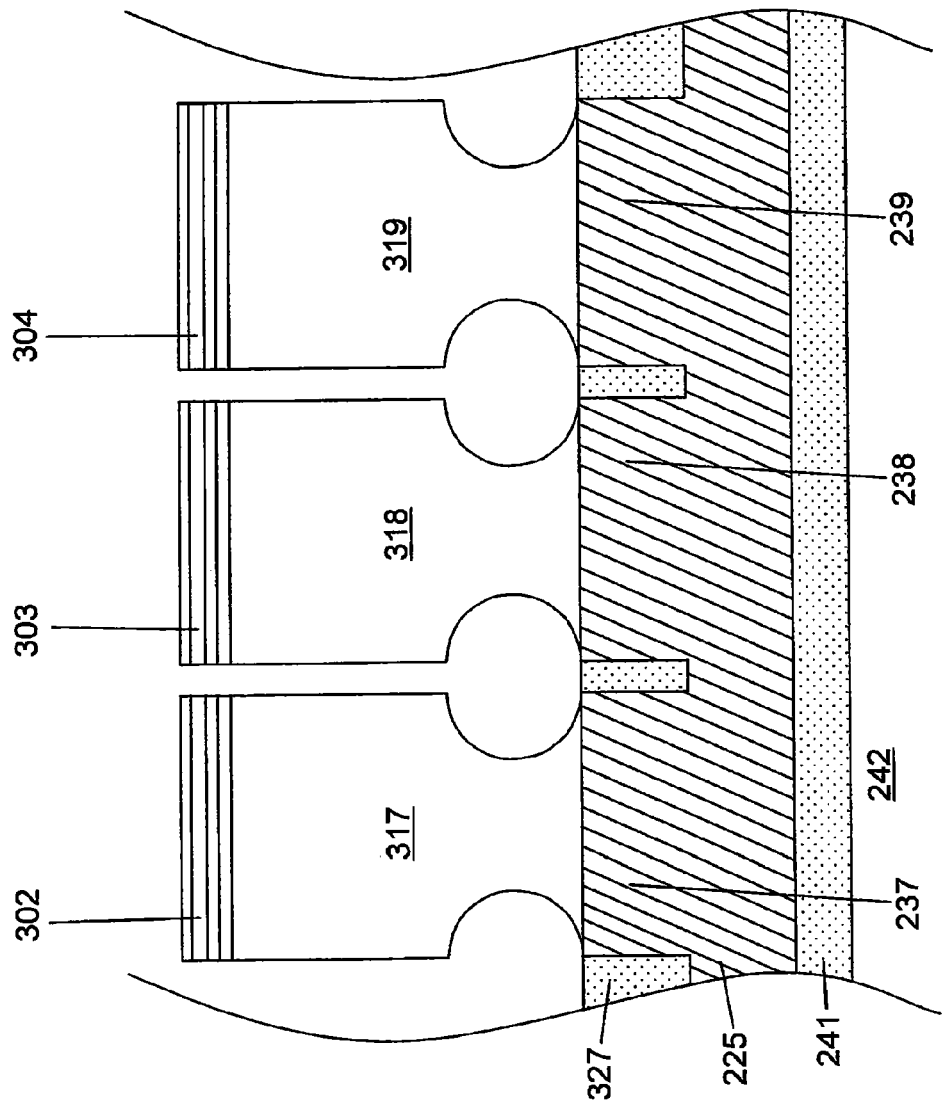

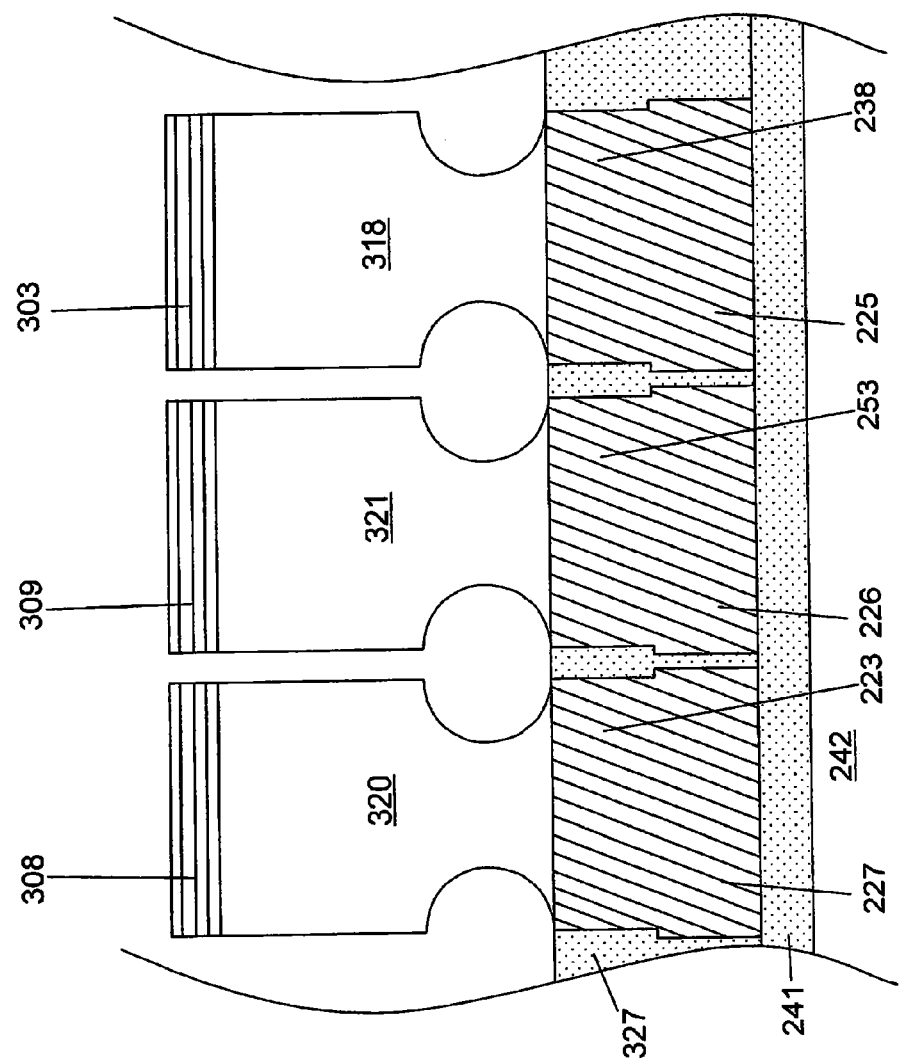

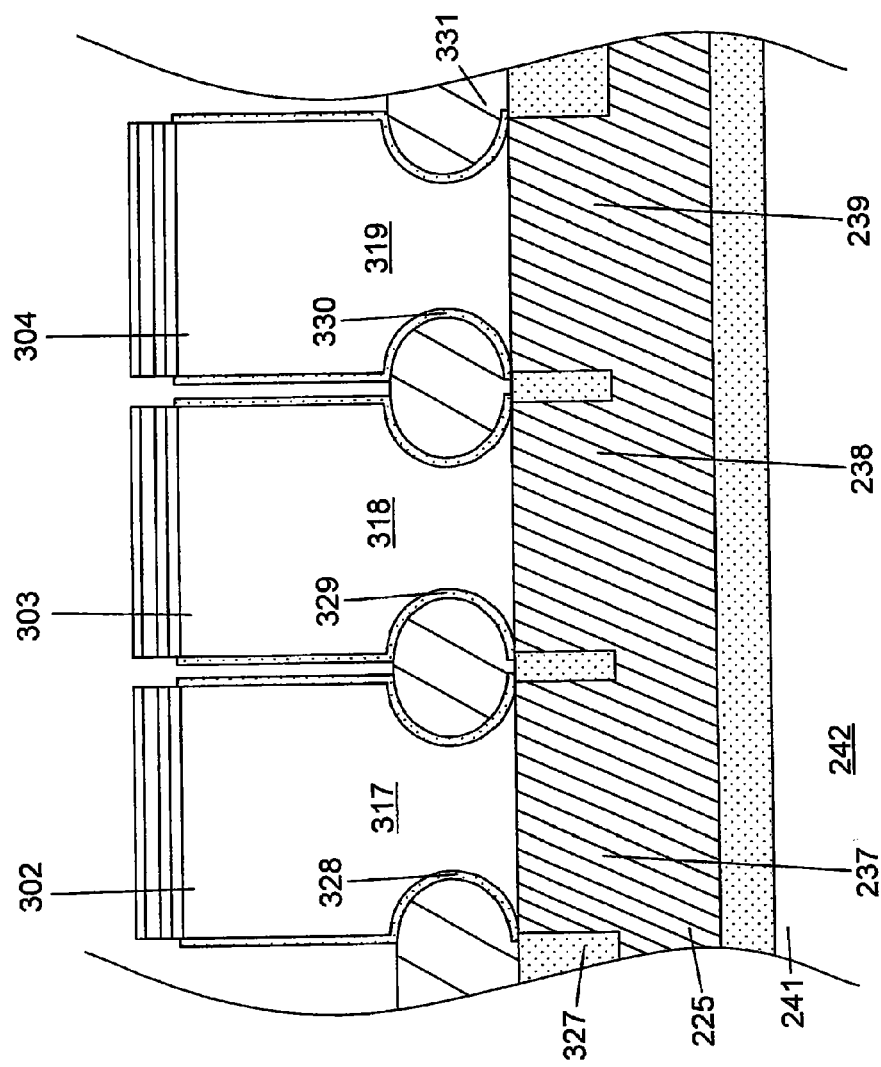

SOLID-STATE IMAGING DEVICE

RELATED APPLICATIONS

Pursuant to 35 U.S.C. §119(e), this application claims the benefit of the filing date of Provisional U.S. Patent Application Ser. No. 61/207,552 filed on Feb. 13, 2009. This application is a continuation application of PCT/JP2009/058629 filed on May 7, 2009 which claims priority under 35 U.S.C. §365(a) to PCT/JP2008/058412 filed on May 2, 2008. The entire contents of these applications are hereby incorporated by reference.

TECHNICAL FIELD

The present invention relates to a solid-state imaging device.

BACKGROUND ART

There has been proposed an amplification type solid-state imaging device configured to provide an amplification function to each of a plurality of pixels and perform a read operation using a scanning circuit, i.e., a CMOS image sensor. In the CMOS image sensor, a photoelectric conversion section, an amplification section, a pixel selection section and a reset section are formed in one pixel, wherein three MOS transistors are used for the sections other than the photoelectric conversion section composed of a photodiode (see, for example, the Patent Publication 1). In other words, the conventional CMOS image sensor consists of four elements. The CMOS image sensor is operable to store electric charges generated by the photoelectric conversion section composed of a photodiode, and, after amplifying the stored electric charges through the amplification section, read the amplified electric charges using the pixel selection section.

FIG. 1 shows a unit pixel of the conventional CMOS image sensor. In FIG. 1, the reference numeral 001 indicates a photoelectric-conversion photodiode. The reference numerals 006, 007 and 008 indicate an amplification transistor, a reset transistor and a selection transistor, respectively. The reference numerals 004, 002, 003, 005 and 009 indicate a signal line, a pixel-selection clock line, a reset clock line, a power supply line, and a reset power supply line, respectively. The unit pixel of the conventional CMOS image sensor has the photodiode and the three MOS transistors in a plane. Thus, it is difficult to increase a ratio of a surface area of a light-receiving section (photodiode) to an overall surface area of one pixel.

It is reported that, in a conventional CMOS image sensor using a 0.35 µm, single polysilicon layer/double metal layer CMOS process, a ratio of a surface area of a light-receiving section (photodiode) to an overall surface area of one pixel is 17% (see the following Non-Patent Document 1). It is also reported that, in a conventional CMOS image sensor using a 0.15 µm wiring-rule process, a ratio of a surface area of a light-receiving section (photodiode) to an overall surface area of one pixel is 30% (see the following Non-Patent Document 2). In the CMOS image sensor where the ratio of the surface area of the light-receiving section (photodiode) to the overall surface area of one pixel is 30%, a microlens is formed to condense light. This means that a CMOS image sensor having a small ratio of a surface area of a light-receiving section (photodiode) to an overall surface area of one pixel requires a light-condensing microlens.

Patent Document 1: JP 2000-244818A

Non-Patent Document 1: H. Takahashi, M. Kinoshita, K. Morita, T. Shirai, T. Sato, T. Kimura, H. Yuzurihara, S. Inoue, "A 3.9 µm Pixel Pitch VGA Format 10b Digital Image Sensor with 1.5-Transistor/Pixel", ISSCC Dig. Tech. Papers, pp. 108-109, 2004

Non-Patent Document 2: M. Kasano, Y. Inaba, M. Mori, S. Kasuga, T. Murata, T. Yamaguchi, "A 2.0 µm Pixel Pitch MOS Image Sensor with an Amorphous Si Film Color Filter", ISSCC Dig. Tech. Papers, pp. 348-349, 2005

It is therefore an object of the present invention to provide an image sensor having a sufficiently-large ratio of a surface area of a light-receiving section (photodiode) to an overall surface area of one pixel.

SUMMARY OF THE INVENTION

In order to achieve the above object, according to a first aspect of the present invention, there is provided a solid-state imaging device which comprises a signal line formed on a substrate, an island-shaped semiconductor arranged on the signal line, and a pixel selection line connected to a top of the island-shaped semiconductor. The island-shaped semiconductor includes: a first semiconductor layer formed as a bottom portion of the island-shaped semiconductor and connected to the signal line; a second semiconductor layer formed above and adjacent to the first semiconductor layer; a gate connected to the second semiconductor layer through a dielectric film; a charge storage section comprised of a third semiconductor layer connected to the second semiconductor layer and adapted, in response to receiving light, to undergo a change in amount of electric charges therein; and a fourth semiconductor layer formed above and adjacent to the second and third semiconductor layers. The pixel selection line is comprised of a transparent conductive film, and a part of the gate is disposed inside a depression formed in a sidewall of the second semiconductor layer.

Preferably, in the solid-state imaging device of the present invention, the signal line is an n+-type diffusion layer. The first semiconductor layer is an n+-type diffusion layer, and the second semiconductor layer is a p-type impurity-doped region. The third semiconductor layer is an n-type diffusion layer, and the fourth semiconductor layer is a p+-type diffusion layer.

Preferably, in the above solid-state imaging device, a combination of the p+-type diffusion layer and the n-type diffusion layer functions as a photoelectric-conversion photodiode, and a combination of the p+-type diffusion layer, the n-type diffusion layer and the p-type impurity-doped region functions as an amplification transistor. A combination of the n+-type diffusion layer serving as the first semiconductor layer, the p-type impurity-doped region, the n-type diffusion layer and the gate functions as a reset transistor, and a combination of the p-type impurity-doped region and the n+-type diffusion layer serving as the first semiconductor layer functions as a diode.

In the solid-state imaging device of the present invention, the island-shaped semiconductor may have a square or rectangular pillar shape.

Alternatively, the island-shaped semiconductor may have a hexagonal pillar shape.

Alternatively, the island-shaped semiconductor may have a circular pillar shape.

According to a second aspect of the present invention, there is provided a solid-state imaging apparatus which comprises a plurality of the solid-state imaging devices according to the first aspect of the present invention, wherein the solid-state imaging devices are arranged in an n-row by m-column array (wherein each of n and m is an integer of 1 or more) with respect to the substrate.

According to a third aspect of the present invention, there is provided a solid-state imaging apparatus which comprises a plurality of the solid-state imaging devices each including the island-shaped semiconductor having a square or rectangular pillar shape, wherein the solid-state imaging devices are arranged in an n-row by m-column array (wherein each of n and m is an integer of 1 or more) with respect to the substrate.

According to a fourth aspect of the present invention, there is provided a solid-state imaging apparatus which comprises a plurality of the solid-state imaging devices each including the island-shaped semiconductor having a circular pillar shape, wherein the solid-state imaging devices are arranged in an n-row by m-column array (wherein each of n and m is an integer of 1 or more) with respect to the substrate.

According to a fifth aspect of the present invention, there is provided a solid-state imaging apparatus which comprises a plurality of the solid-state imaging devices according to the first aspect of the present invention, wherein the solid-state imaging devices are arranged on the substrate in a honeycomb pattern.

According to a sixth aspect of the present invention, there is provided a solid-state imaging apparatus which comprises a plurality of the solid-state imaging devices each including the island-shaped semiconductor having a hexagonal pillar shape, wherein the solid-state imaging devices are arranged on the substrate in a honeycomb pattern.

According to a seventh aspect of the present invention, there is provided a solid-state imaging apparatus which comprises a plurality of the solid-state imaging devices each including the island-shaped semiconductor having a circular pillar shape, wherein the solid-state imaging devices are arranged on the substrate in a honeycomb pattern.

According to an eighth aspect of the present invention, there is provided a method of producing a solid-state imaging device. The method comprises the steps of: forming an oxide film on a silicon substrate; forming a p-type silicon on the oxide film; forming an oxide film-based mask and a nitride film-based mask by depositing a nitride film on the p-type silicon, depositing an oxide film on the nitride film, forming a resist for a silicon pillar, etching the oxide film and the nitride film, and removing the resist; forming a depression in a sidewall of a p-type impurity-doped region by etching the p-type silicon to form a silicon pillar, depositing a nitride film, etching the nitride film in such a manner that a sidewall-shaped nitride film is left on a sidewall of the silicon pillar, and isotropically etching the p-type silicon; forming an island-shaped semiconductor having the depression in the sidewall of the p-type impurity-doped region by etching the p-type silicon; forming an n+-type diffusion layer of the island-shaped semiconductor, and the signal line, by forming a thin oxide film to prevent ion channeling during ion implantation, forming a continuous n+-type diffusion layer through phosphorus implantation and annealing, forming a resist for the signal line, and etching the thin oxide film and the silicon (continuous n+-type diffusion layer); after removing the resist, the sidewall-shaped nitride film and the oxide film, forming a gate by depositing an oxide film, subjecting the oxide film to flattening and etching-back, forming a gate dielectric film, depositing polysilicon, subjecting the polysilicon to flattening and etching-back, forming a resist for the gate, and etching the polysilicon; after removing the resist, forming a charge storage section through phosphorus implantation; forming a p+-type diffusion layer by depositing an oxide film, subjecting the oxide film to flattening and etching-back, removing the nitride film-based mask, forming an oxide film, and performing boron implantation and annealing; after removing the oxide film, forming a pixel selection line by depositing a transparent conductive film, forming a resist for the pixel selection line, etching the transparent conductive film, and removing the resist; and forming a surface protection film.

A unit pixel of a conventional CMOS image sensor has a total four elements, i.e., a photodiode and three MOS transistors, in a plane. Thus, it is difficult to increase a ratio of a surface area of a light-receiving section (photodiode) to an overall surface area of one pixel. It is reported that, in a conventional CMOS image sensor using a 0.15 μm wiring-rule process, a ratio of a surface area of a light-receiving section (photodiode) to an overall surface area of one pixel is 30%.

The present invention provides a solid-state imaging device which comprises: a signal line formed on a substrate; an island-shaped semiconductor arranged on the signal line; and a pixel selection line connected to a top of the island-shaped semiconductor, wherein the island-shaped semiconductor includes: a first semiconductor layer formed as a bottom portion of the island-shaped semiconductor and connected to the signal line; a second semiconductor layer formed above and adjacent to the first semiconductor layer; a gate connected to the second semiconductor layer through a dielectric film; a charge storage section comprised of a third semiconductor layer connected to the second semiconductor layer and adapted, in response to receiving light, to undergo a change in amount of electric charges therein; and a fourth semiconductor layer formed above and adjacent to the second and third semiconductor layers, and wherein the pixel selection line is comprised of a transparent conductive film, and a part of the gate is disposed inside a depression formed in a sidewall of the second semiconductor layer.

In the above solid-state imaging device, a combination of the third and fourth semiconductor layers, a combination of the second, third and fourth semiconductor layers, a combination of the first, second and third semiconductor layers, and a combination of the second and first semiconductor layers, function, respectively, as the photoelectric-conversion photodiode, the amplification transistor, the reset transistor, and the diode in the aforementioned unit pixel. A metal for use in a conventional semiconductor production process, such as aluminum or copper, reflects light. Thus, it is necessary to connect a line made of such a metal to a sidewall of the fourth semiconductor layer. In the present invention, a transparent conductive film, such as indium tin oxide (ITO), zinc oxide (ZnO) or tin oxide ($SnO_2$), is used as the pixel selection line to allow the pixel selection line to be connected to a top of the fourth semiconductor layer. Thus, the use of the transparent conductive film makes it possible to provide an image sensor having a sufficiently-large ratio of a surface area of a light-receiving section to an overall surface area of one pixel.

Further, if a gate is connected to a sidewall of the second conductive layer through the dielectric layer, a surface area of one pixel is a sum of an area of the photodiode, an area of the gate, and an area of a region between the devices. In the present invention, a part of the gate is disposed inside a depression formed in a sidewall of the second semiconductor layer, so that a surface area of one pixel can be reduced substantially to a sum of an area of the photodiode and an area of a region between the devices. This makes it possible to provide an image sensor having a sufficiently-large ratio of a surface area of a light-receiving section to an overall surface area of one pixel.

BRIEF DESCRIPTION OF THE DRAWINGS

FIG. 13(b) is a sectional view ($Y_2$-$Y'_2$ section) showing the step in FIG. 13(a).

FIG. 15(a) is a sectional view ($X_2$-$X'_2$ section) showing a step in the example of the production method.

FIG. 16(b) is a sectional view ($Y_2$-$Y'_2$ section) showing the step in FIG. 16(a).

FIG. 17(a) is a sectional view ($X_2$-$X'_2$ section) showing a step in the example of the production method.

FIG. 17(b) is a sectional view ($Y_2$-$Y'_2$ section) showing the step in FIG. 17(a).

FIG. 18(a) is a sectional view ($X_2$-$X'_2$ section) showing a step in the example of the production method.

FIG. 18(b) is a sectional view ($Y_2$-$Y'_2$ section) showing the step in FIG. 18(a).

FIG. 19(b) is a sectional view ($Y_2$-$Y'_2$ section) showing the step in FIG. 19(a).

FIG. 20(a) is a sectional view ($X_2$-$X'_2$ section) showing a step in the example of the production method.

FIG. 21(a) is a sectional view ($X_2$-$X'_2$ section) showing a step in the example of the production method.

FIG. 22(a) is a sectional view ($X_2$-$X'_2$ section) showing a step in the example of the production method.

FIG. 22(b) is a sectional view ($Y_2$-$Y'_2$ section) showing the step in FIG. 22(a).

FIG. 23(a) is a sectional view ($X_2$-$X'_2$ section) showing a step in the example of the production method.

DETAILED DESCRIPTION OF THE PREFERRED EMBODIMENTS

Figure 1:
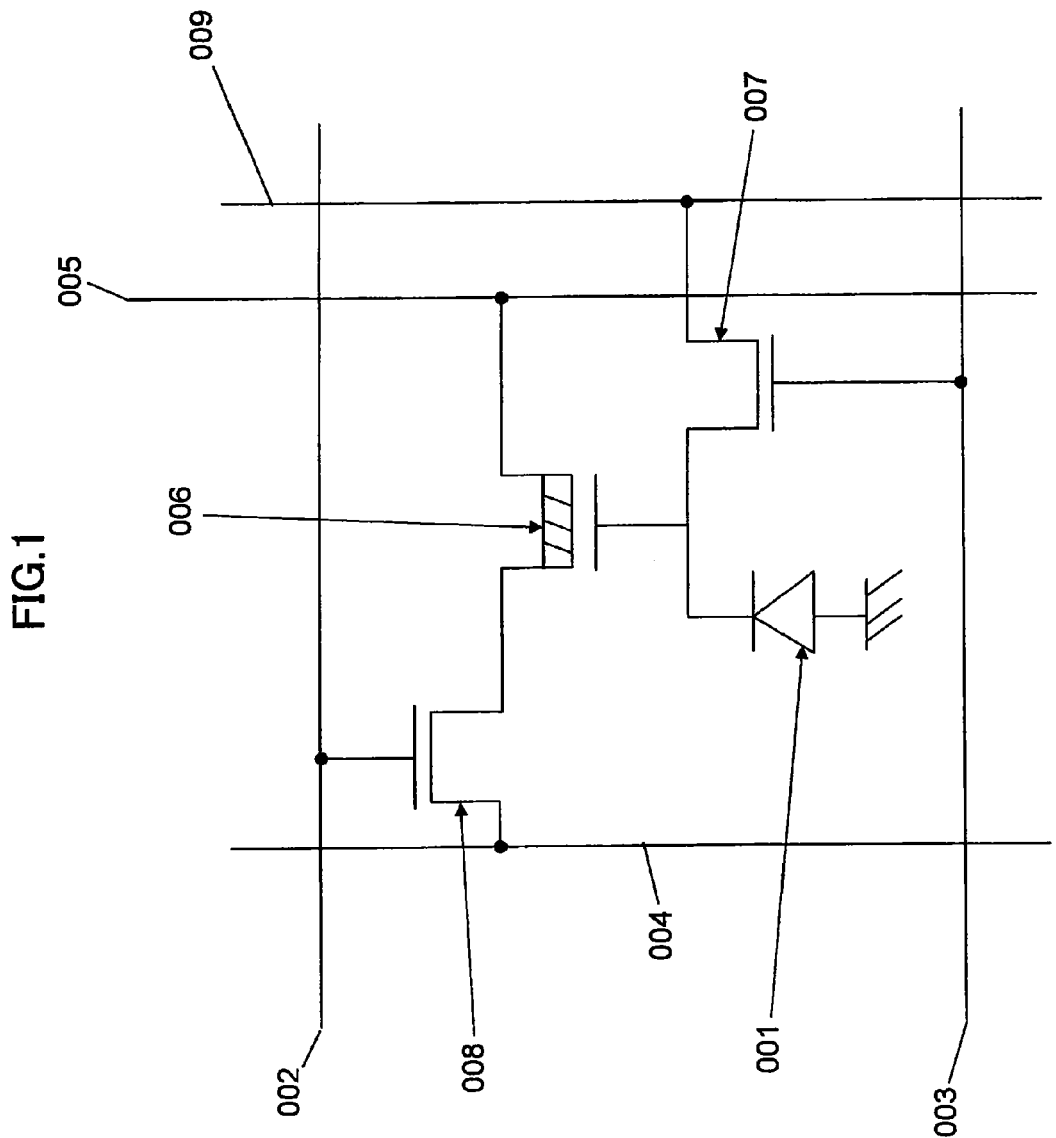
FIG. 1 is a diagram showing an equivalent circuit of a unit pixel of a conventional CMOS image sensor.

The present invention will now be described based on an embodiment thereof illustrated in the drawings. However, it should be understood that the present invention is not limited to the following embodiment.

Figure 2:
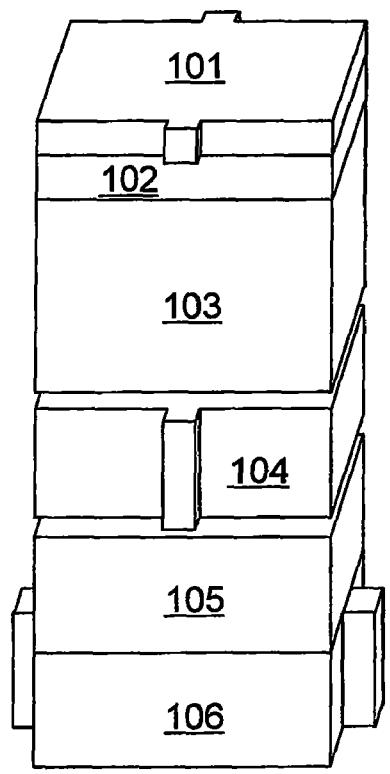
FIG. 2 is a bird's-eye view showing one solid-state imaging device according to a first embodiment of the present invention.
Figure 3:
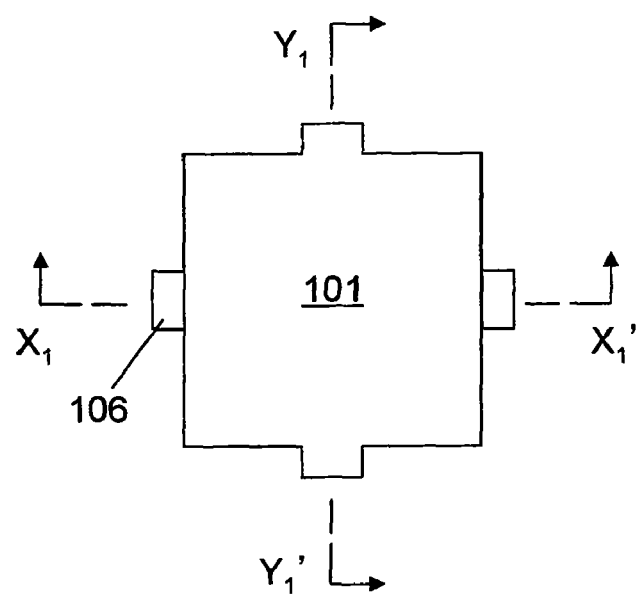
FIG. 3 is a top plan view showing the solid-state imaging device according to the first embodiment.
Figure 4A:
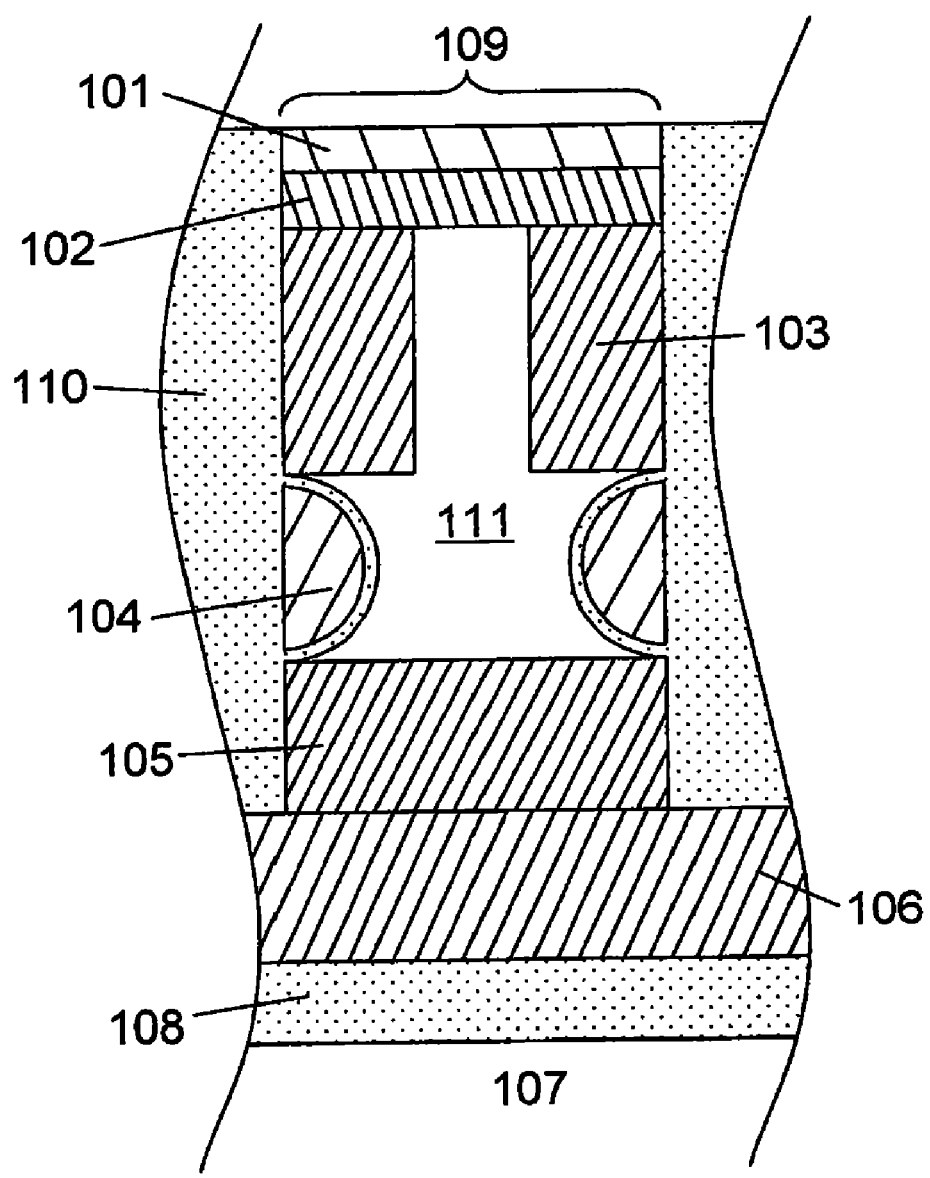
FIG. 4(a) is a sectional view taken along the line $X_1$-$X'_1$ in FIG. 3.
Figure 4B:
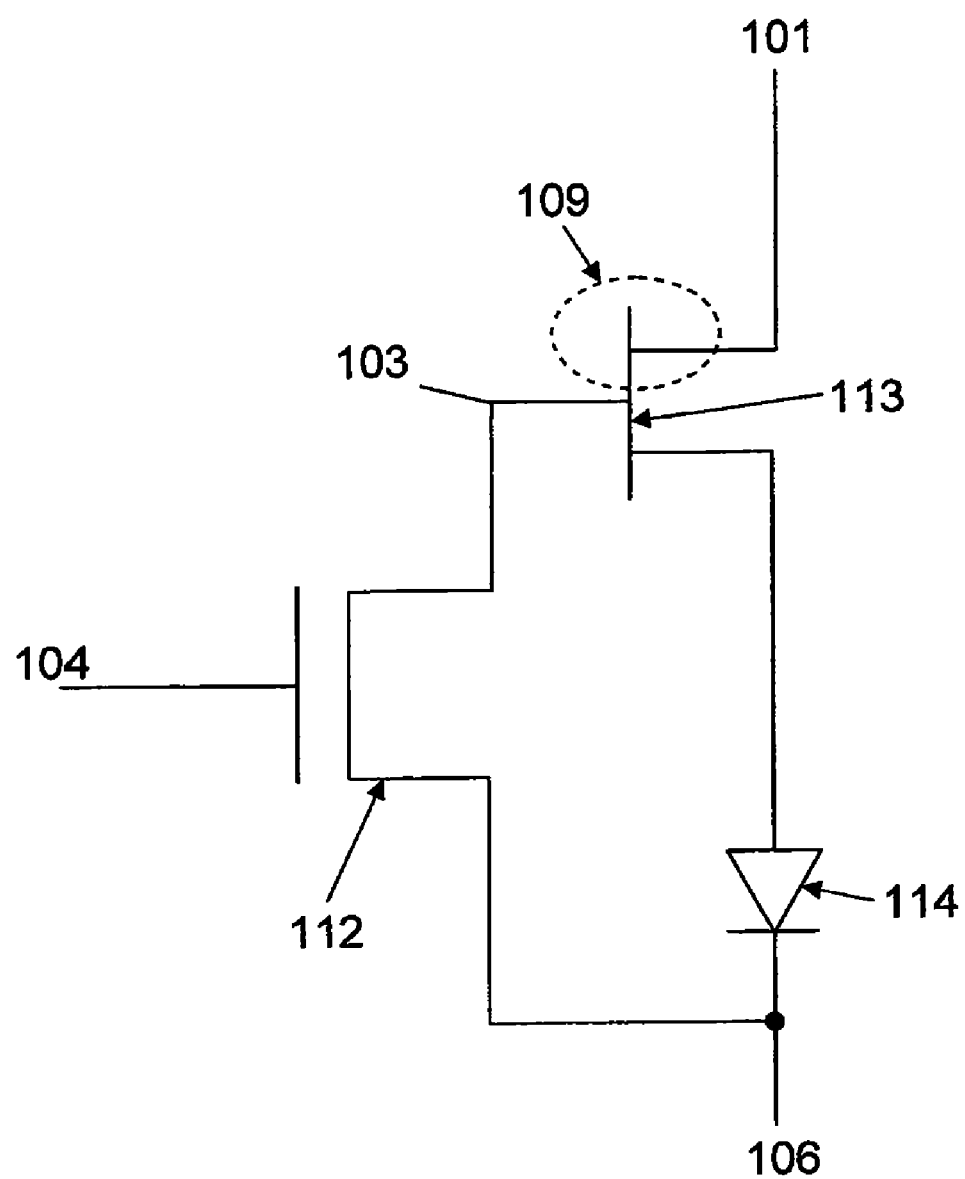
FIG. 4(b) is a diagram showing an equivalent circuit of the cross-sectional structure in FIG. 4(a).
Figure 5A:
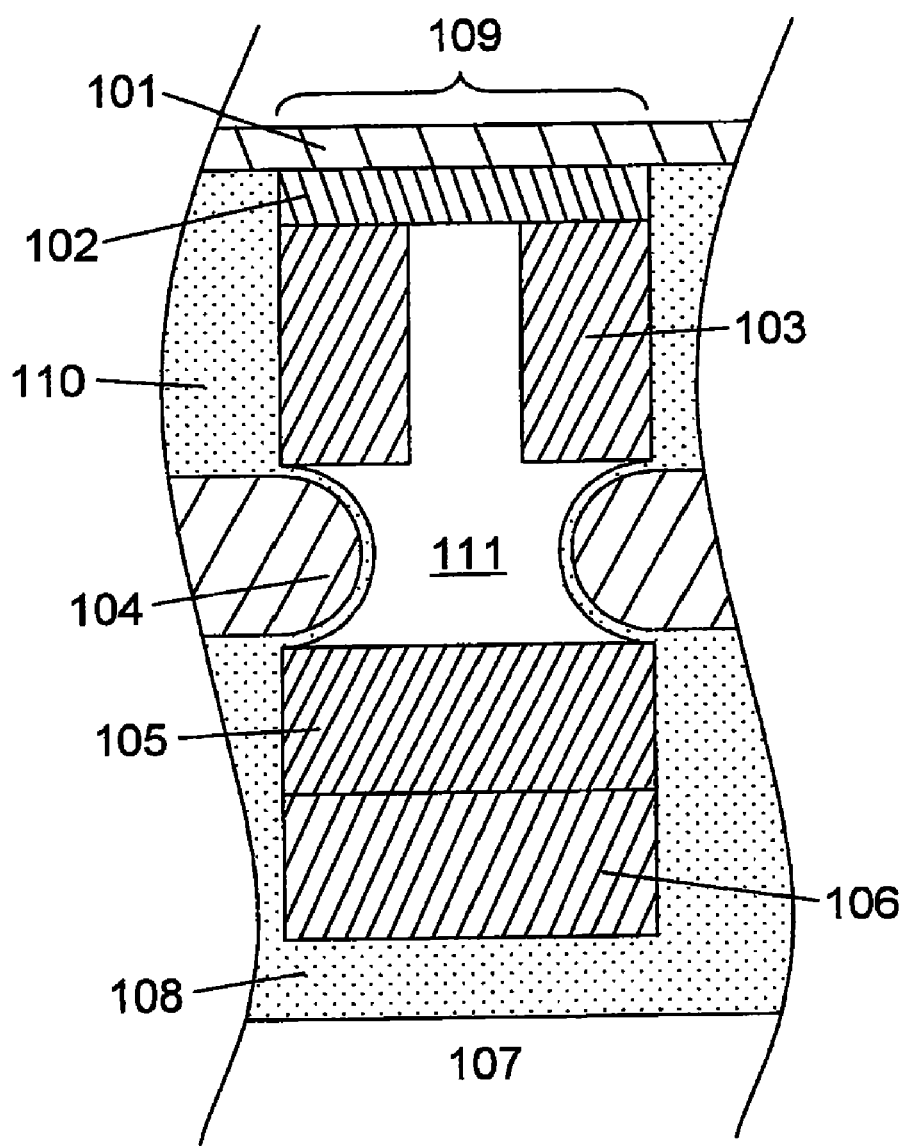
FIG. 5(a) is a sectional view taken along the line $Y_1$-$Y'_1$ in FIG. 3.
Figure 5B:
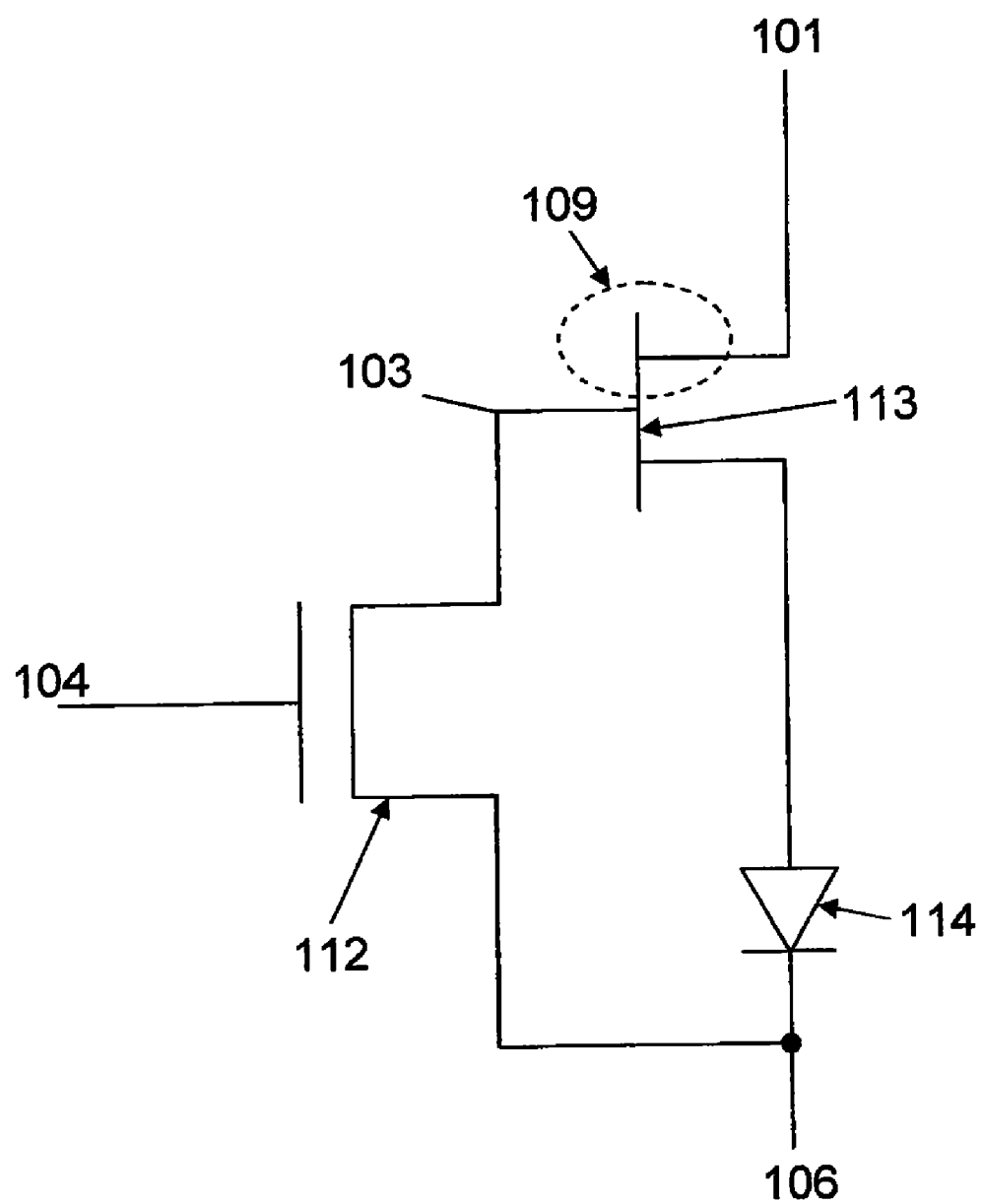
FIG. 5(b) is a diagram showing an equivalent circuit of the cross-sectional structure in FIG. 5(a).

FIG. 2 is a bird's-eye view showing a single solid-state imaging device according to a first embodiment of the present invention. FIG. 3 is a top plan view showing the solid-state imaging device according to the first embodiment. FIG. 4(a) is a sectional view taken along the line $X_1$-$X'_1$ in FIG. 3, and FIG. 4(b) is a diagram showing an equivalent circuit of the sectional structure in FIG. 4(a). FIG. 5(a) is a sectional view taken along the line $Y_1$-$Y'_1$ in FIG. 3, and FIG. 5(b) is a diagram showing an equivalent circuit of the sectional structure in FIG. 5(a).

In the first embodiment, an oxide film 108 is formed on a silicon substrate 107. A signal line 106 is formed on the oxide film 108, and an island-shaped semiconductor is formed on the signal line 106. The island-shaped semiconductor comprises: an n+-type diffusion layer 105 formed as a bottom portion thereof and connected to the signal line; a p-type impurity-doped region 111 formed above and adjacent to the n+-type diffusion layer; a gate 104 connected to the p-type impurity-doped region through a dielectric film; a charge storage section 103 comprised of an n-type diffusion layer connected to the p-type impurity-doped region 111 and adapted, in response to receiving light, to undergo a change in amount of electric charges therein; and a p+-type diffusion layer 102 formed above and adjacent to the p-type impurity-doped region and the n-type diffusion layer. Further, a pixel selection line 101 comprised of a transparent conductive film is formed to be connected to a top of the p+-type diffusion layer 102 which is a top portion of the island-shaped semiconductor. The gate is formed in such a manner that a part thereof is disposed inside a depression formed in a sidewall of the p-type impurity-doped region.

A combination of the p+-type diffusion layer 102 and the n-type diffusion layer 103 functions as a photoelectric-conversion photodiode 109. A combination of the p+-type diffusion layer 102, the n-type diffusion layer 103 and the p-type impurity-doped region 111 functions as an amplification transistor 113. A combination of the n+-type diffusion layer 105, the p-type impurity-doped region 111, the n-type diffusion layer 103 and the gate 104 functions as a reset transistor 112. A combination of the p-type impurity-doped region 111 and the n+-type diffusion layer 105 functions as a diode 114.

An oxide film 110 is formed as an interlayer dielectric film.

Figure 6:
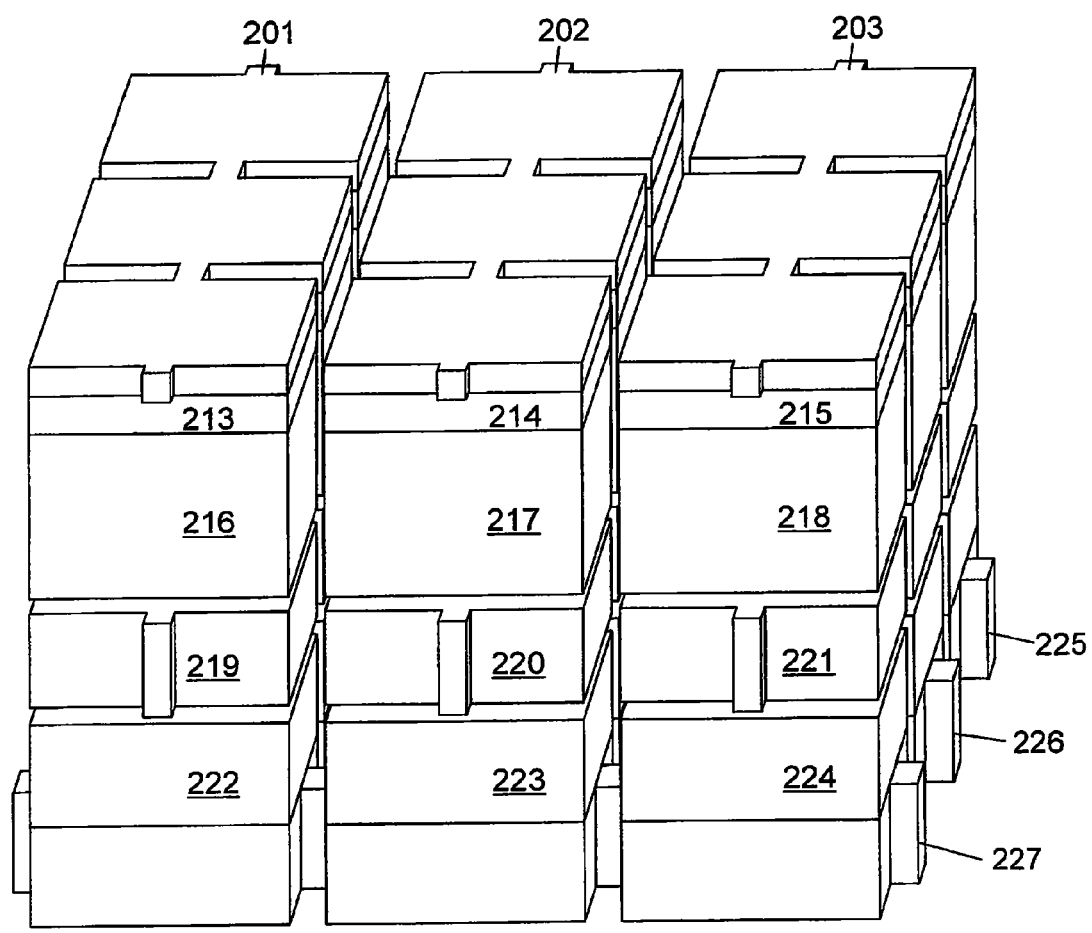
FIG. 6 is a bird's-eye view showing a solid-state imaging device array in which a plurality of the solid-state imaging devices according to the first embodiment are arranged in a matrix array.
Figure 7:
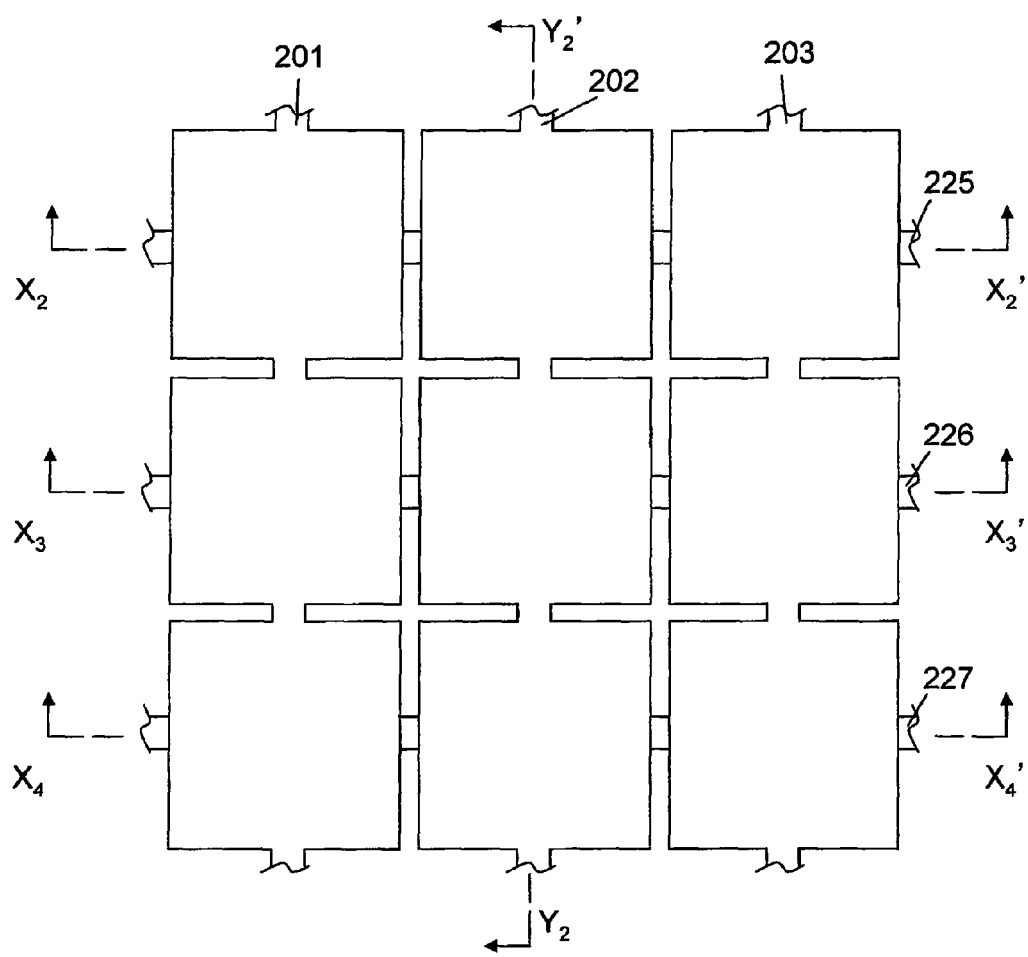
FIG. 7 is a top plan view showing the solid-state imaging device array in FIG. 6.

FIG. 6 is a bird's-eye view showing a solid-state imaging device array in which a plurality of the above solid-state imaging devices are arranged in a matrix pattern. FIG. 7 is a top plan view of the solid-state imaging device array. FIG. 8, FIG. 9, FIG. 10 and FIG. 11 are a sectional view taken along the line $X_2$-$X'_2$ in FIG. 7, a sectional view taken along the line $X_3$-$X'_3$ in FIG. 7, a sectional view taken along the line $X_4$-$X'_4$ in FIG. 7 and a sectional view taken along the line $Y_2$-$Y'_2$ in FIG. 7, respectively.

Figure 8:
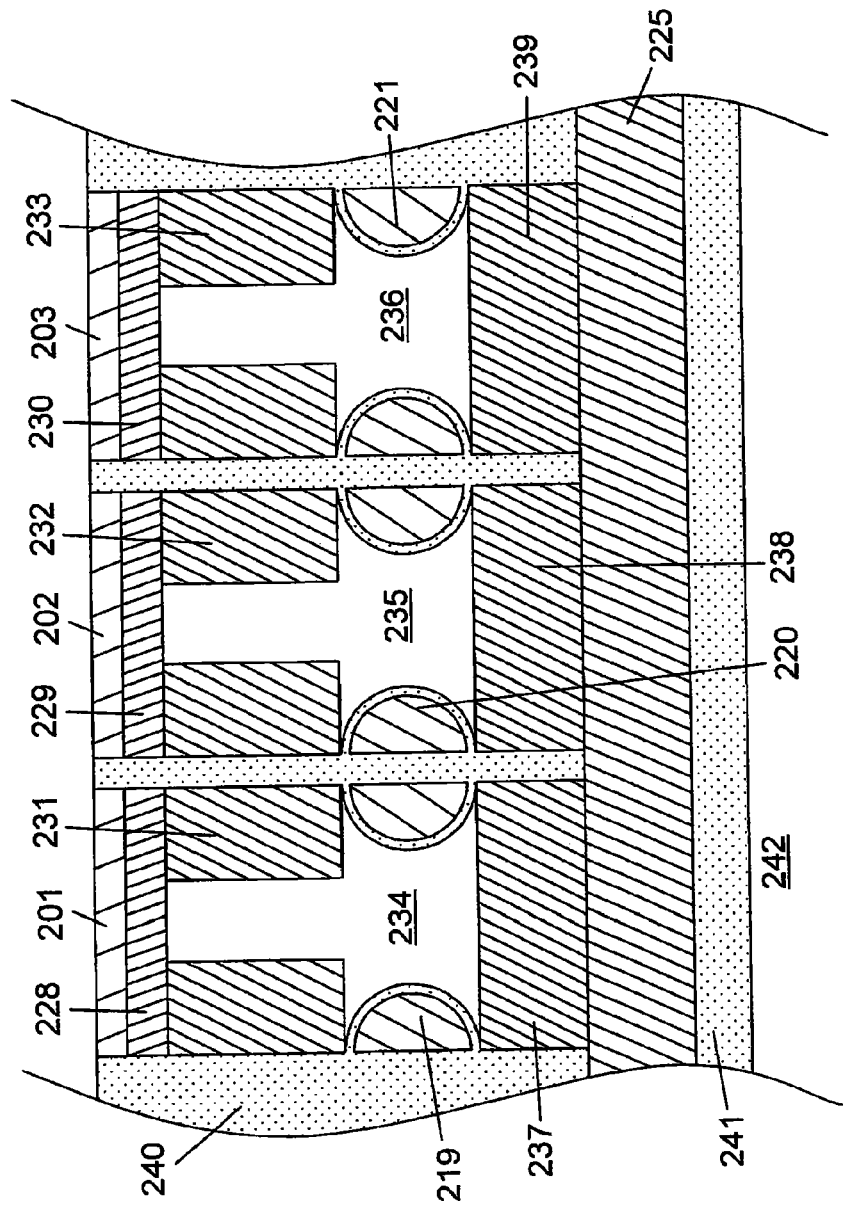
FIG. 8 is a sectional view taken along the line $X_2$-$X'_2$ in FIG. 7.

As shown in FIG. 8, an oxide film 241 is formed on a silicon substrate 242. A signal line 225 is formed on the oxide film 241, and a first island-shaped semiconductor is formed on the signal line 225. The first island-shaped semiconductor comprises: an n+-type diffusion layer 237 formed as a bottom portion thereof and connected to the signal line 225; a p-type impurity-doped region 234 formed above and adjacent to the n+-type diffusion layer 237; a gate 219 connected to the p-type impurity-doped region 234 through a dielectric film; a charge storage section 231 comprised of an n-type diffusion layer connected to the p-type impurity-doped region 234 and adapted, in response to receiving light, to undergo a change in amount of electric charges therein; and a p+-type diffusion layer 228 formed above and adjacent to the p-type impurity-doped region 234 and the n-type diffusion layer 231. Further, a pixel selection line 201 comprised of a transparent conductive film is formed to be connected to a top of the p+-type diffusion layer 228 which is a top portion of the first island-shaped semiconductor. The gate 219 is formed in such a manner that a part thereof is disposed inside a depression formed in a sidewall of the p-type impurity-doped region 234.

A second island-shaped semiconductor is formed on the signal line 225 formed on the oxide film 241 formed on the silicon substrate 242. The second island-shaped semiconductor comprises: an n+-type diffusion layer 238 formed as a bottom portion thereof and connected to the signal line 225; a p-type impurity-doped region 235 formed above and adjacent to the n+-type diffusion layer 238; a gate 220 connected to the p-type impurity-doped region 235 through a dielectric film; a charge storage section 232 comprised of an n-type diffusion layer connected to the p-type impurity-doped region 235 and adapted, in response to receiving light, to undergo a change in amount of electric charges therein; and a p+-type diffusion layer 229 formed above and adjacent to the p-type impurity-doped region 235 and the n-type diffusion layer 232. Further, a pixel selection line 202 comprised of a transparent conductive film is formed to be connected to a top of the p+-type diffusion layer 229 which is a top portion of the second island-shaped semiconductor. The gate 220 is formed in such a manner that a part thereof is disposed inside a depression formed in a sidewall of the p-type impurity-doped region 235.

A third island-shaped semiconductor is formed on the signal line 225 formed on the oxide film 241 formed on the silicon substrate 242. The third island-shaped semiconductor comprises: an n+-type diffusion layer 239 formed as a bottom portion thereof and connected to the signal line 225; a p-type impurity-doped region 236 formed above and adjacent to the n+-type diffusion layer 239; a gate 221 connected to the p-type impurity-doped region 236 through a dielectric film; a charge storage section 233 comprised of an n-type diffusion layer connected to the p-type impurity-doped region 236 and adapted, in response to receiving light, to undergo a change in amount of electric charges therein; and a p+-type diffusion layer 230 formed above and adjacent to the p-type impurity-doped region 236 and the n-type diffusion layer 233. Further, a pixel selection line 203 comprised of a transparent conductive film is formed to be connected to a top of the p+-type diffusion layer 230 which is a top portion of the third island-shaped semiconductor. The gate 221 is formed in such a manner that a part thereof is disposed inside a depression formed in a sidewall of the p-type impurity-doped region 236.

An oxide film 240 is formed as an interlayer dielectric film.

Figure 9:
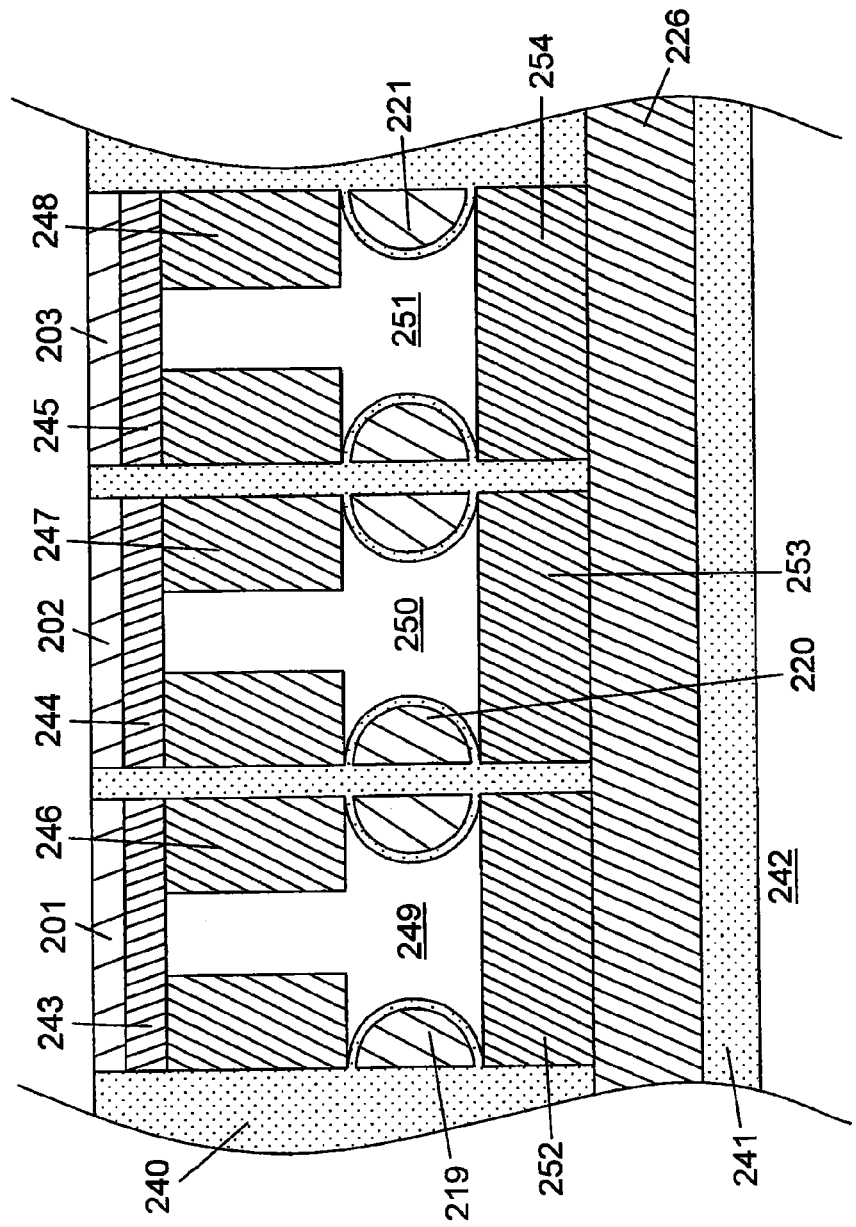
FIG. 9 is a sectional view taken along the line $X_3$-$X'_3$ in FIG. 7.

As shown in FIG. 9, a signal line 226 is formed on the oxide film 241 formed on the silicon substrate 242, and a fourth island-shaped semiconductor is formed on the signal line 226. The fourth island-shaped semiconductor comprises: an n+-type diffusion layer 252 formed as a bottom portion thereof and connected to the signal line 226; a p-type impurity-doped region 249 formed above and adjacent to the n+-type diffusion layer 252; a gate 219 connected to the p-type impurity-doped region 249 through a dielectric film; a charge storage section 246 comprised of an n-type diffusion layer connected to the p-type impurity-doped region 249 and adapted, in response to receiving light, to undergo a change in amount of electric charges therein; and a p+-type diffusion layer 243 formed above and adjacent to the p-type impurity-doped region 249 and the n-type diffusion layer 246. Further, the pixel selection line 201 comprised of a transparent conductive film is formed to be connected to a top of the p+-type diffusion layer 243 which is a top portion of the fourth island-shaped semiconductor. The gate 219 is formed in such a manner that a part thereof is disposed inside a depression formed in a sidewall of the p-type impurity-doped region 249.

A fifth island-shaped semiconductor is formed on the signal line 226 formed on the oxide film 241 formed on the silicon substrate 242. The fifth island-shaped semiconductor comprises: an n+-type diffusion layer 253 formed as a bottom portion thereof and connected to the signal line 226; a p-type impurity-doped region 250 formed above and adjacent to the n+-type diffusion layer 253; a gate 220 connected to the p-type impurity-doped region 250 through a dielectric film; a charge storage section 247 comprised of an n-type diffusion layer connected to the p-type impurity-doped region 250 and adapted, in response to receiving light, to undergo a change in amount of electric charges therein; and a p+-type diffusion layer 244 formed above and adjacent to the p-type impurity-doped region 250 and the n-type diffusion layer 247. Further, the pixel selection line 202 comprised of a transparent conductive film is formed to be connected to a top of the p+-type diffusion layer 244 which is a top portion of the fifth island-shaped semiconductor. The gate 220 is formed in such a manner that a part thereof is disposed inside a depression formed in a sidewall of the p-type impurity-doped region 250.

A sixth island-shaped semiconductor is formed on the signal line 226 formed on the oxide film 241 formed on the silicon substrate 242. The sixth island-shaped semiconductor comprises: an n+-type diffusion layer 254 formed as a bottom portion thereof and connected to the signal line 226; a p-type impurity-doped region 251 formed above and adjacent to the n+-type diffusion layer 254; a gate 221 connected to the p-type impurity-doped region 251 through a dielectric film; a charge storage section 248 comprised of an n-type diffusion layer connected to the p-type impurity-doped region 251 and adapted, in response to receiving light, to undergo a change in amount of electric charges therein; and a p+-type diffusion layer 245 formed above and adjacent to the p-type impurity-doped region 251 and the n-type diffusion layer 248. Further, the pixel selection line 203 comprised of a transparent conductive film is formed to be connected to a top of the p+-type diffusion layer 245 which is a top portion of the sixth island-shaped semiconductor. The gate 221 is formed in such a manner that a part thereof is disposed inside a depression formed in a sidewall of the p-type impurity-doped region 251.

The oxide film 240 is formed as an interlayer dielectric film.

Figure 10:
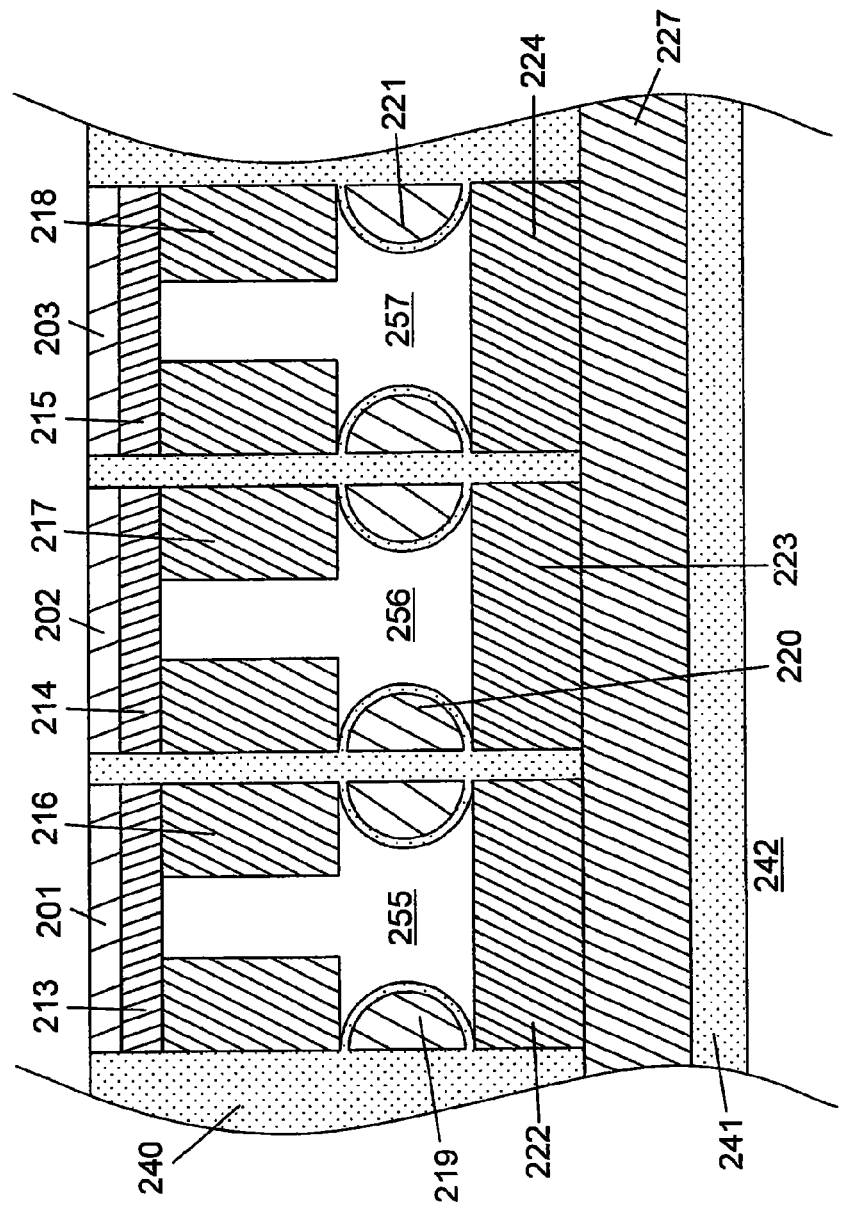
FIG. 10 is a sectional view taken along the line $X_4$-$X'_4$ in FIG. 7.

As shown in FIG. 10, a signal line 227 is formed on the oxide film 241 formed on the silicon substrate 242, and a seventh island-shaped semiconductor is formed on the signal line 227. The seventh island-shaped semiconductor comprises: an n+-type diffusion layer 222 formed as a bottom portion thereof and connected to the signal line 227; a p-type impurity-doped region 255 formed above and adjacent to the n+-type diffusion layer 222; a gate 219 connected to the p-type impurity-doped region 255 through a dielectric film; a charge storage section 216 comprised of an n-type diffusion layer connected to the p-type impurity-doped region 255 and adapted, in response to receiving light, to undergo a change in amount of electric charges therein; and a p+-type diffusion layer 213 formed above and adjacent to the p-type impurity-doped region 255 and the n-type diffusion layer 216. Further, the pixel selection line 201 comprised of a transparent conductive film is formed to be connected to a top of the p+-type diffusion layer 213 which is a top portion of the seventh island-shaped semiconductor. The gate 219 is formed in such a manner that a part thereof is disposed inside a depression formed in a sidewall of the p-type impurity-doped region 255.

An eighth island-shaped semiconductor is formed on the signal line 227 formed on the oxide film 241 formed on the silicon substrate 242. The eighth island-shaped semiconductor comprises: an n+-type diffusion layer 223 formed as a bottom portion thereof and connected to the signal line 227; a p-type impurity-doped region 256 formed above and adjacent to the n+-type diffusion layer 223; a gate 220 connected to the p-type impurity-doped region 256 through a dielectric film; a charge storage section 217 comprised of an n-type diffusion layer connected to the p-type impurity-doped region 256 and adapted, in response to receiving light, to undergo a change in amount of electric charges therein; and a p+-type diffusion layer 214 formed above and adjacent to the p-type impurity-doped region 256 and the n-type diffusion layer 217. Further, the pixel selection line 202 comprised of a transparent conductive film is formed to be connected to a top of the p+-type diffusion layer 214 which is a top portion of the eighth island-shaped semiconductor. The gate 220 is formed in such a manner that a part thereof is disposed inside a depression formed in a sidewall of the p-type impurity-doped region 256.

A ninth island-shaped semiconductor is formed on the signal line 227 formed on the oxide film 241 formed on the silicon substrate 242. The ninth island-shaped semiconductor comprises: an n+-type diffusion layer 224 formed as a bottom portion thereof and connected to the signal line 227; a p-type impurity-doped region 257 formed above and adjacent to the n+-type diffusion layer 224; a gate 221 connected to the p-type impurity-doped region 257 through a dielectric film; a charge storage section 218 comprised of an n-type diffusion layer connected to the p-type impurity-doped region 257 and adapted, in response to receiving light, to undergo a change in amount of electric charges therein; and a p+-type diffusion layer 215 formed above and adjacent to the p-type impurity-doped region 257 and the n-type diffusion layer 218. Further, the pixel selection line 203 comprised of a transparent conductive film is formed to be connected to a top of the p+-type diffusion layer 215 which is a top portion of the eighth island-shaped semiconductor. The gate 221 is formed in such a manner that a part thereof is disposed inside a depression formed in a sidewall of the p-type impurity-doped region 257.

The oxide film 240 is formed as an interlayer dielectric film.

Figure 11:
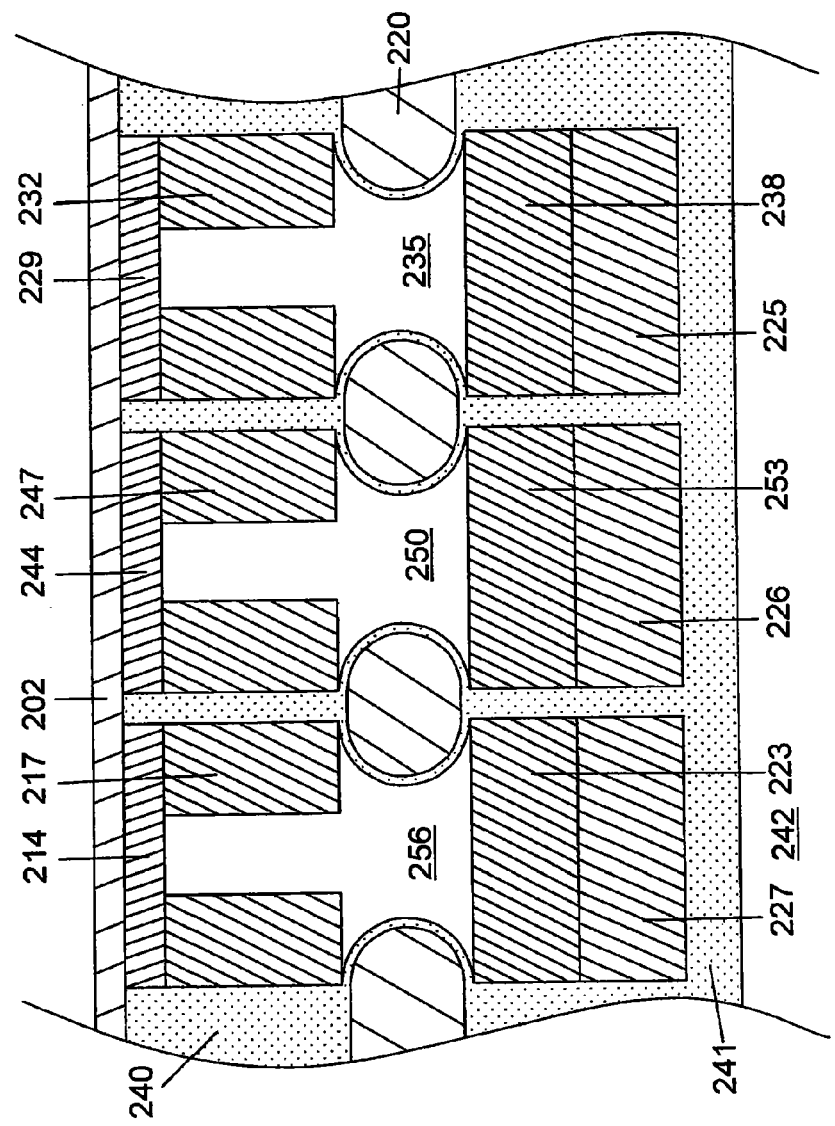
FIG. 11 is a sectional view taken along the line $Y_2$-$Y'_2$ in FIG. 7.
Figure 12A:
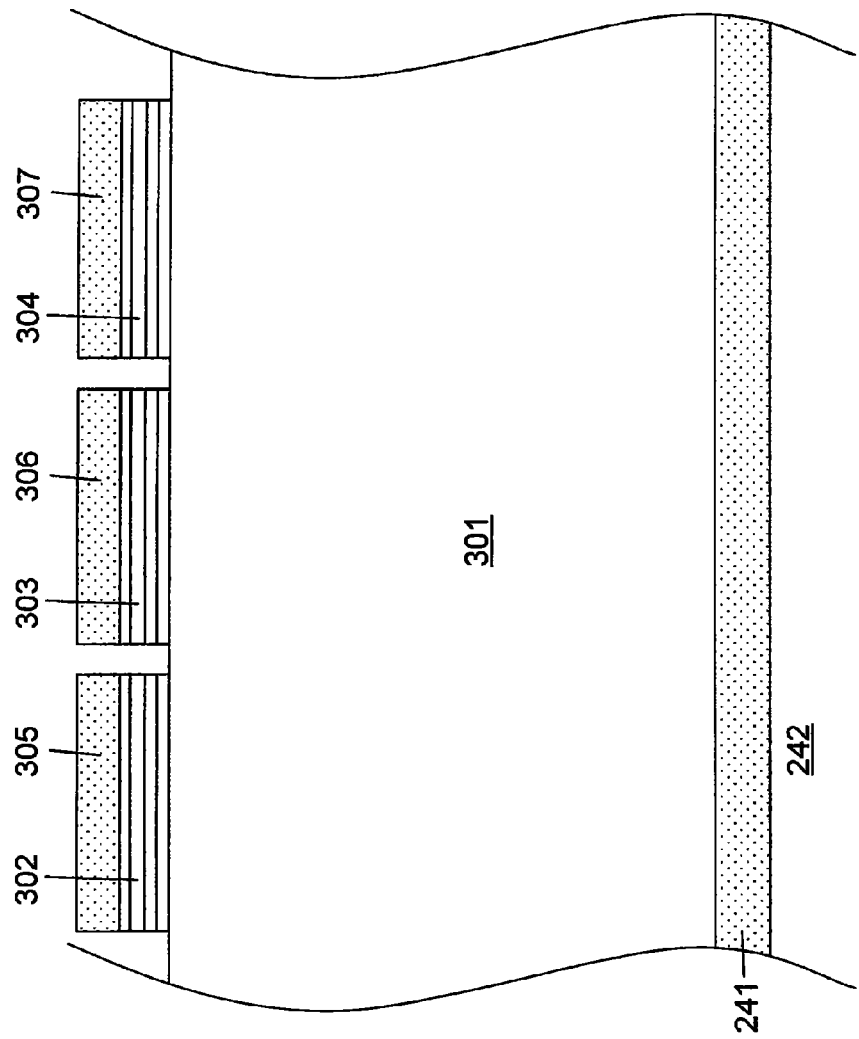
FIG. 12(a) is a sectional view ($X_2$-$X'_2$ section) showing a step in one example of a production method for a solid-state imaging device according to the present invention.
Figure 12B:
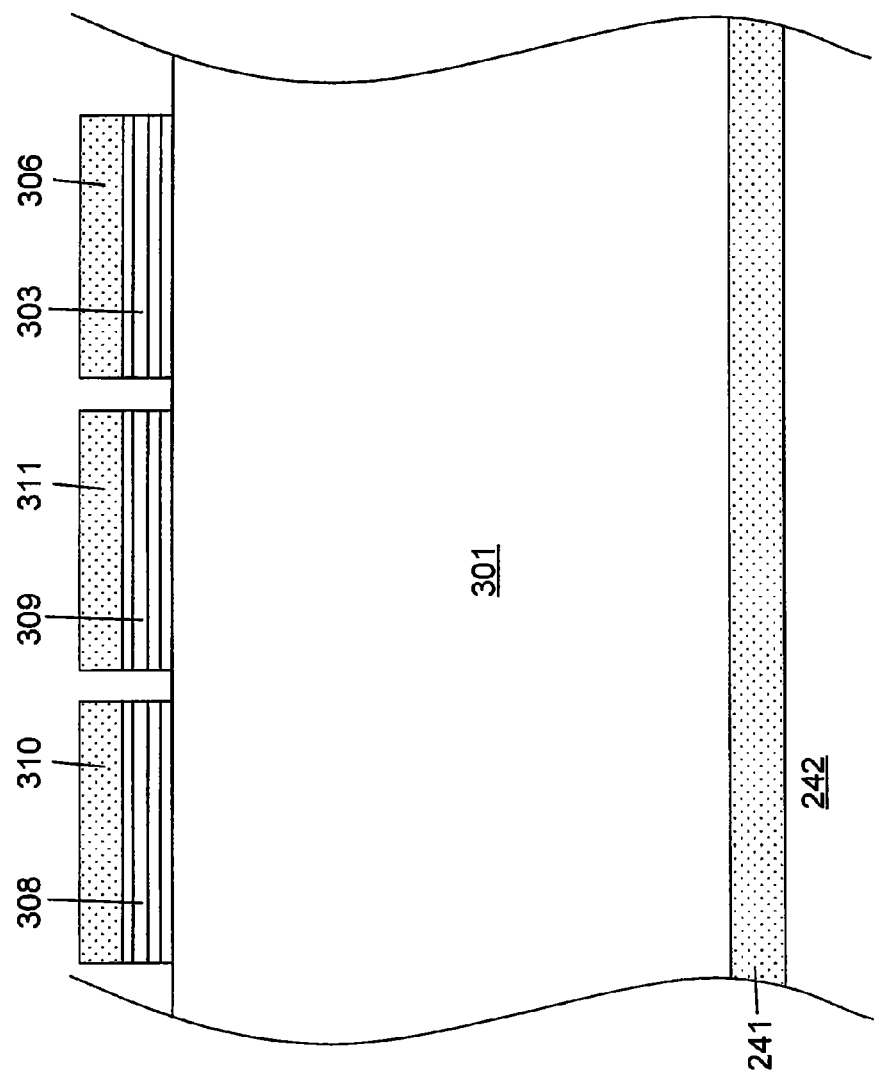
FIG. 12(b) is a sectional view ($Y_2$-$Y'_2$ section) showing the step in FIG. 12(a).

As shown in FIG. 11, the eighth island-shaped semiconductor is formed on the signal line 227 formed on the oxide film 241 formed on the silicon substrate 242. The eighth island-shaped semiconductor comprises: the n+-type diffusion layer 223 formed as a bottom portion thereof and connected to the signal line 227; the p-type impurity-doped region 256 formed above and adjacent to the n+-type diffusion layer 223; the gate 220 connected to the p-type impurity-doped region 256 through the dielectric film; the charge storage section 217 comprised of an n-type diffusion layer connected to the p-type impurity-doped region 256 and adapted, in response to receiving light, to undergo a change in amount of electric charges therein; and the p+-type diffusion layer 214 formed above and adjacent to the p-type impurity-doped region 256 and the n-type diffusion layer 217. Further, the pixel selection line 202 comprised of a transparent conductive film is formed to be connected to the top of the p+-type diffusion layer 214 which is the top portion of the eighth island-shaped semiconductor. The gate 220 is formed in such a manner that the part thereof is disposed inside the depression formed in the sidewall of the p-type impurity-doped region 256.

The fifth island-shaped semiconductor is formed on the signal line 226 formed on the oxide film 241 formed on the silicon substrate 242. The fifth island-shaped semiconductor comprises: the n+-type diffusion layer 253 formed as a bottom portion thereof and connected to the signal line 226; the p-type impurity-doped region 250 formed above and adjacent to the n+-type diffusion layer 253; the gate 220 connected to the p-type impurity-doped region 250 through the dielectric film; the charge storage section 247 comprised of an n-type diffusion layer connected to the p-type impurity-doped region 250 and adapted, in response to receiving light, to undergo a change in amount of electric charges therein; and the p+-type diffusion layer 244 formed above and adjacent to the p-type impurity-doped region 250 and the n-type diffusion layer 247. Further, the pixel selection line 202 comprised of a transparent conductive film is formed to be connected to the top of the p+-type diffusion layer 244 which is the top portion of the fifth island-shaped semiconductor. The gate 220 is formed in such a manner that the part thereof is disposed inside the depression formed in the sidewall of the p-type impurity-doped region 250.

The second island-shaped semiconductor is formed on the signal line 225 formed on the oxide film 241 formed on the silicon substrate 242. The second island-shaped semiconductor comprises: the n+-type diffusion layer 238 formed as a bottom portion thereof and connected to the signal line 225; the p-type impurity-doped region 235 formed above and adjacent to the n+-type diffusion layer 238; the gate 220 connected to the p-type impurity-doped region 235 through the dielectric film; the charge storage section 232 comprised of an n-type diffusion layer connected to the p-type impurity-doped region 235 and adapted, in response to receiving light, to undergo a change in amount of electric charges therein; and the p+-type diffusion layer 229 formed above and adjacent to the p-type impurity-doped region 235 and the n-type diffusion layer 232. Further, the pixel selection line 202 comprised of a transparent conductive film is formed to be connected to the top of the p+-type diffusion layer 229 which is the top portion of the second island-shaped semiconductor. The gate 220 is formed in such a manner that the part thereof is disposed inside the depression formed in the sidewall of the p-type impurity-doped region 235.

With reference to FIGS. 12(a) to 31(b), one example of a production process for forming a solid-state imaging device structure according to the present invention will be described below.

Firstly, an oxide film 241 is formed on a silicon substrate 242. Subsequently, a p-type silicon 301 is formed on the oxide film 241. Then, a nitride film is deposited on the p-type silicon 301, and an oxide film is deposited on the nitride film. Further, after forming a resist for a silicon pillar, the oxide film and the nitride film are etched to form an oxide film-based mask (305, 306, 307, 310, 311) and a nitride film-based mask (302, 303, 304, 308, 309) on the p-type silicon 301, and then the resist is removed (FIGS. 12(a) and 12(b)).

Figure 13A:
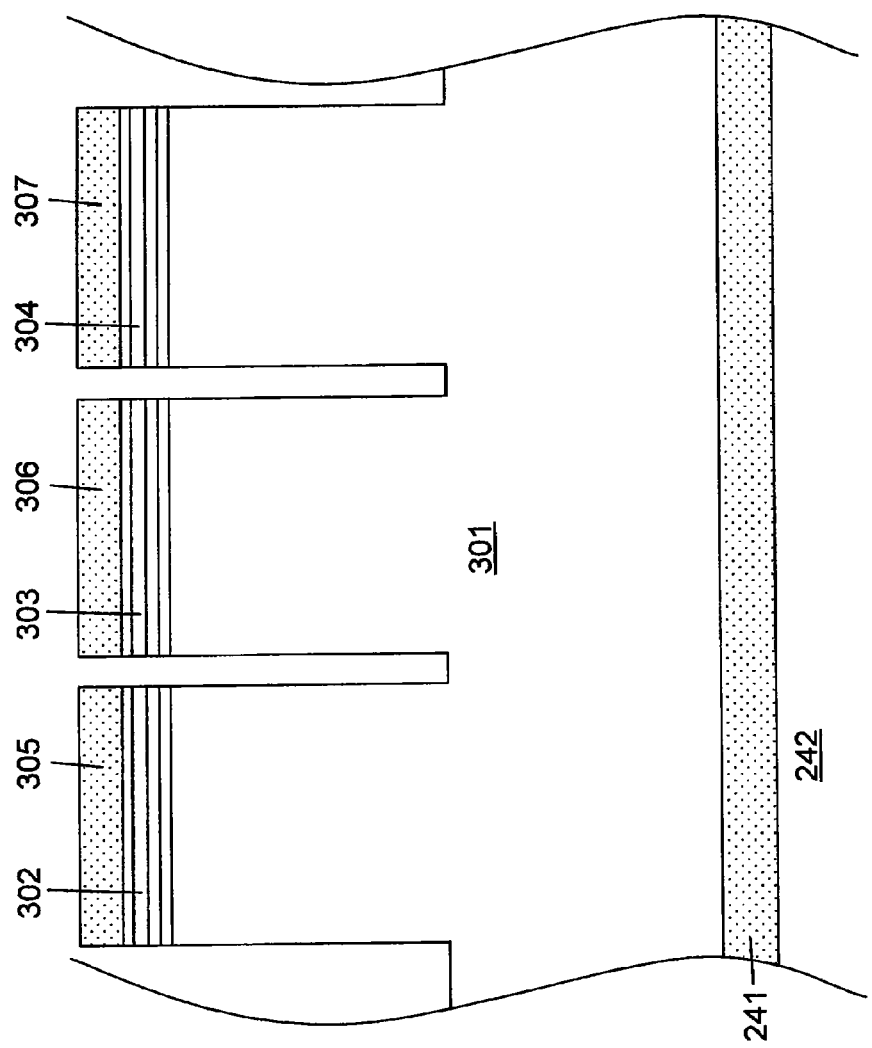
FIG. 13(a) is a sectional view ($X_2$-$X'_2$ section) showing a step in the example of the production method.

The p-type silicon is etched (FIGS. 13(a) and 13(b)) to form a silicon pillar.

Figure 14A:
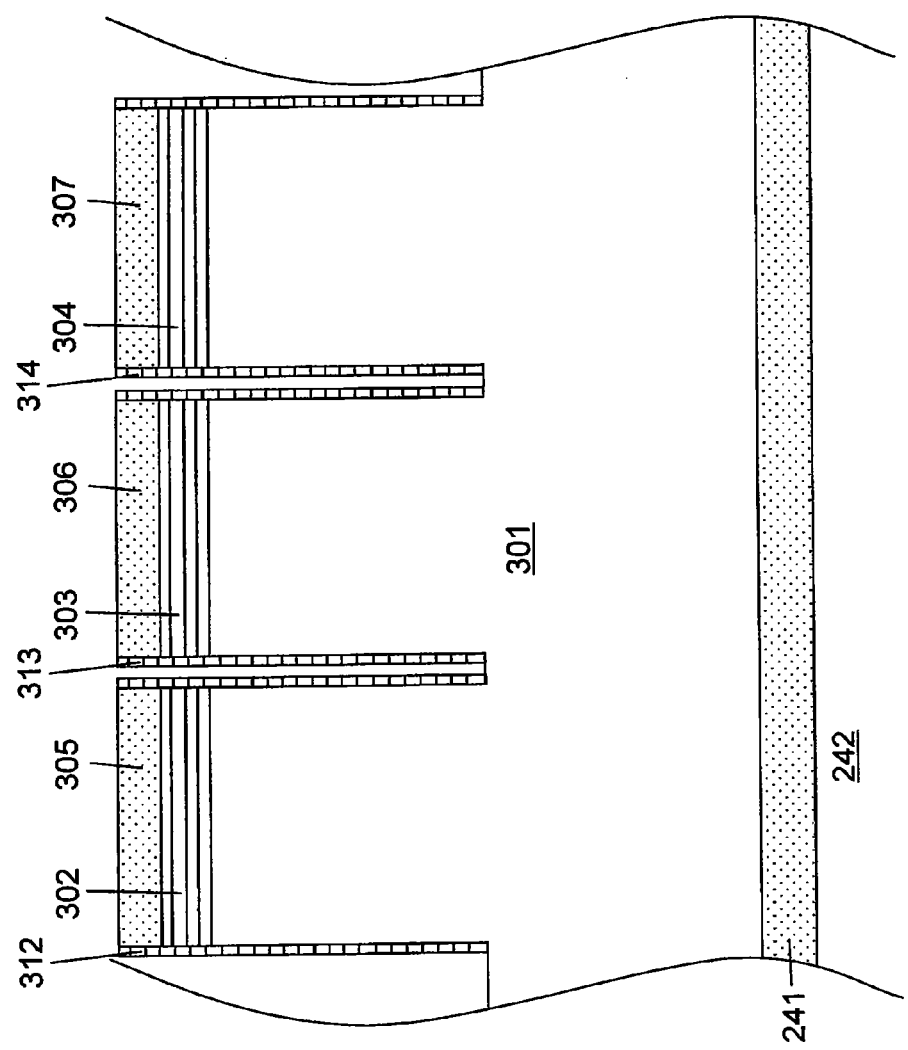
FIG. 14(a) is a sectional view ($X_2$-$X'_2$ section) showing a step in the example of the production method.
Figure 14B:
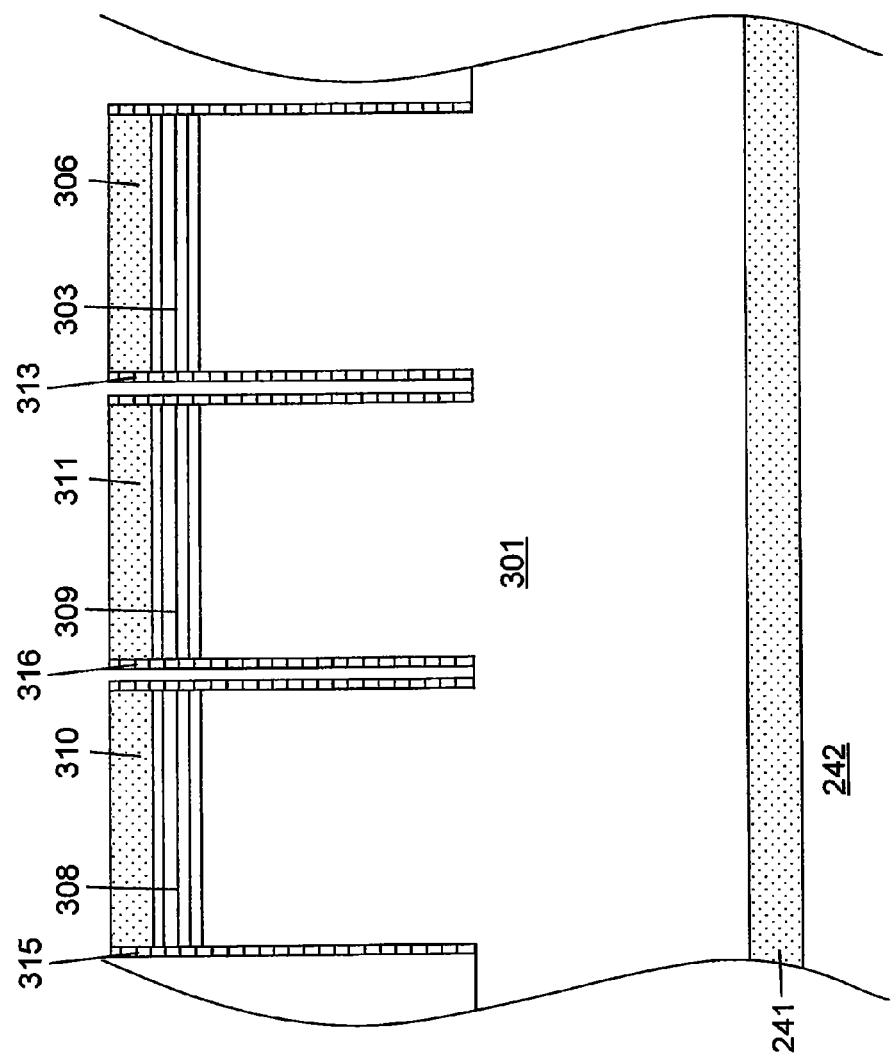
FIG. 14(b) is a sectional view ($Y_2$-$Y'_2$ section) showing the step in FIG. 14(a).

A nitride film is deposited and then etched in such a manner that a sidewall-shaped nitride film (312, 313, 314, 315, 316) is left on a sidewall of the silicon pillar (FIGS. 14(a) and 14(b)).

Figure 15B:
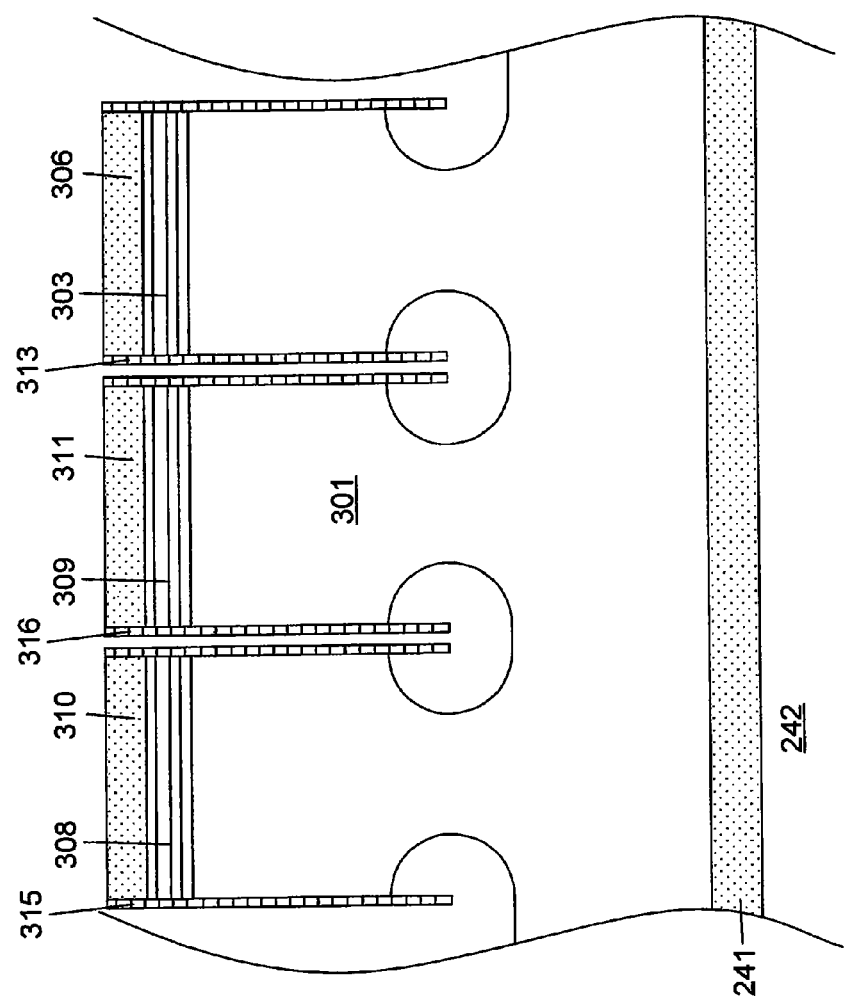
FIG. 15(b) is a sectional view ($Y_2$-$Y'_2$ section) showing the step in FIG. 15(a).

The p-type silicon is isotropically etched to form a depression in a sidewall of a p-type impurity-doped region (FIGS. 15(a) and 15(b)).

Figure 16A:
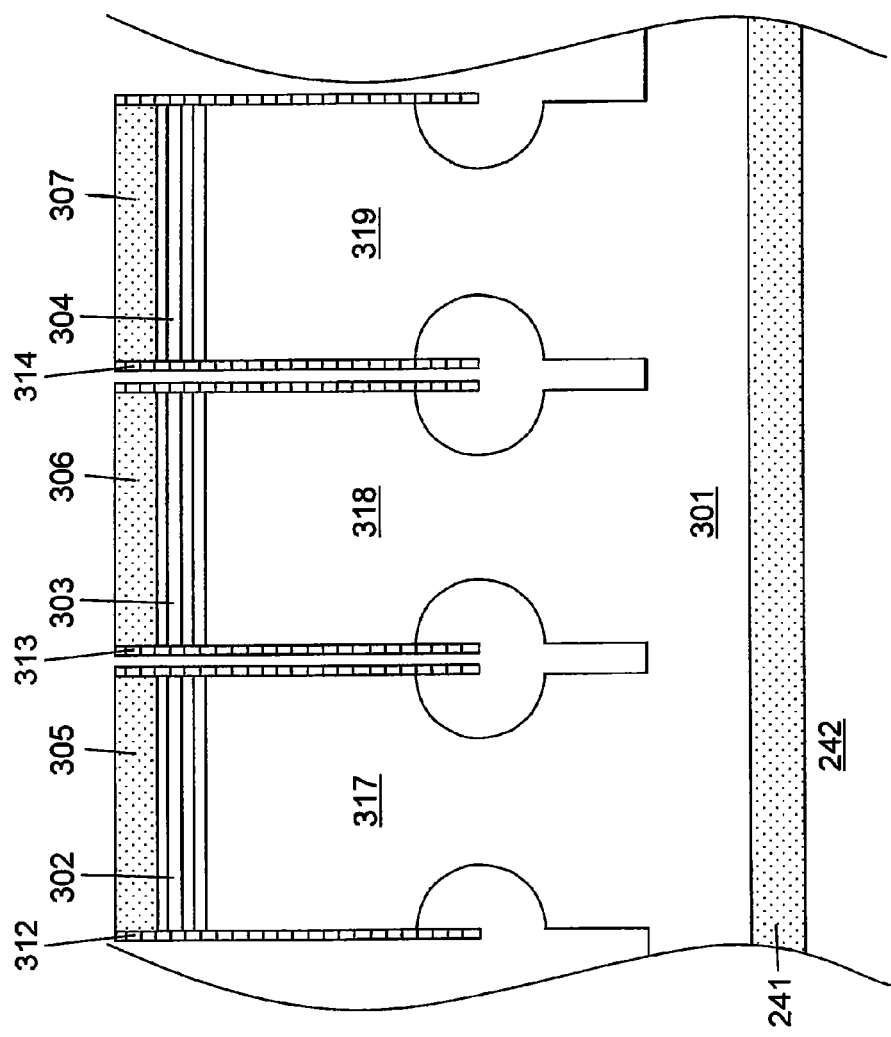
FIG. 16(a) is a sectional view ($X_2$-$X'_2$ section) showing a step in the example of the production method.

The p-type silicon is etched to form an island-shaped semiconductor (317, 318, 319, 320, 321) having the depression in the sidewall of the p-type impurity-doped region (FIGS. 16(a) and 16(b)).

A thin oxide film 322 is formed to prevent ion channeling during ion implantation (FIGS. 17(a) and 17(b)).

A continuous n+-type diffusion layer 323 is formed through phosphorus (P) implantation and annealing (FIGS. 18(a) and 18(b)).

Figure 19A:
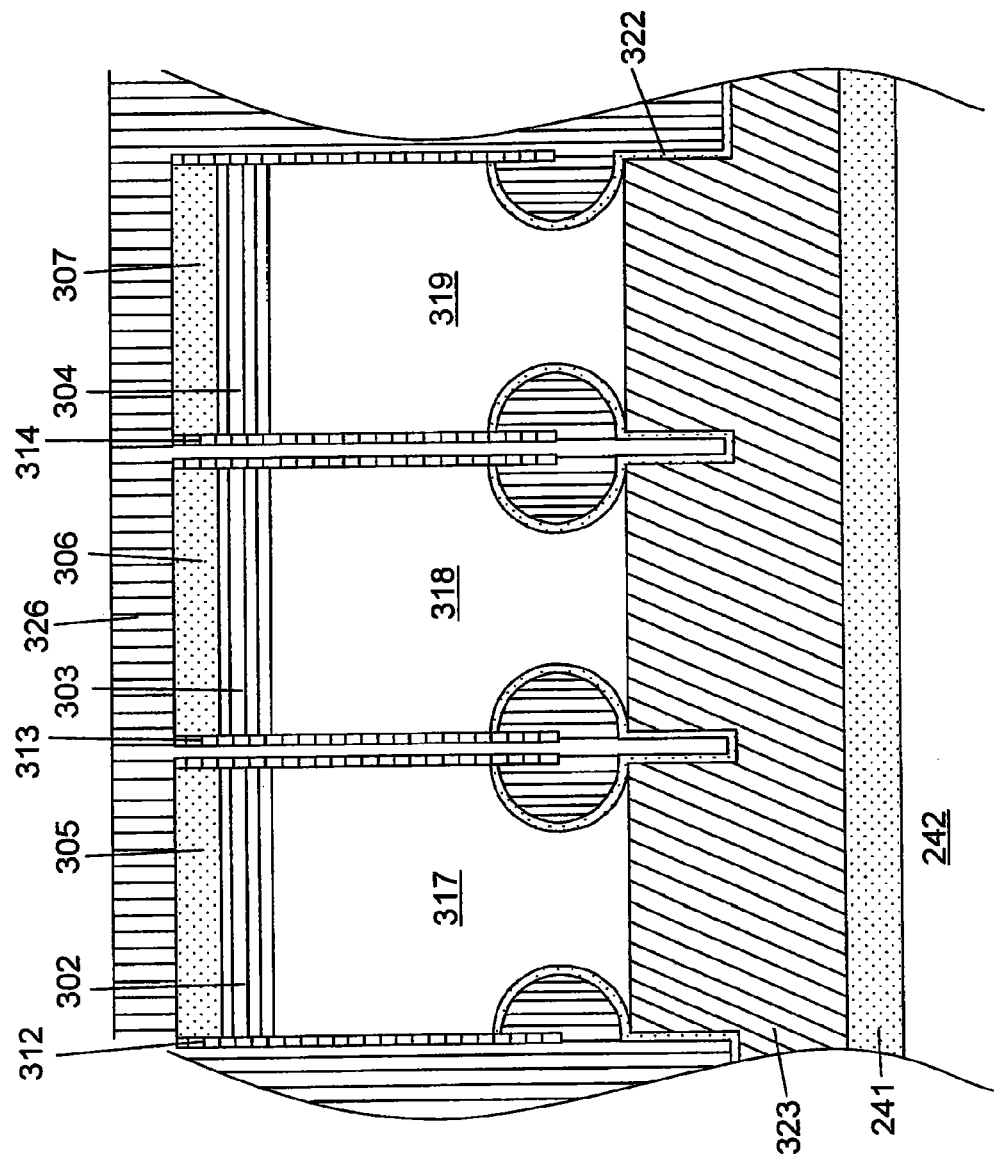
FIG. 19(a) is a sectional view ($X_2$-$X'_2$ section) showing a step in the example of the production method.

A resist (324, 325, 326) for a signal line is formed (FIGS. 19(a) and 19(b)).

Figure 20B:
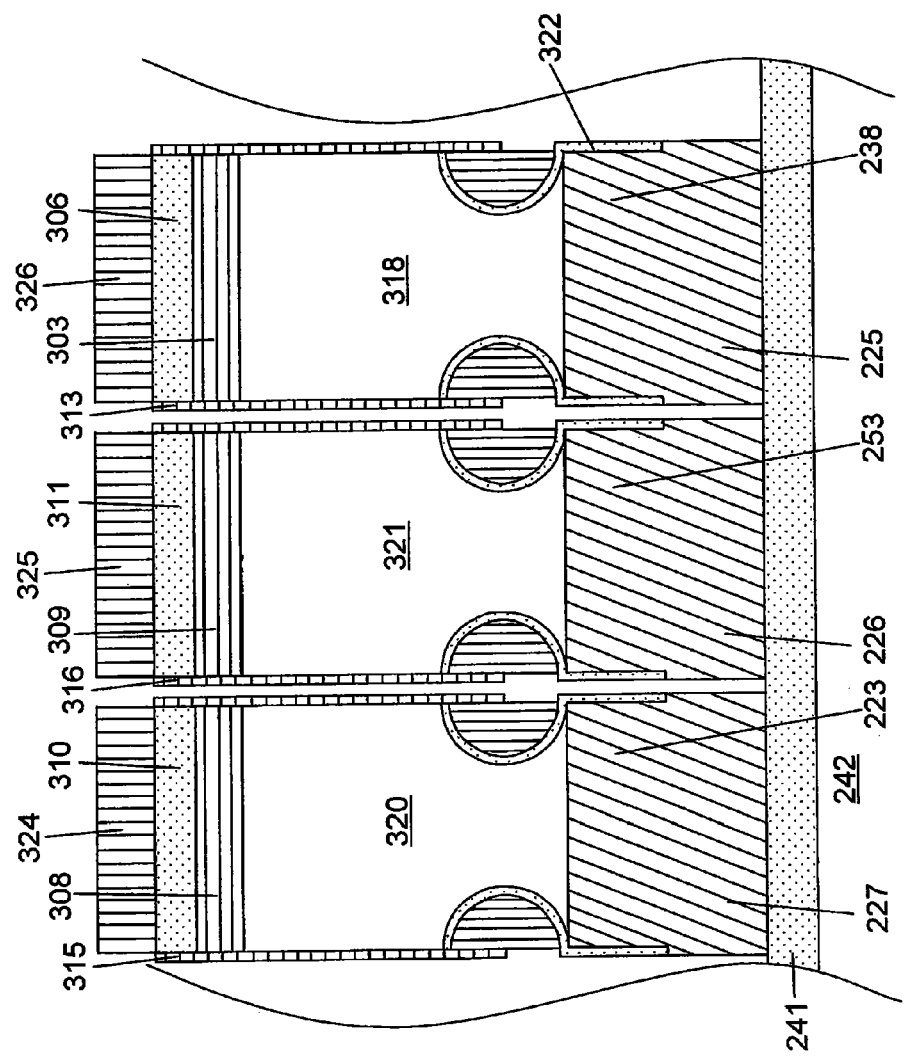
FIG. 20(b) is a sectional view ($Y_2$-$Y'_2$ section) showing the step in FIG. 20(a).

The thin oxide film and the silicon (continuous n+-type diffusion layer?) are etched to form an n+-type diffusion layer (237, 238, 239, 223, 256) and a signal line (225, 226, 227) (FIGS. 20(a) and 20(b)).

Figure 21B:
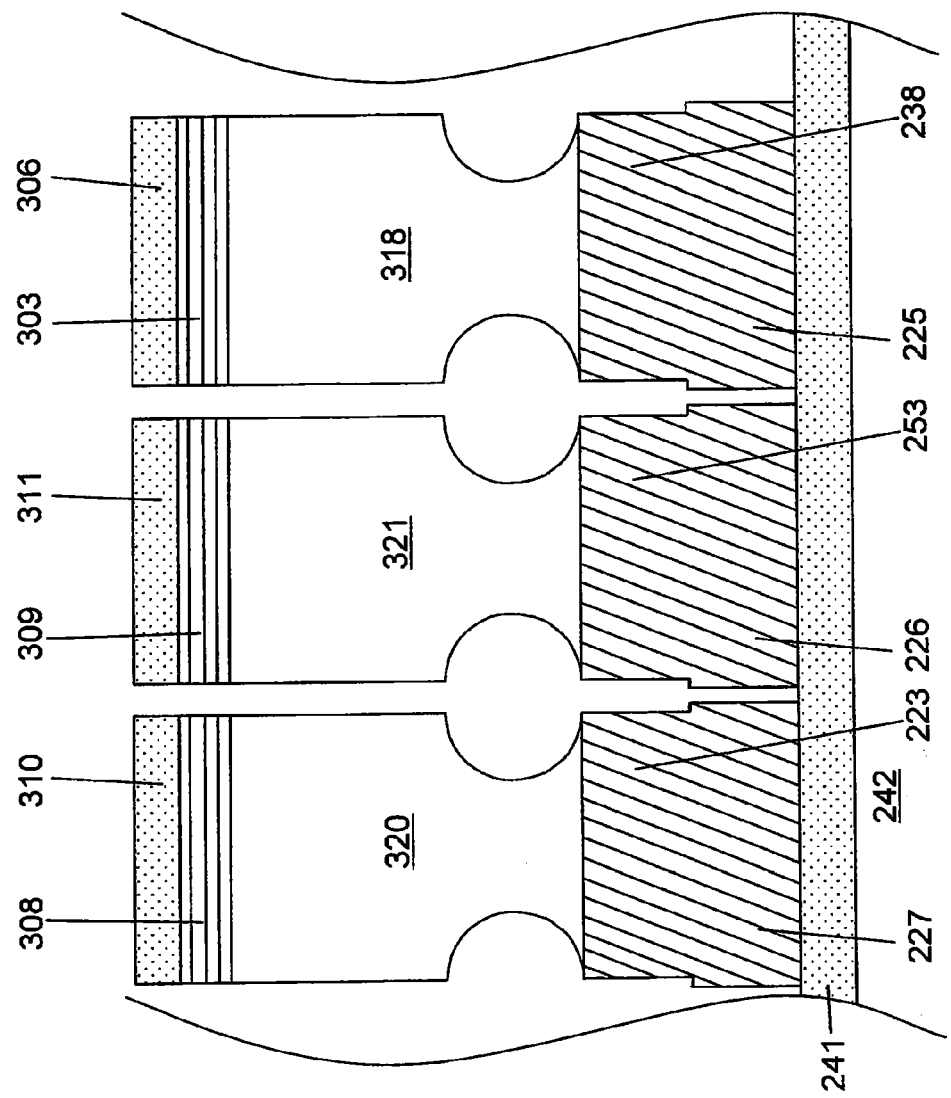
FIG. 21(b) is a sectional view ($Y_2$-$Y'_2$ section) showing the step in FIG. 21(a).
Figure 23B:
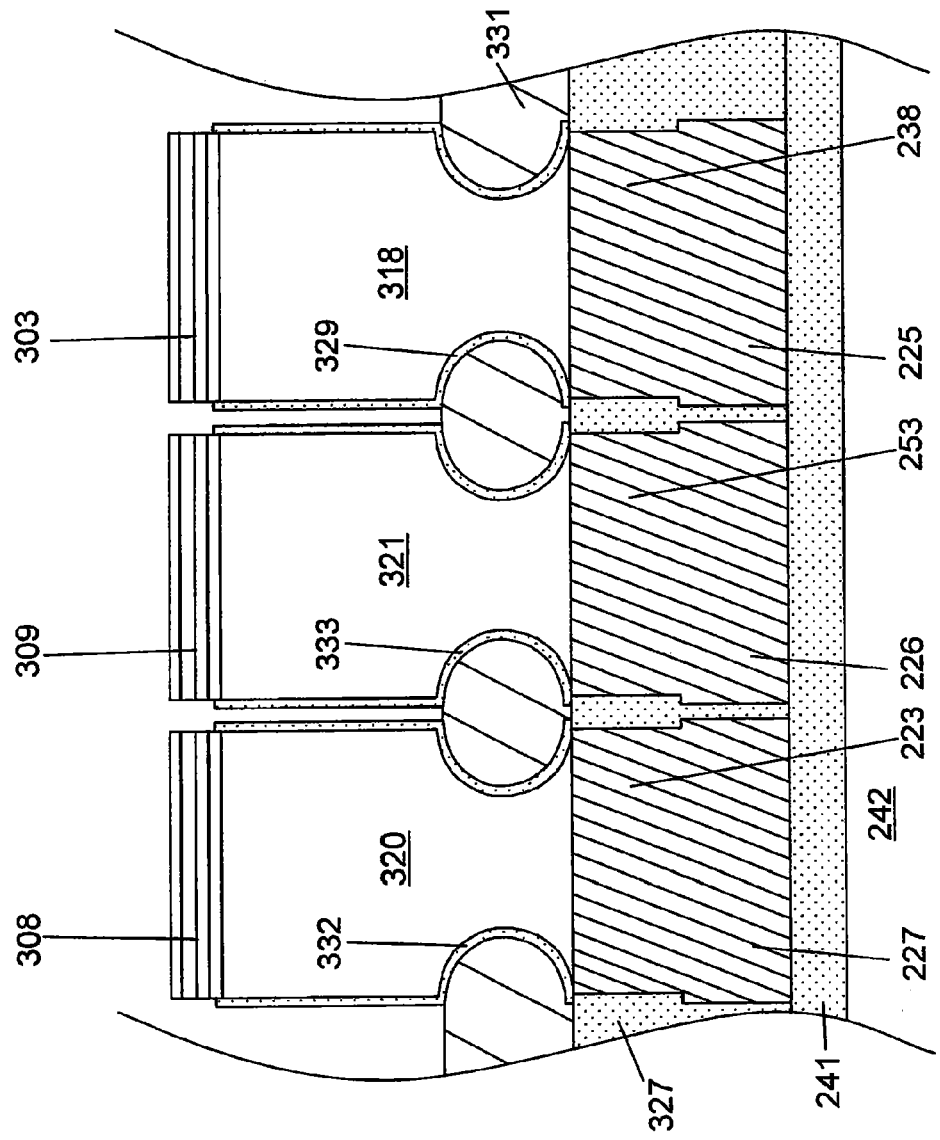
FIG. 23(b) is a sectional view ($Y_2$-$Y'_2$ section) showing the step in FIG. 23(a).

The resist, the sidewall-shaped nitride film and the thin oxide film are removed (FIGS. 21(a) and 21(b)).

An oxide film 327 is deposited and then subjected to flattening and etching-back (FIGS. 22(a) and 22(b)).

A gate dielectric film (328, 329, 330, 332, 333) is formed. Subsequently, polysilicon is deposited and then subjected to flattening and etching-back (FIGS. 23(a) and 23(b)).

Figure 24A:
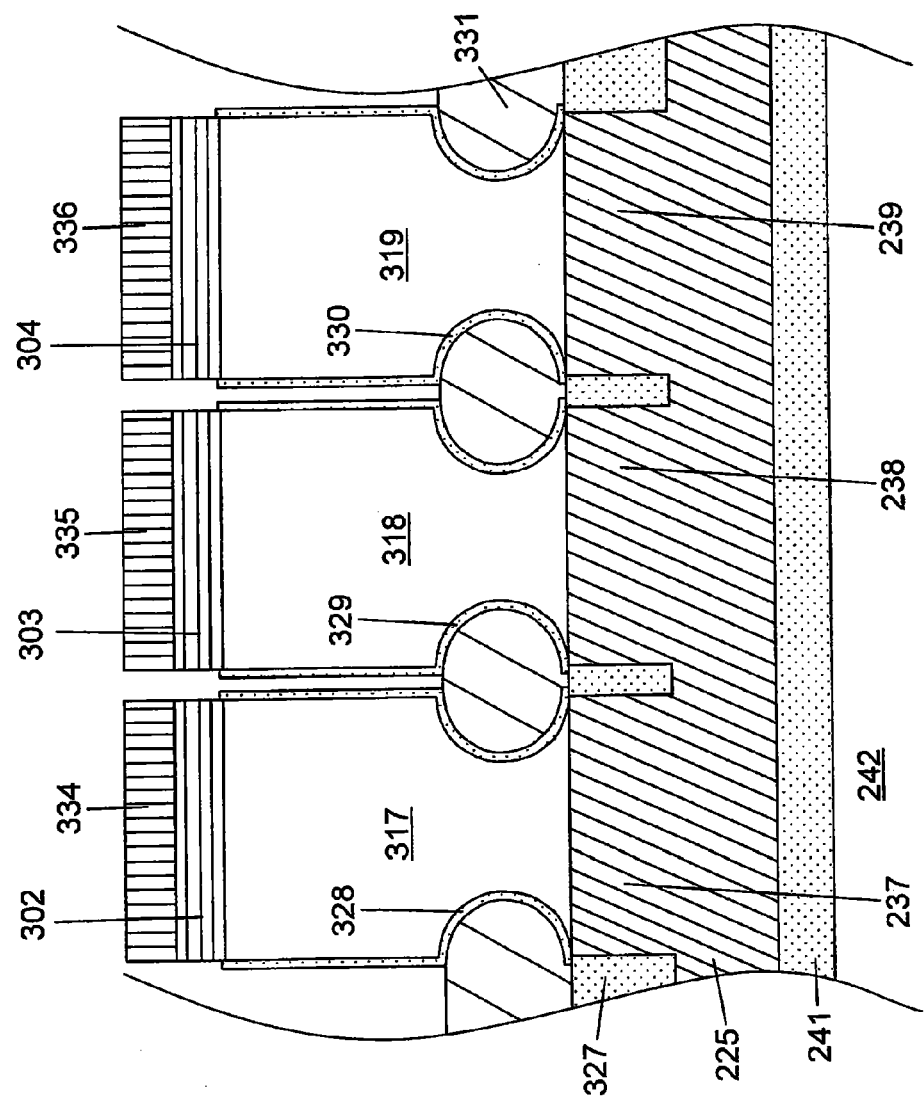
FIG. 24(a) is a sectional view ($X_2$-$X'_2$ section) showing a step in the example of the production method.
Figure 24B:
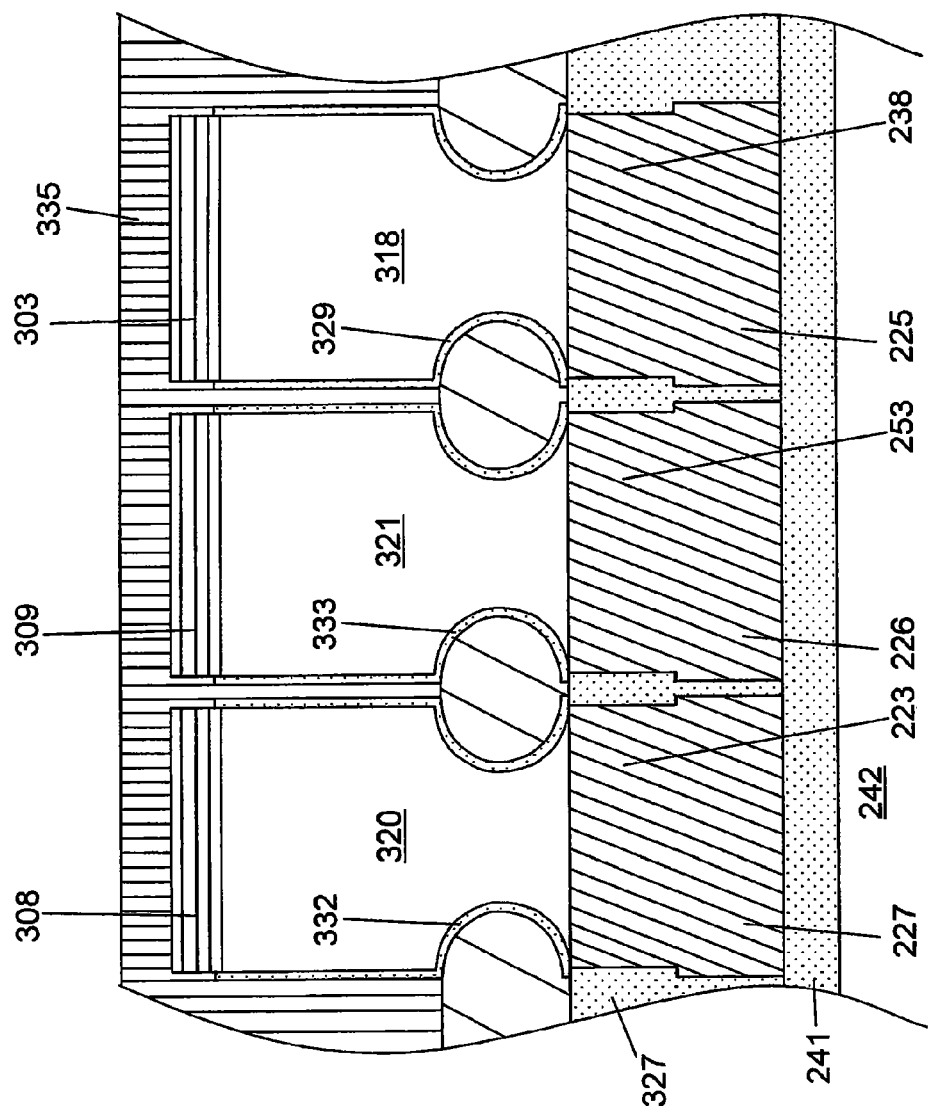
FIG. 24(b) is a sectional view ($Y_2$-$Y'_2$ section) showing the step in FIG. 24(a).

A resist (334, 335, 336) for a gate is formed (FIGS. 24(a) and 24(b)).

Figure 25A:
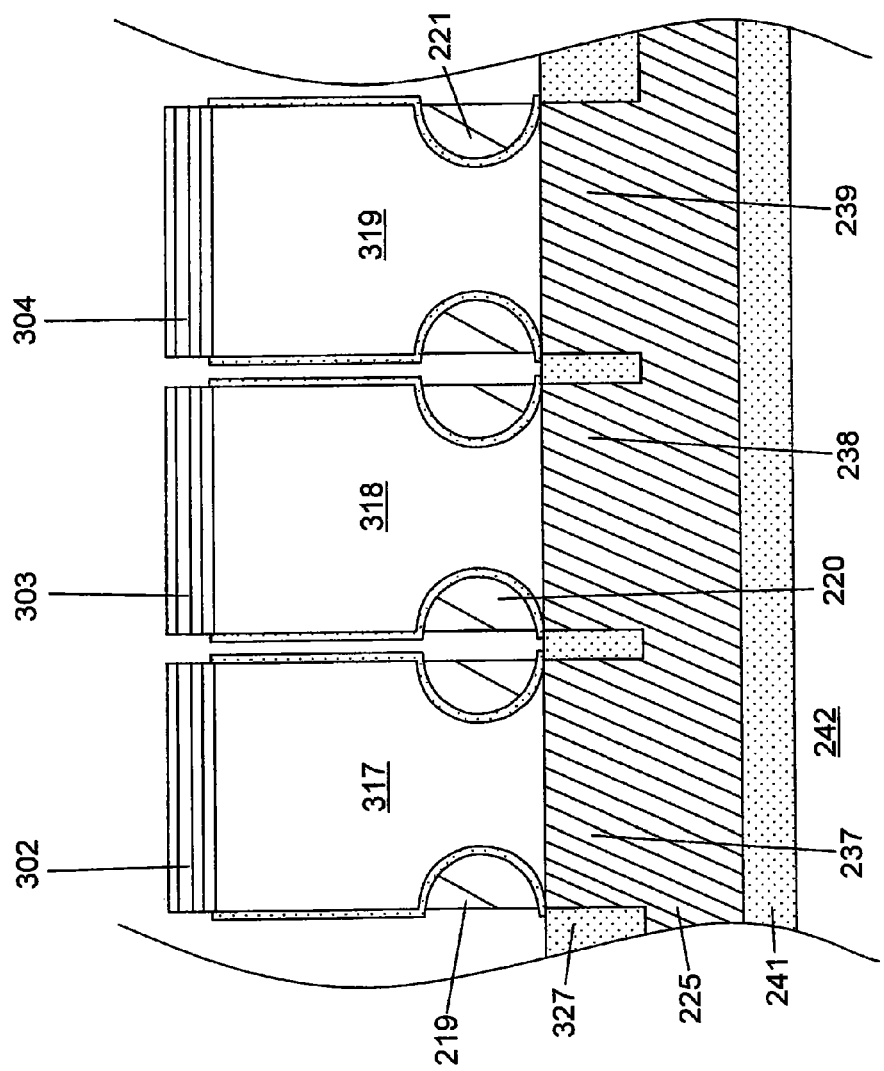
FIG. 25(a) is a sectional view ($X_2$-$X'_2$ section) showing a step in the example of the production method.
Figure 25B:
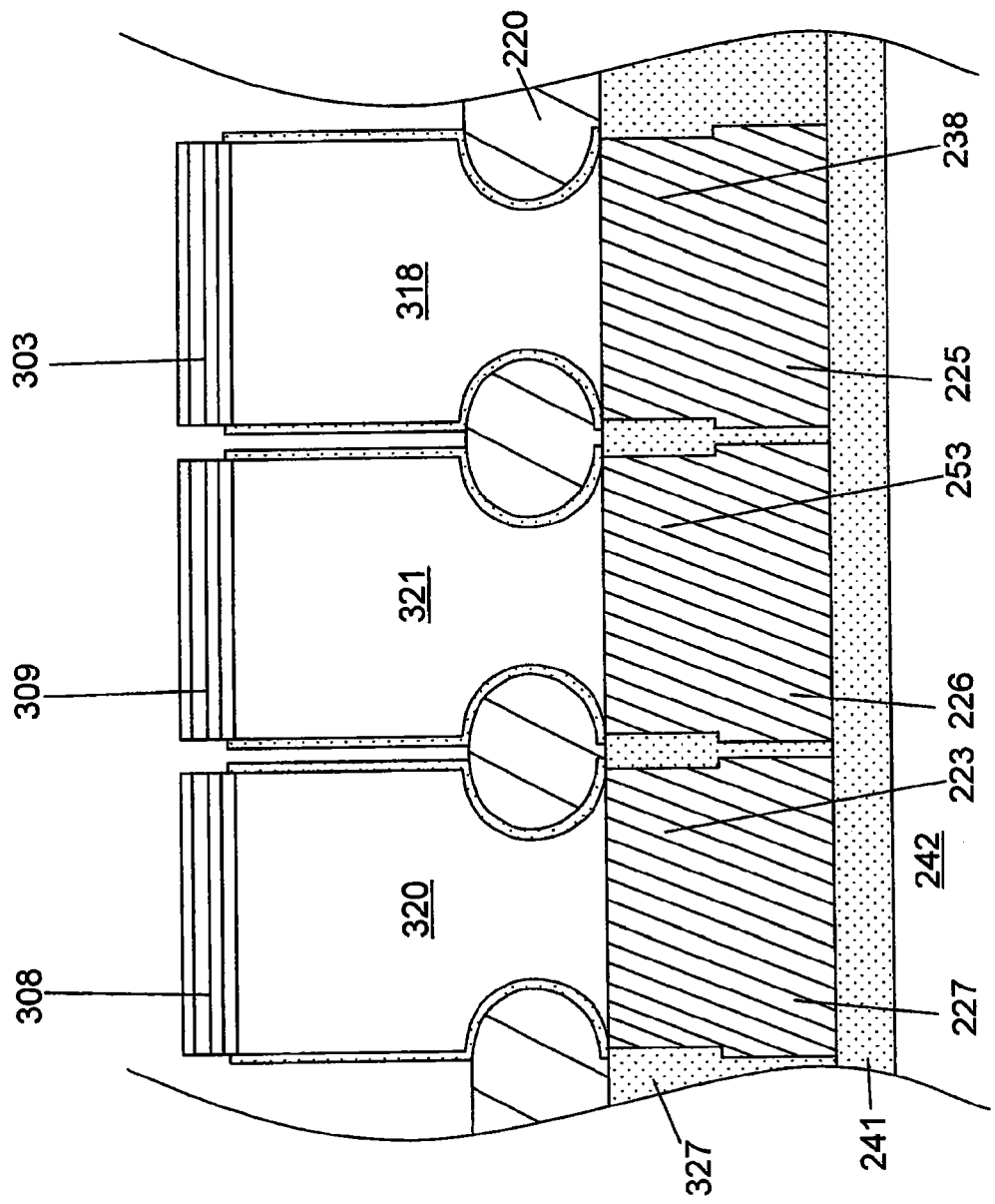
FIG. 25(b) is a sectional view ($Y_2$-$Y'_2$ section) showing the step in FIG. 25(a).

The polysilicon is etched to form a gate (219, 220, 221), and then the resist is removed (FIGS. 25(a) and 25(b)).

Figure 26A:
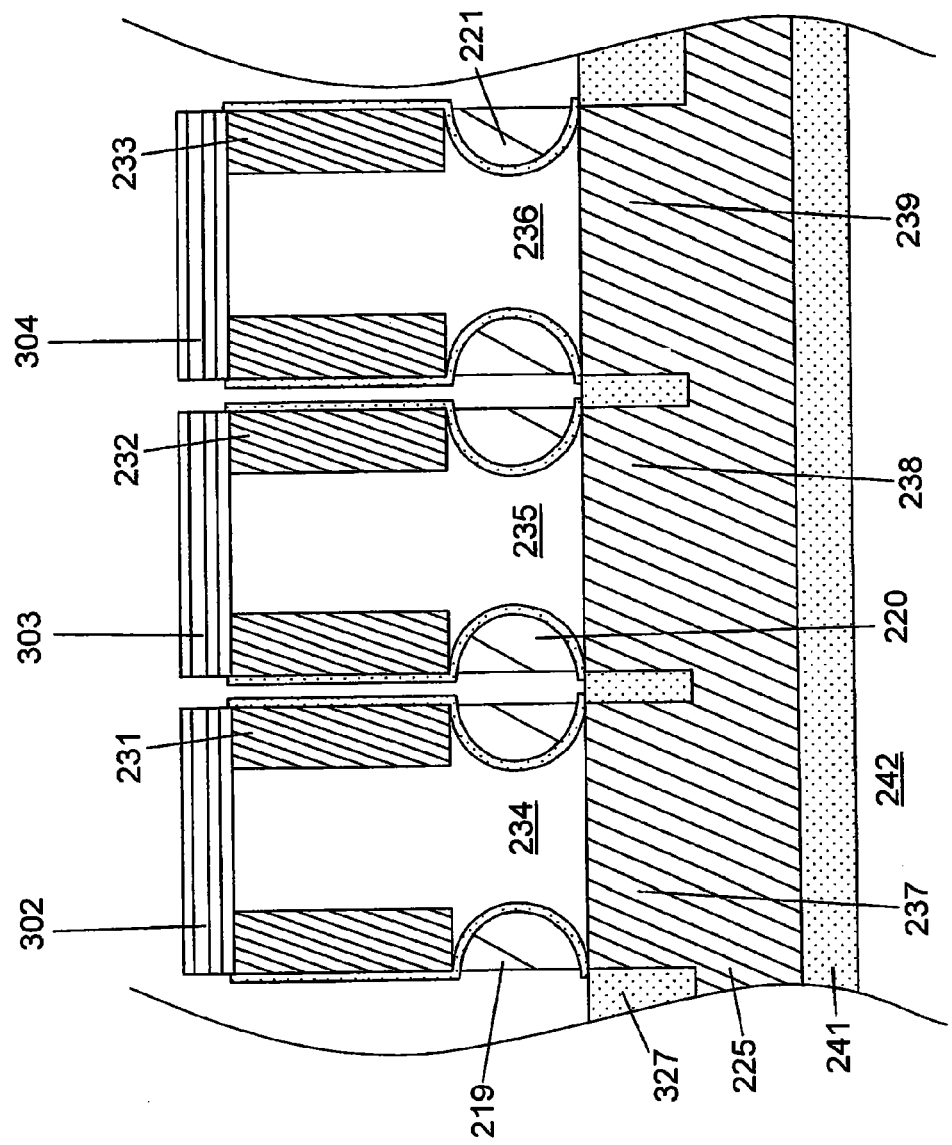
FIG. 26(a) is a sectional view ($X_2$-$X'_2$ section) showing a step in the example of the production method.
Figure 26B:
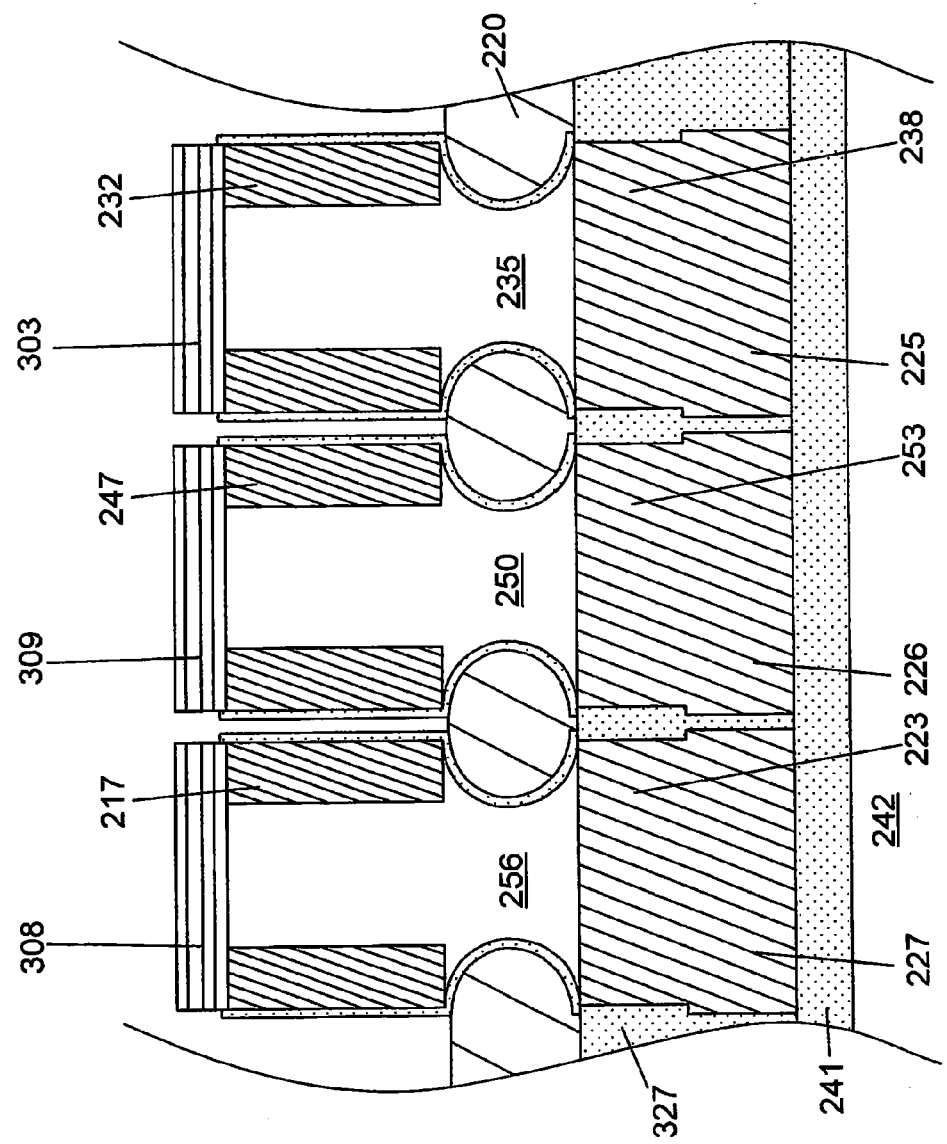
FIG. 26(b) is a sectional view ($Y_2$-$Y'_2$ section) showing the step in FIG. 26(a).
Figure 27A:
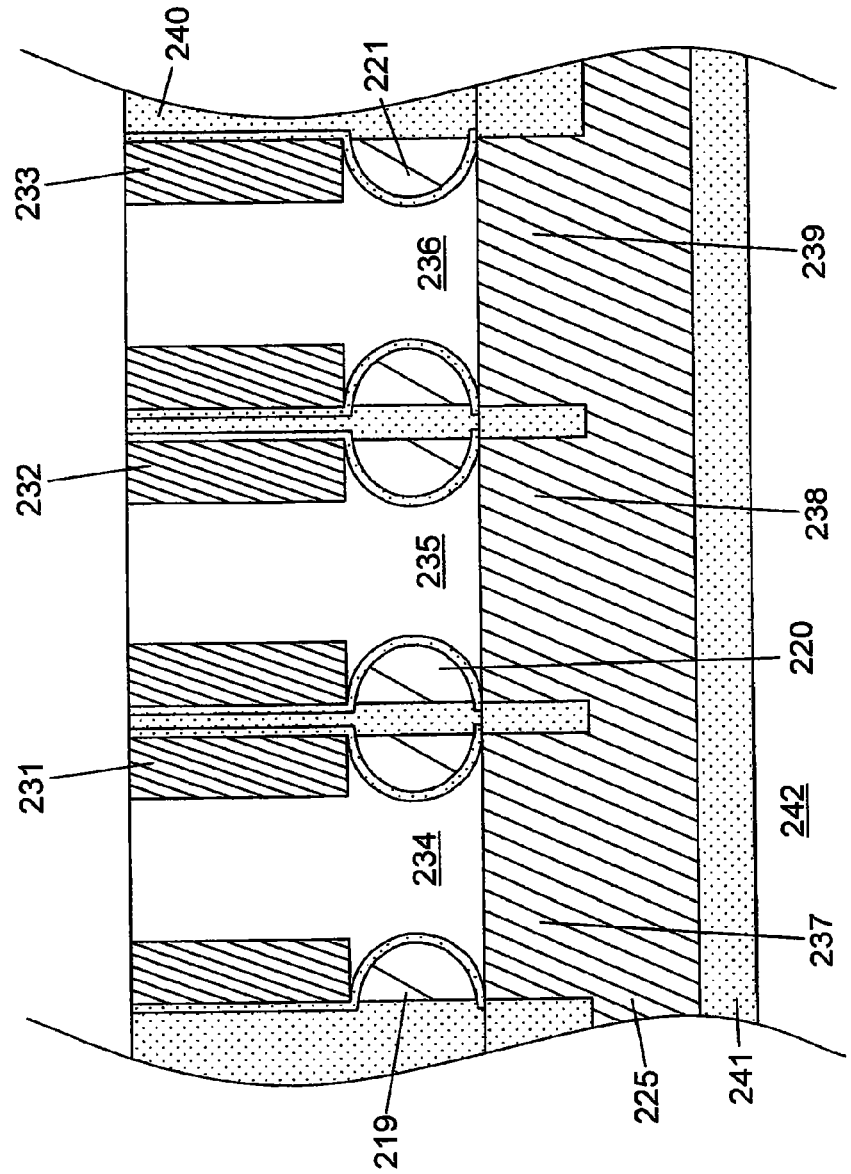
FIG. 27(a) is a sectional view ($X_2$-$X'_2$ section) showing a step in the example of the production method.
Figure 27B:
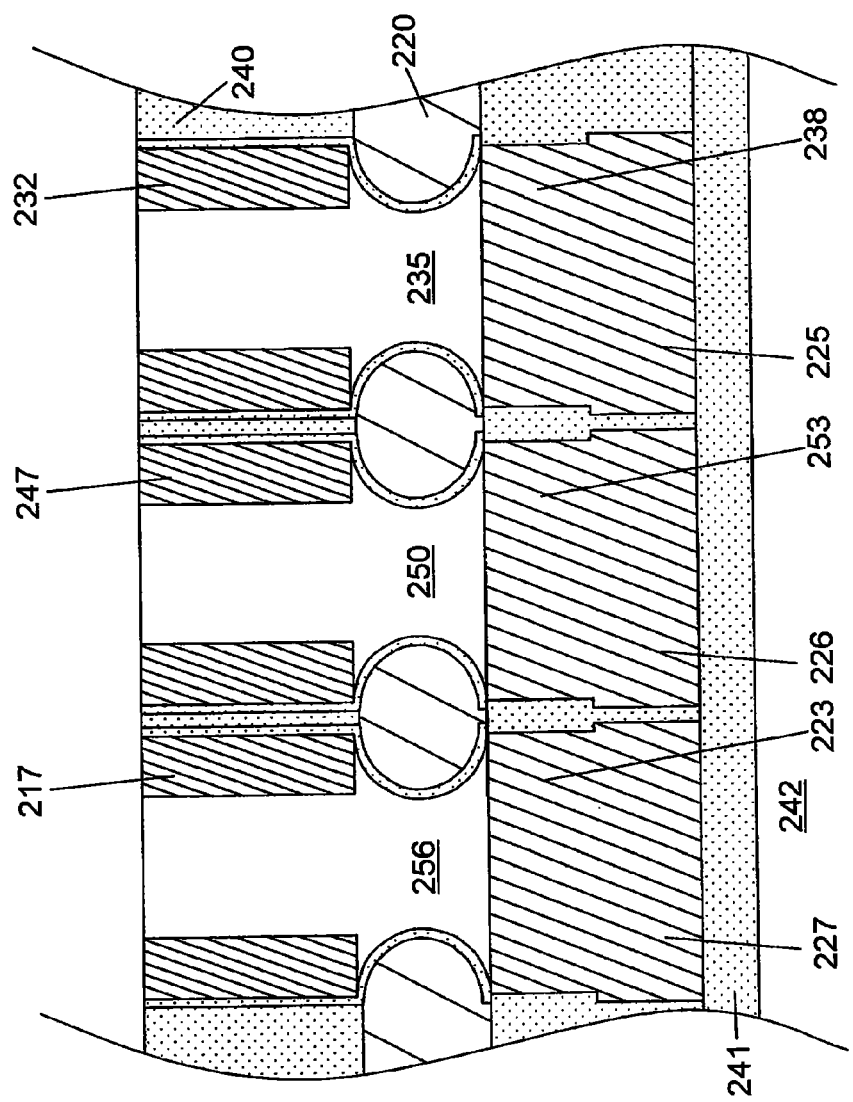
FIG. 27(b) is a sectional view ($Y_2$-$Y'_2$ section) showing the step in FIG. 27(a).
Figure 28A:
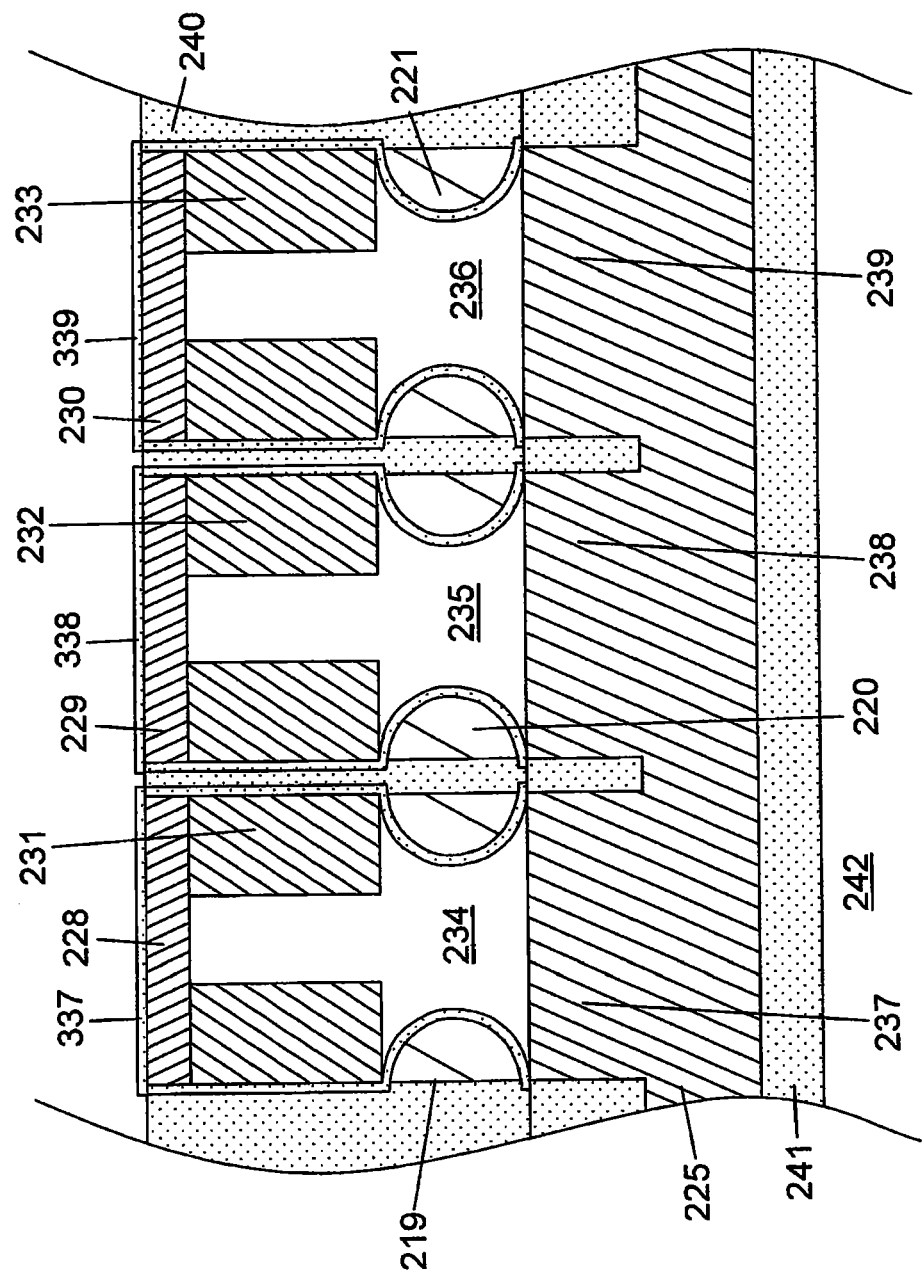
FIG. 28(a) is a sectional view ($X_2$-$X'_2$ section) showing a step in the example of the production method.
Figure 28B:
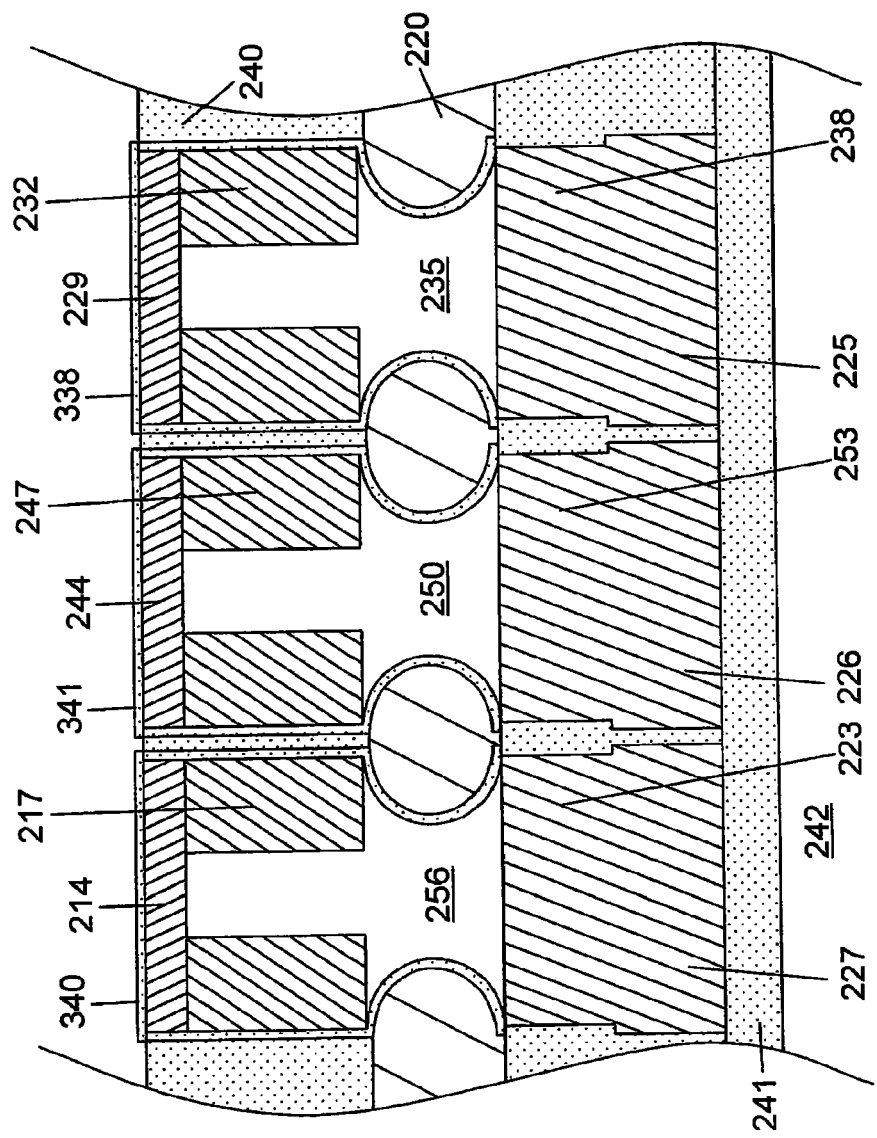
FIG. 28(b) is a sectional view ($Y_2$-$Y'_2$ section) showing the step in FIG. 28(a).

Phosphorus (P) is implanted to form a charge storage section (231, 232, 233, 217, 247) (FIGS. 26(a) and 26(b)).

An oxide film 240 is deposited and then subjected to flattening and etching-back. Then, the nitride film on the island-shaped semiconductor is removed (FIGS. 27(a) and 27(b)).

An oxide film (337, 338, 339, 340, 341) is formed. Subsequently, a p+-type diffusion layer (228, 229, 230, 214, 244) is formed through boron (B) implantation and annealing (FIGS. 28(a) and 28(b)).

Figure 29A:
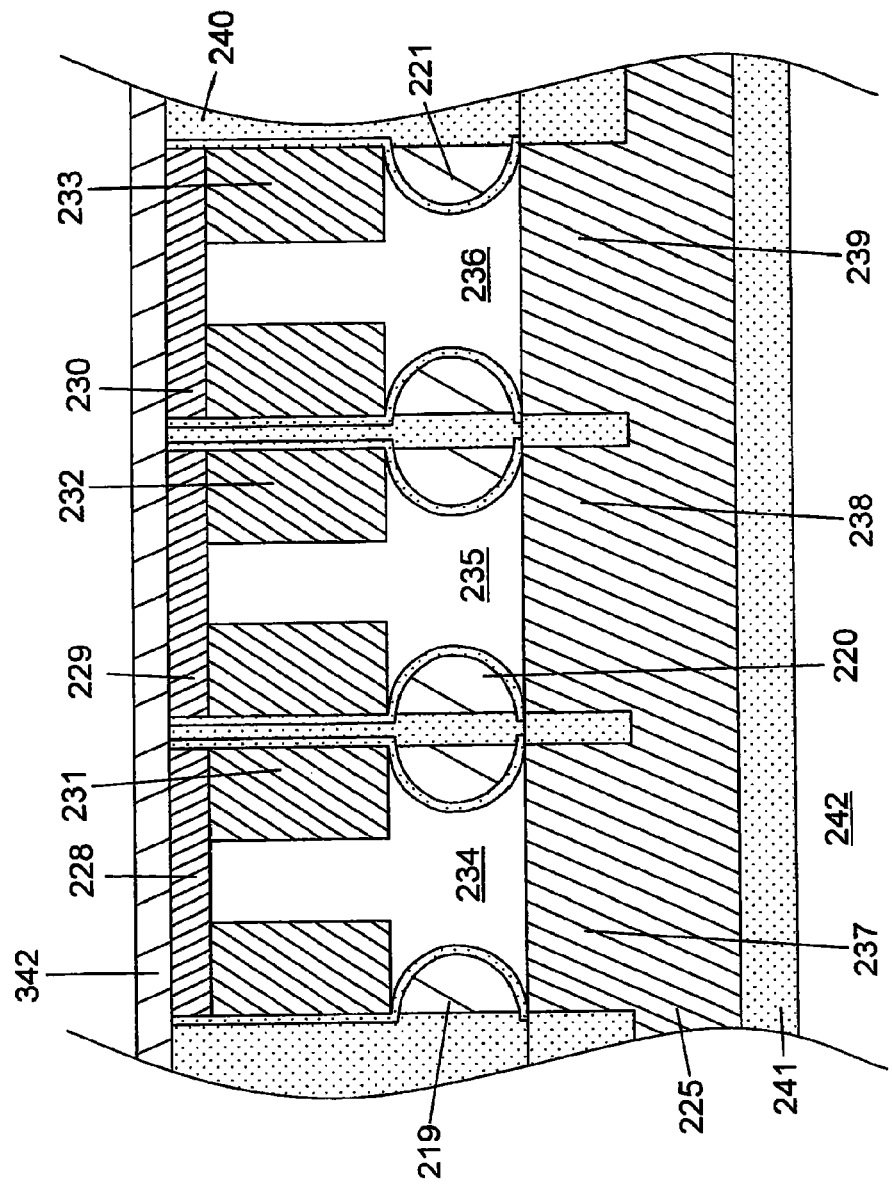
FIG. 29(a) is a sectional view ($X_2$-$X'_2$ section) showing a step in the example of the production method.
Figure 29B:
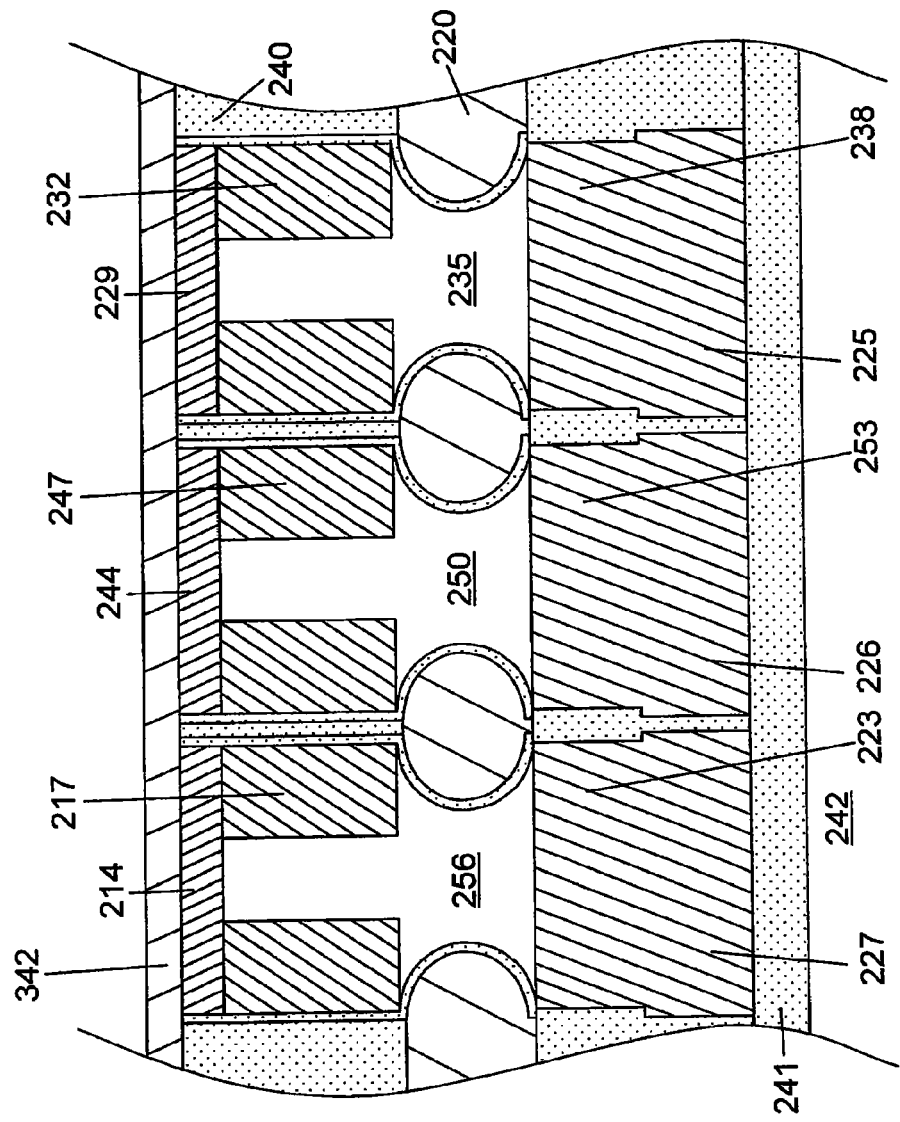
FIG. 29(b) is a sectional view ($Y_2$-$Y'_2$ section) showing the step in FIG. 29(a).
Figure 30A:
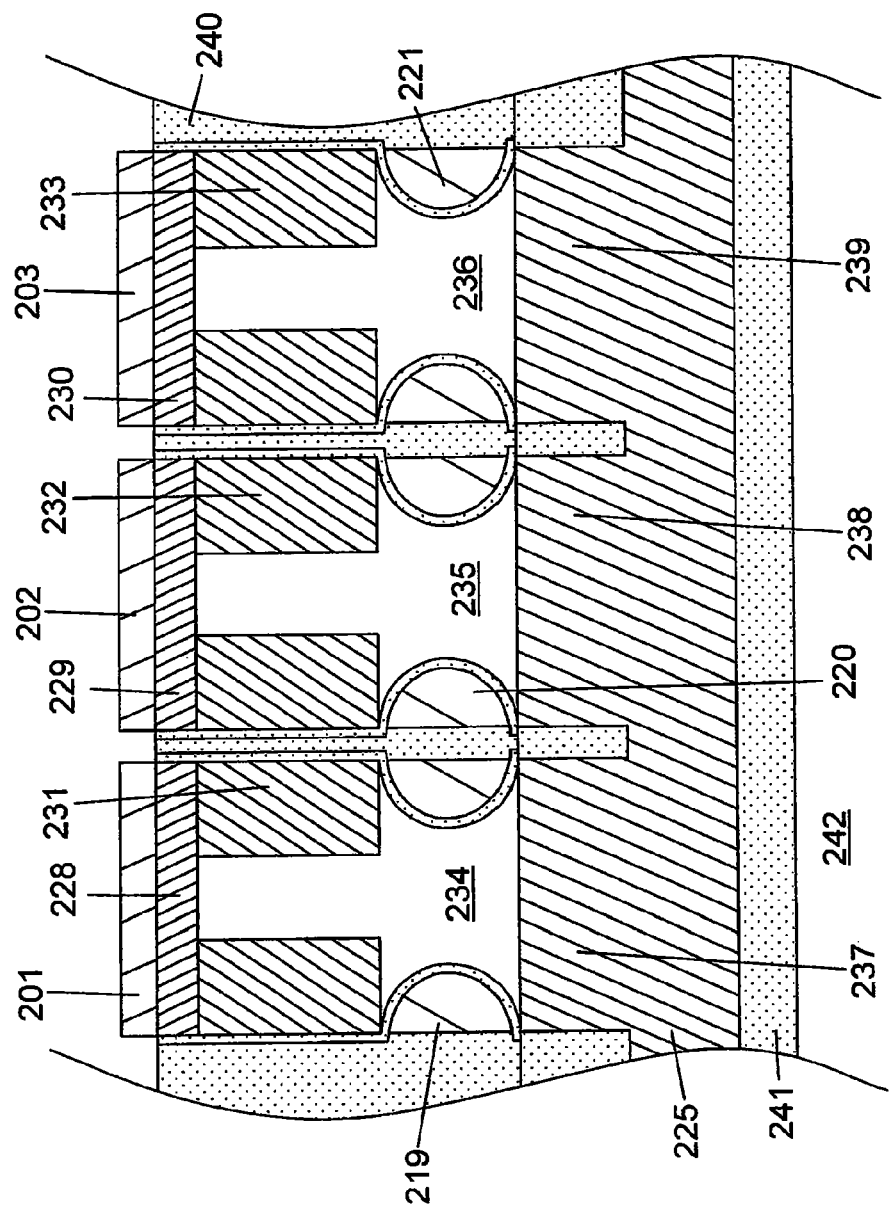
FIG. 30(a) is a sectional view ($X_2$-$X'_2$ section) showing a step in the example of the production method.
Figure 30B:
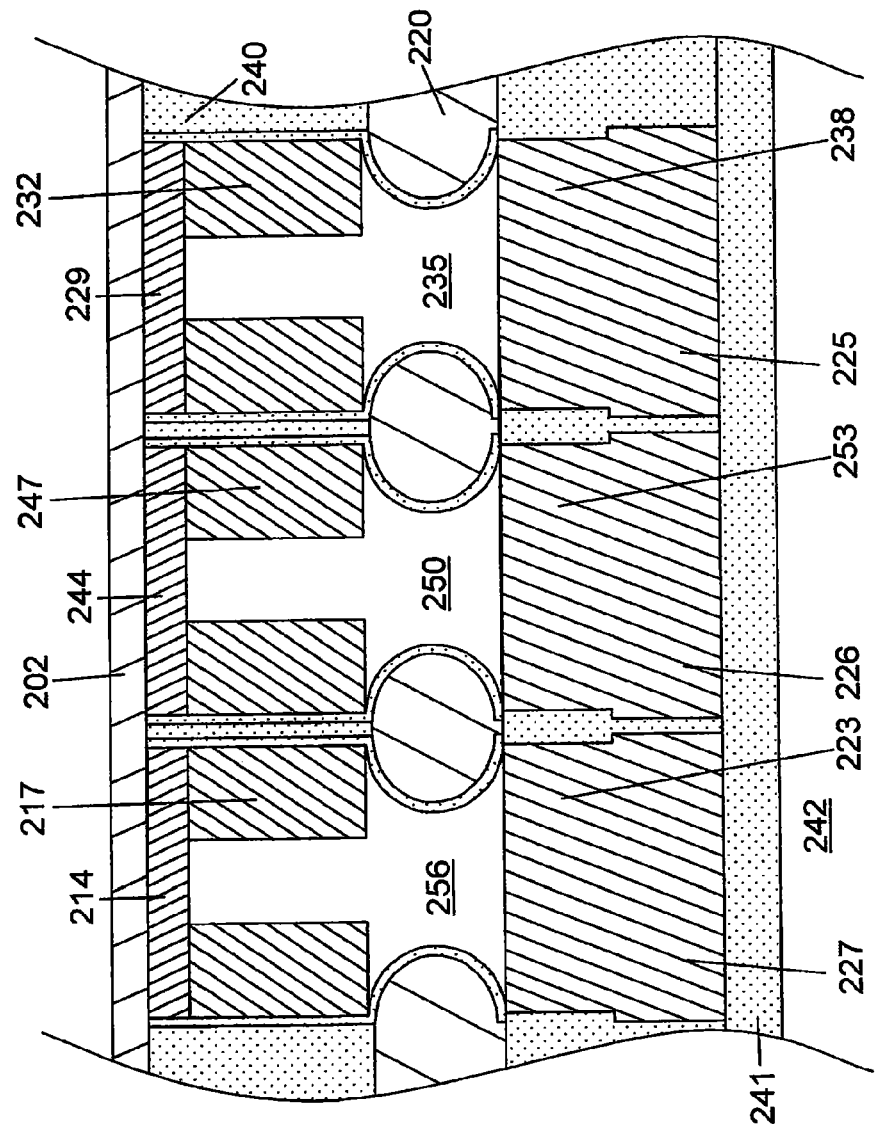
FIG. 30(b) is a sectional view ($Y_2$-$Y'_2$ section) showing the step in FIG. 30(a).

The oxide film is removed, and then a transparent conductive film 342 is deposited (FIGS. 29(a) and 29(b)).

A resist for a pixel selection line is formed, and then the transparent conductive film is etched to form a pixel selection line (201, 202, 203). Then, the resist is removed (FIGS. 30(a) and 30(b)).

Figure 31A:
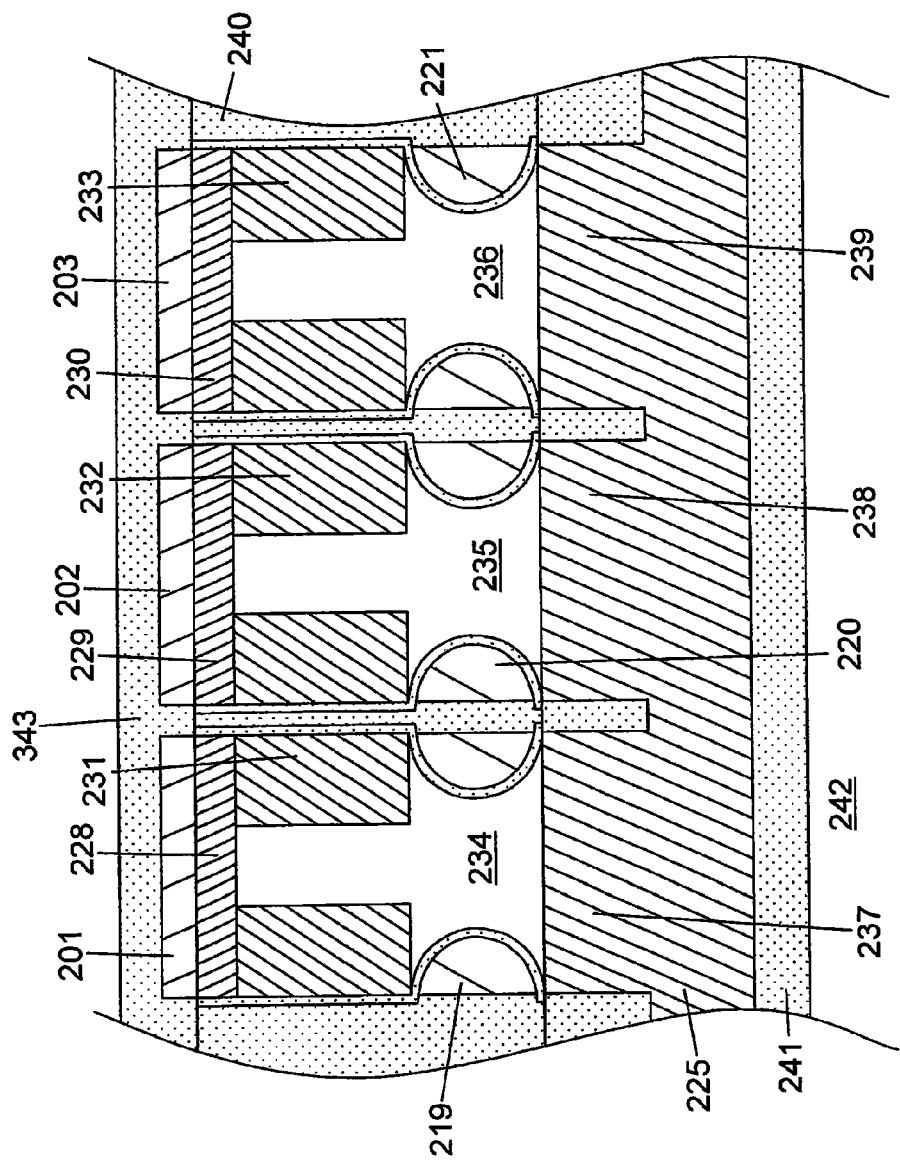
FIG. 31(a) is a sectional view ($X_2$-$X'_2$ section) showing a step in the example of the production method.
Figure 31B:
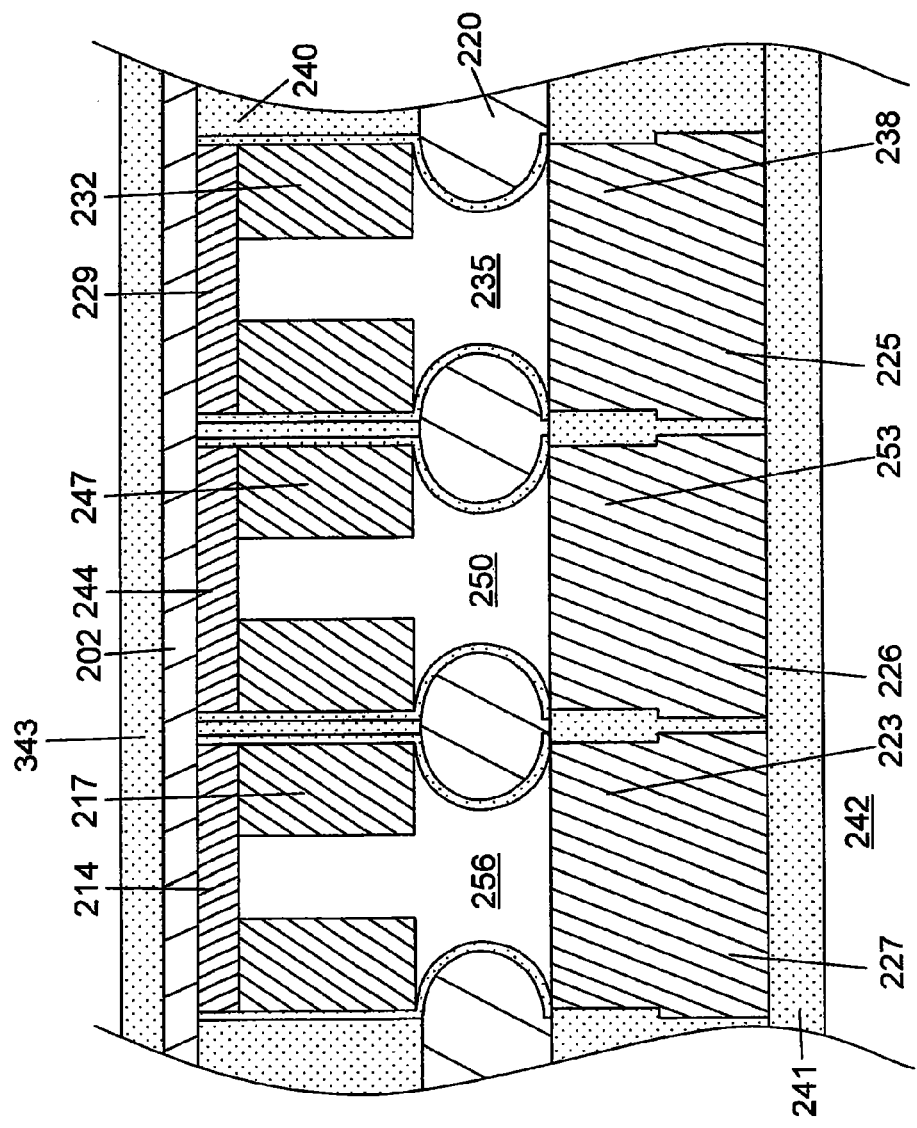
FIG. 31(b) is a sectional view ($Y_2$-$Y'_2$ section) showing the step in FIG. 31(a).

A surface protection film 343 is formed (FIGS. 31(a) and 31(b)).

In the first embodiment, a cross-sectional shape of the depression in the sidewall of the p-type impurity-doped region is a semicircular shape. Alternatively, the depression may be formed in any other suitable shape, such as a cross-sectionally rectangular shape as shown in FIG. 32.

Figure 32:
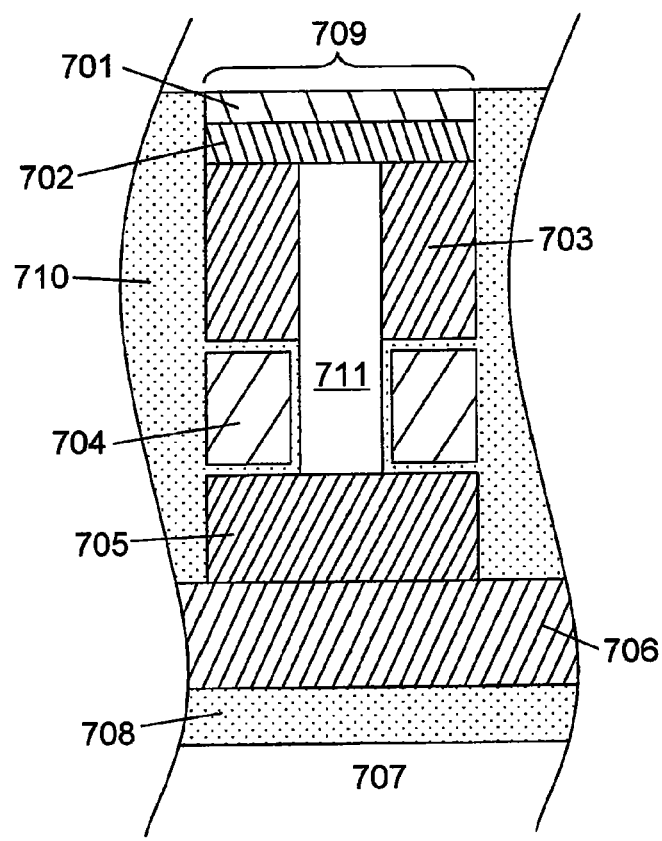
FIG. 32 is a sectional view showing one solid-state imaging device according to a second embodiment of the present invention.

FIG. 32 is a sectional view showing a solid-state imaging device according a second embodiment of the present invention.

As shown in FIG. 32, an oxide film 708 is formed on a silicon substrate 707. A signal line 706 is formed on the oxide film 708, and an island-shaped semiconductor is formed on the signal line 706. The island-shaped semiconductor comprises: an n+-type diffusion layer 705 formed as a bottom portion thereof and connected to the signal line; a p-type impurity-doped region 711 formed above and adjacent to the n+-type diffusion layer; a gate 704 connected to the p-type impurity-doped region through a dielectric film; a charge storage section 703 comprised of an n-type diffusion layer connected to the p-type impurity-doped region and adapted, in response to receiving light, to undergo a change in amount of electric charges therein; and a p+-type diffusion layer 702 formed above and adjacent to the p-type impurity-doped region and the n-type diffusion layer. Further, a pixel selection line 701 comprised of a transparent conductive film is formed to be connected to a top of the p+-type diffusion layer which is a top portion of the island-shaped semiconductor. The gate is formed in such a manner that a part thereof is disposed inside a depression which is formed in a sidewall of the p-type impurity-doped region to have a square or rectangular shape in cross-section.

A combination of the p+-type diffusion layer 702 and the n-type diffusion layer 703 functions as a photoelectric-conversion photodiode 709. An oxide film 710 is formed as an interlayer dielectric film.

Figure 33:
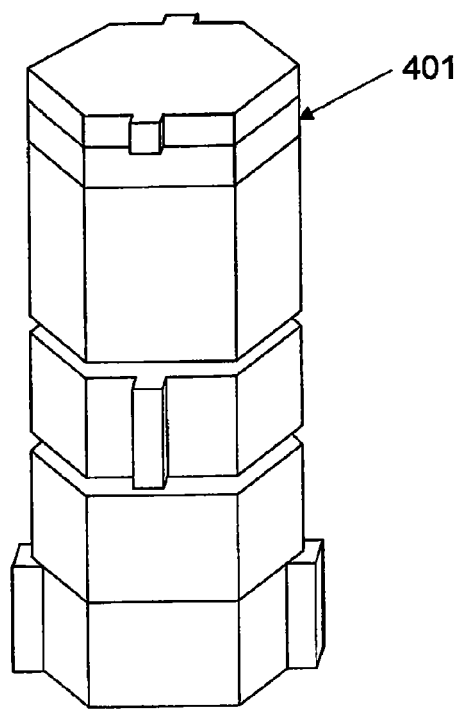
FIG. 33 is a bird's-eye view showing the solid-state imaging device according to the second embodiment.

Each of the first and second embodiments shows a solid-state imaging device comprising an island-shaped semiconductor having a square or rectangular pillar shape. Alternatively, the solid-state imaging device may comprise an island-shaped semiconductor having a hexagonal pillar shape, as shown in FIG. 33.

The first embodiment shows a solid-state imaging device array in which a plurality of solid-state imaging devices each comprising an island-shaped semiconductor having a square or rectangular pillar shape are arranged in an n-row by m-column array (wherein each of n and m is an integer of 1 or more.) with respect to a substrate.

Figure 34:
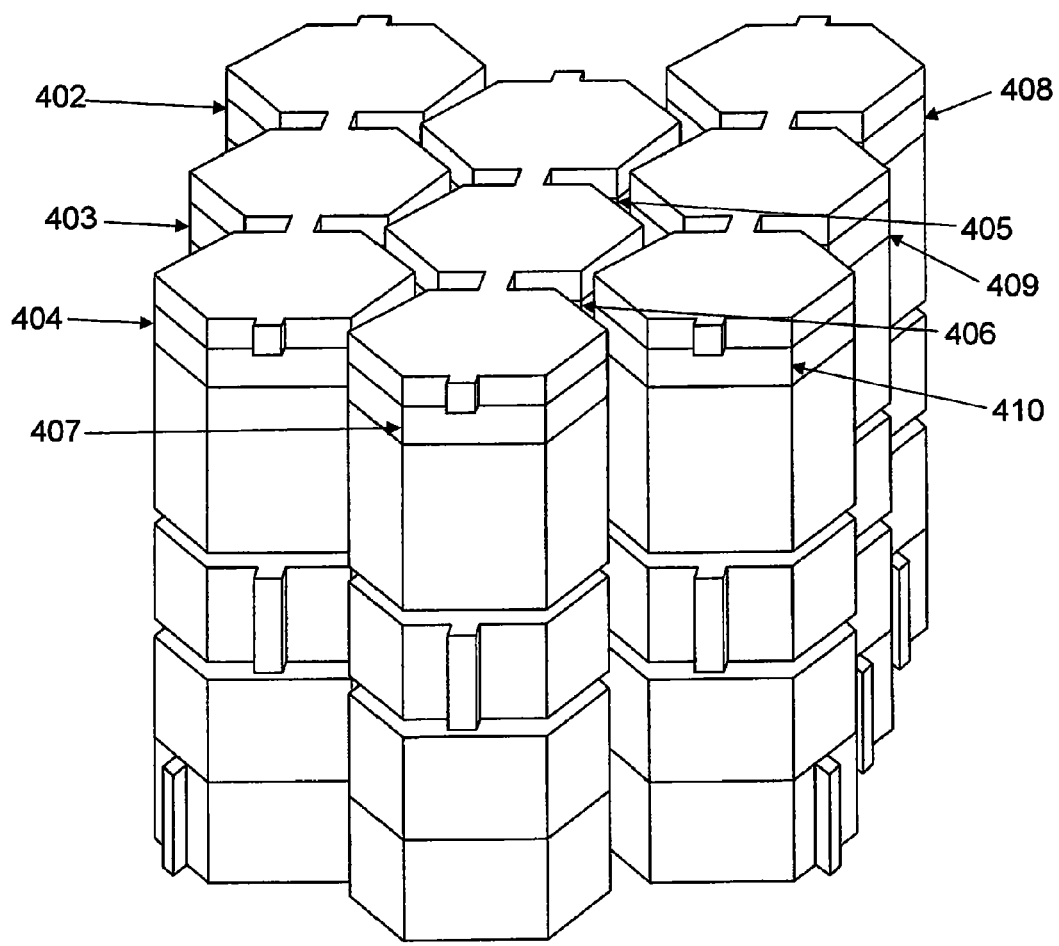
FIG. 34 is a bird's-eye view showing a solid-state imaging device array in which a plurality of the solid-state imaging devices according to the second embodiment are arranged in a matrix array.

For example, as shown in FIG. 34, the 1st solid-state imaging device column consisting of three solid-state imaging devices 402, 403, 404 each comprising an island-shaped semiconductor having a hexagonal pillar shape, the 2nd solid-state imaging device column consisting of three solid-state imaging devices 405, 406, 407 each comprising an island-shaped semiconductor having a hexagonal pillar shape, and the 3rd solid-state imaging device column consisting of three solid-state imaging devices 408, 409, 410 each comprising an island-shaped semiconductor having a hexagonal pillar shape, are arranged in an interval (horizontal pixel pitch) derived by multiplying a vertical pixel pitch by $\sqrt{3}/2$. In other words, the solid-state imaging device array may be arranged in a honeycomb pattern.

Figure 35:
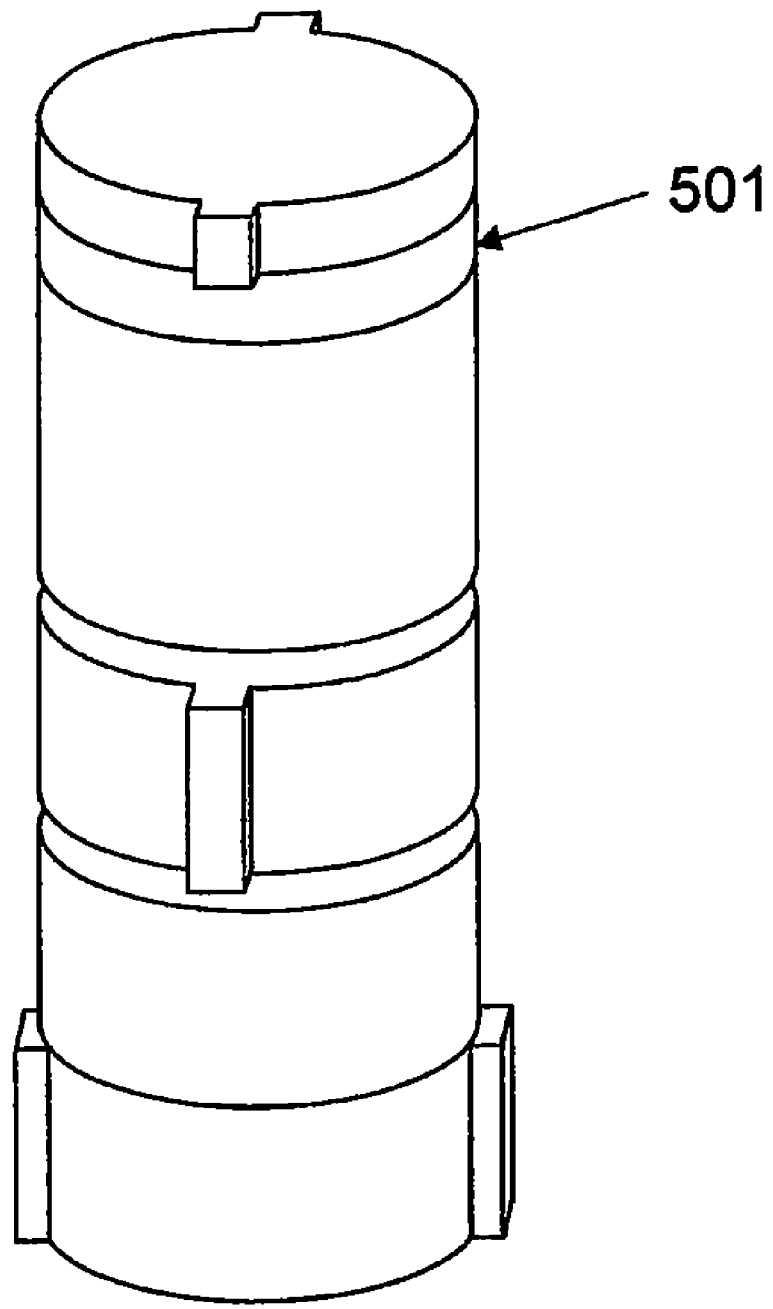
FIG. 35 is a bird's-eye view showing one solid-state imaging device according to a third second embodiment of the present invention.

Further, each of the first and second embodiments shows a solid-state imaging device comprising an island-shaped semiconductor having a square or rectangular pillar shape. Alternatively, the solid-state imaging device may comprise an island-shaped semiconductor 501 having a circular pillar shape, as shown in FIG. 35.

As described above, the present invention provides a solid-state imaging device which comprises: a signal line formed on a substrate; an island-shaped semiconductor arranged on the signal line; and a pixel selection line connected to a top of the island-shaped semiconductor, wherein the island-shaped semiconductor includes: a first semiconductor layer formed as a bottom portion of the island-shaped semiconductor and connected to the signal line; a second semiconductor layer formed above and adjacent to the first semiconductor layer; a gate connected to the second semiconductor layer through a dielectric film; a charge storage section comprised of a third semiconductor layer connected to the second semiconductor layer and adapted, in response to receiving light, to undergo a change in amount of electric charges therein; and a fourth semiconductor layer formed above and adjacent to the second and third semiconductor layers, and wherein the pixel selection line is comprised of a transparent conductive film, and a part of the gate is disposed inside a depression formed in a sidewall of the second semiconductor layer.

In the above solid-state imaging device, a combination of the third and fourth semiconductor layers, a combination of the second, third and fourth semiconductor layers, a combination of the first, second and third semiconductor layers, and a combination of the second and first semiconductor layers, function, respectively, as the photoelectric-conversion photodiode, the amplification transistor, the reset transistor, and the diode in the aforementioned unit pixel. A metal for use in a conventional semiconductor production process, such as aluminum or copper, reflects light. Thus, it is necessary to connect a line made of such a metal to a sidewall of the fourth semiconductor layer. In the present invention, a transparent conductive film, such as indium tin oxide (ITO), zinc oxide (ZnO) or tin oxide (SnO2), is used as the pixel selection line to allow the pixel selection line to be connected to a top of the fourth semiconductor layer. Thus, the use of the transparent conductive film makes it possible to provide an image sensor having a sufficiently-large ratio of a surface area of a light-receiving section to an overall surface area of one pixel.

Further, if a gate is connected to a sidewall of the second conductive layer through the dielectric layer, a surface area of one pixel is a sum of an area of the photodiode, an area of the gate, and an area of a region between the devices. In the present invention, a part of the gate is disposed inside a depression formed in a sidewall of the second semiconductor layer, so that a surface area of one pixel can be reduced substantially to a sum of an area of the photodiode and an area of a region between the devices. This makes it possible to provide an image sensor having a sufficiently-large ratio of a surface area of a light-receiving section to an overall surface area of one pixel.

Figure 36:
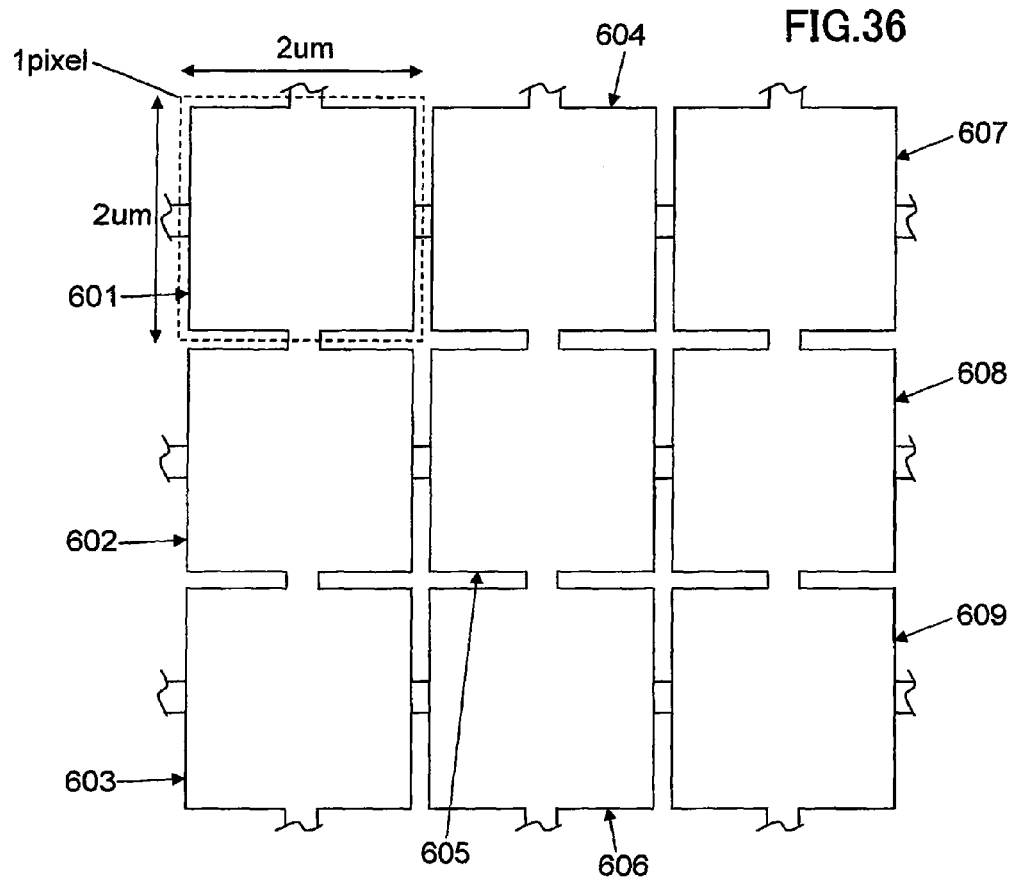
FIG. 36 is a top plan view showing a solid-state imaging apparatus in which a plurality of image sensors each comprising an island-shaped semiconductor having a square pillar shape according to the present invention are arranged in a matrix array.
Figure 37:
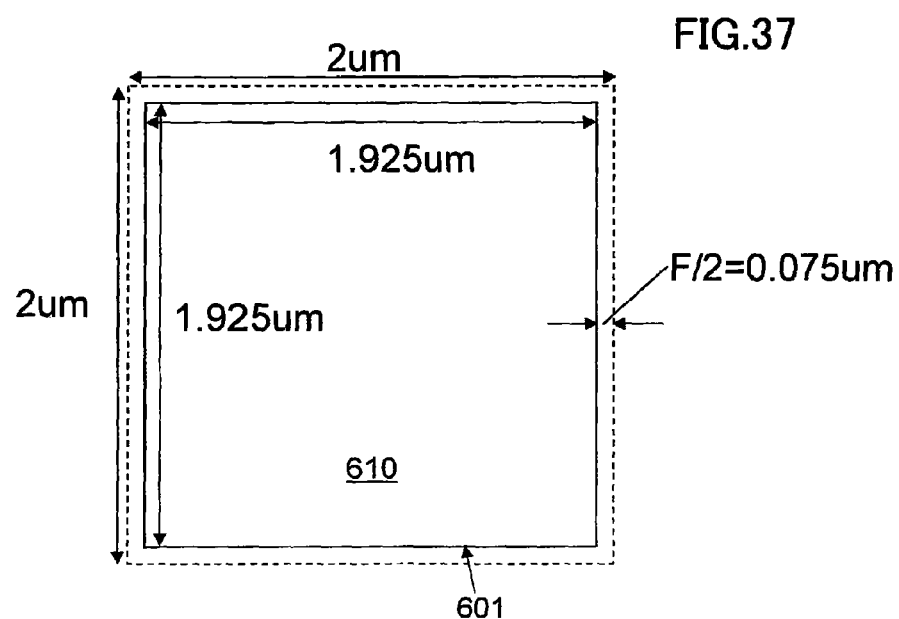
FIG. 37 is an enlarged top plan view showing one pixel of the solid-state imaging apparatus.

In a conventional CMOS image sensor, a ratio of a surface area of a light-receiving section (photodiode) to an overall surface area of one pixel is 30%. In an apparatus where a plurality of image sensors according to the present invention are arranged in a matrix array, a ratio of a surface area of a light-receiving section (photodiode) to an overall surface area of one pixel can be estimated as follows. FIG. 36 is a top plan view showing a solid-state imaging apparatus in which nine image sensors 601, 602, 603, 604, 605, 606, 607, 608, 609 each comprising the island-shaped semiconductor having a square pillar shape according to the present invention are arranged in a matrix array. FIG. 37 is an enlarged top plan view showing a light-receiving section 610 in one pixel of the solid-state imaging apparatus. In FIG. 37, F indicates a wiring rule. A 0.15 wiring-rule process is used on an assumption that a surface area per pixel is 2 μm×2 μm. In this case, a surface area of the light-receiving section (photodiode) is 1.925 μm×1.925 μm. Thus, in the apparatus where the image sensors comprising the island-shaped semiconductor having a square pillar shape are arranged in a matrix array, a ratio of a surface area of a light-receiving section (photodiode) to an overall surface area of one pixel is 92.6%. This means that a surface area of a unit pixel of an image sensor is largely occupied by a surface area of the photodiode, and it is possible to provide an image sensor having a sufficiently-large ratio of a surface area of a light-receiving section to an overall surface area of one pixel.

What is claimed is:

1. A solid-state imaging device comprising: a signal line formed on a substrate; an island-shaped semiconductor arranged on the signal line; and a pixel selection line connected to a top of the island-shaped semiconductor, wherein the island-shaped semiconductor includes:
    a first semiconductor layer formed as a bottom portion of the island-shaped semiconductor and connected to the signal line;
    a second semiconductor layer formed above and adjacent to the first semiconductor layer;
    a gate connected to the second semiconductor layer through a dielectric film;
    a charge storage section comprised of a third semiconductor layer connected to the second semiconductor layer and adapted, in response to receiving light, to undergo a change in amount of electric charges therein; and a fourth semiconductor layer formed above and adjacent to the second and third semiconductor layers, and wherein:

the pixel selection line is comprised of a transparent conductive film; and a part of the gate is disposed inside a depression formed in a sidewall of the second semiconductor layer.

2. The solid-state imaging device as defined in claim 1, wherein:

the signal line is an n+-type diffusion layer;

the first semiconductor layer is an n+-type diffusion layer;

the second semiconductor layer is a p-type impurity-doped region;

the third semiconductor layer is an n-type diffusion layer; and the fourth semiconductor layer is a p+-type diffusion layer.

3. The solid-state imaging device as defined in claim 2, wherein:

a combination of the p+-type diffusion layer and the n-type diffusion layer functions as a photoelectric-conversion photodiode;

a combination of the p+-type diffusion layer, the n-type diffusion layer and the p-type impurity-doped region functions as an amplification transistor;

a combination of the n+-type diffusion layer serving as the first semiconductor layer, the p-type impurity-doped region, the n-type diffusion layer and the gate functions as a reset transistor; and a combination of the p-type impurity-doped region and the n+-type diffusion layer serving as the first semiconductor layer functions as a diode.

4. The solid-state imaging device as defined in claim 1, wherein the island-shaped semiconductor has a square or rectangular pillar shape.

5. The solid-state imaging device as defined in claim 1, wherein the island-shaped semiconductor has a hexagonal pillar shape.

6. The solid-state imaging device as defined in claim 1, wherein the island-shaped semiconductor has a circular pillar shape.

7. A solid-state imaging apparatus comprising a plurality of the solid-state imaging devices as defined in claim 1, wherein the solid-state imaging devices are arranged in an n-row by m-column array (wherein each of n and m is an integer of 1 or more) with respect to the substrate.

8. A solid-state imaging apparatus comprising a plurality of the solid-state imaging devices as defined in claim 4, wherein the solid-state imaging devices are arranged in an n-row by m-column array (wherein each of n and m is an integer of 1 or more) with respect to the substrate.

9. A solid-state imaging apparatus comprising a plurality of the solid-state imaging devices as defined in claim 6, wherein the solid-state imaging devices are arranged in an n-row by m-column array (wherein each of n and m is an integer of 1 or more) with respect to the substrate.

10. A solid-state imaging apparatus comprising a plurality of the solid-state imaging devices as defined in claim 1, wherein the solid-state imaging devices are arranged on the substrate in a honeycomb pattern.

11. A solid-state imaging apparatus comprising a plurality of the solid-state imaging devices as defined in claim 5, wherein the solid-state imaging devices are arranged on the substrate in a honeycomb pattern.

12. A solid-state imaging apparatus comprising a plurality of the solid-state imaging devices as defined in claim 6, wherein the solid-state imaging devices are arranged on the substrate in a honeycomb pattern.

13. A method of producing the solid-state imaging device as defined in claim 1, comprising the steps of:

forming an oxide film on a silicon substrate;

forming a p-type silicon on the oxide film;

forming an oxide film-based mask and a nitride film-based mask by depositing a nitride film on the p-type silicon, depositing an oxide film on the nitride film, forming a resist for a silicon pillar, etching the oxide film and the nitride film, and removing the resist;

forming the depression in the sidewall of the p-type impurity-doped region by etching the p-type silicon to form a silicon pillar, depositing a nitride film, etching the nitride film in such a manner that a sidewall-shaped nitride film is left on a sidewall of the silicon pillar, and isotropically etching the p-type silicon;

forming the island-shaped semiconductor having the depression in the sidewall of the p-type impurity-doped region by etching the p-type silicon;

forming the n+-type diffusion layer of the island-shaped semiconductor, and the signal line, by forming an oxide film to prevent ion channeling during ion implantation, forming a continuous n+-type diffusion layer through phosphorus implantation and annealing, forming a resist for the signal line, and etching the oxide film and the silicon;

after removing the resist, the sidewall-shaped nitride film and the oxide film, forming the gate by depositing an oxide film, subjecting the oxide film to flattening and etching-back, forming a gate dielectric film, depositing polysilicon, subjecting the polysilicon to flattening and etching-back, forming a resist for the gate, and etching the polysilicon;

after removing the resist, forming the charge storage section through phosphorus implantation;

forming the p+-type diffusion layer by depositing an oxide film, subjecting the oxide film to flattening and etching-back, removing the nitride film-based mask, forming an oxide film, and performing boron implantation and annealing;

after removing the oxide film, forming the pixel selection line by depositing a transparent conductive film, forming a resist for the pixel selection line, etching the transparent conductive film, and removing the resist; and forming a surface protection film.

* * * * *